United States Patent
Narabu

(10) Patent No.: US 10,911,738 B2
(45) Date of Patent: Feb. 2, 2021

(54) COMPOUND-EYE IMAGING DEVICE

(71) Applicant: SONY CORPORATION, Tokyo (JP)

(72) Inventor: Tadakuni Narabu, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/324,352

(22) PCT Filed: May 8, 2015

(86) PCT No.: PCT/JP2015/063310
§ 371 (c)(1),
(2) Date: Jan. 6, 2017

(87) PCT Pub. No.: WO2016/009707
PCT Pub. Date: Jan. 21, 2016

(65) Prior Publication Data
US 2017/0214863 A1    Jul. 27, 2017

(30) Foreign Application Priority Data

Jul. 16, 2014 (JP) ................................ 2014-145570
Sep. 18, 2014 (JP) ................................ 2014-189701

(51) Int. Cl.
*H04N 13/232* (2018.01)
*G03B 15/00* (2021.01)
(Continued)

(52) U.S. Cl.
CPC ......... *H04N 13/232* (2018.05); *G02B 3/0056* (2013.01); *G03B 15/00* (2013.01);
(Continued)

(58) Field of Classification Search
None
See application file for complete search history.

(56) References Cited

U.S. PATENT DOCUMENTS 7,502,058 B2 * 3/2009 Hiatt ................. H01L 27/14621
348/272
7,999,873 B2 * 8/2011 Oyama ................... H04N 9/045
348/340

(Continued)

FOREIGN PATENT DOCUMENTS

EP        2160017         3/2010
JP        2000-278605 A   10/2000
(Continued)

OTHER PUBLICATIONS

International Search Report prepared by the Japan Patent Office dated Jul. 2, 2015, for International Application No. PCT/JP2015/063310.

(Continued)

*Primary Examiner* — Twyler L Haskins
*Assistant Examiner* — Wesley J Chiu
(74) *Attorney, Agent, or Firm* — Sheridan Ross P.C.

(57) ABSTRACT

A compound-eye imaging device is a compound-eye imaging device having a plurality of facet optical systems, an imaging element, and a signal processing unit. The plurality of facet optical systems of the compound-eye imaging device are disposed to face a subject in a two dimensional shape. Also, the imaging element of the compound-eye imaging device includes, in units of facets, a plurality of pixels which receive light concentrated by facet optical systems and generate image signals. Also, the signal processing unit of the compound-eye imaging device generates an image corresponding to the subject based on image signals generated by the imaging element of the compound-eye imaging device.

18 Claims, 76 Drawing Sheets

(51) Int. Cl.
*H01L 27/146* (2006.01)
*H04N 5/225* (2006.01)
*H04N 5/369* (2011.01)
*H04N 5/3745* (2011.01)
*H04N 5/341* (2011.01)
*H04N 9/04* (2006.01)
*G02B 3/00* (2006.01)
*H04N 5/232* (2006.01)
*H04N 9/64* (2006.01)
*H04N 5/262* (2006.01)
*H04N 5/265* (2006.01)
*H04N 5/374* (2011.01)
*H04N 5/378* (2011.01)

(52) U.S. Cl.
CPC ...... *H01L 27/1464* (2013.01); *H01L 27/1469* (2013.01); *H01L 27/14605* (2013.01); *H01L 27/14621* (2013.01); *H01L 27/14623* (2013.01); *H01L 27/14627* (2013.01); *H01L 27/14629* (2013.01); *H01L 27/14634* (2013.01); *H01L 27/14645* (2013.01); *H01L 27/14685* (2013.01); *H04N 5/2254* (2013.01); *H04N 5/23212* (2013.01); *H04N 5/3415* (2013.01); *H04N 5/3696* (2013.01); *H04N 5/37457* (2013.01); *H04N 9/045* (2013.01); *H04N 9/04517* (2018.08); *H04N 9/04557* (2018.08); *H04N 9/04561* (2018.08); *H04N 9/646* (2013.01); *H01L 27/14625* (2013.01); *H04N 5/23241* (2013.01); *H04N 5/265* (2013.01); *H04N 5/2625* (2013.01); *H04N 5/374* (2013.01); *H04N 5/378* (2013.01); *H04N 2209/047* (2013.01)

(56) References Cited

U.S. PATENT DOCUMENTS

| | | | |
|---|---|---|---|
| 2002/0089596 A1* | 7/2002 | Suda | H04N 9/045 348/302 |
| 2002/0122124 A1* | 9/2002 | Suda | H01L 27/14627 348/263 |
| 2003/0071905 A1* | 4/2003 | Yamasaki | H04N 5/3415 348/239 |
| 2003/0234907 A1* | 12/2003 | Kawai | H04N 5/3415 351/206 |
| 2005/0133879 A1* | 6/2005 | Yamaguti | H01L 27/14621 257/435 |
| 2005/0134699 A1* | 6/2005 | Nagashima | H04N 5/23287 348/218.1 |
| 2006/0054782 A1* | 3/2006 | Olsen | G02B 3/0062 250/208.1 |
| 2006/0278869 A1* | 12/2006 | Hioki | H01L 27/14647 257/40 |
| 2007/0002159 A1* | 1/2007 | Olsen | G02B 7/04 348/335 |
| 2007/0257184 A1* | 11/2007 | Olsen | H04N 5/3415 250/208.1 |
| 2009/0127430 A1* | 5/2009 | Hirasawa | G03B 15/00 250/201.8 |
| 2009/0160997 A1* | 6/2009 | Oyama | H04N 5/2254 348/340 |
| 2010/0103259 A1* | 4/2010 | Tanida | G01B 11/026 348/139 |
| 2010/0128155 A1* | 5/2010 | Ahn | G01J 3/0259 348/308 |
| 2010/0194901 A1* | 8/2010 | van Hoorebeke | G02B 3/0068 348/218.1 |
| 2011/0122308 A1* | 5/2011 | Duparre | H01L 27/14621 348/340 |
| 2011/0228142 A1* | 9/2011 | Brueckner | G02B 27/0025 348/241 |
| 2011/0279721 A1* | 11/2011 | McMahon | H04N 5/345 348/302 |
| 2012/0081583 A1* | 4/2012 | Kikuchi | H04N 9/045 348/242 |
| 2012/0189293 A1* | 7/2012 | Cao | G03B 9/02 396/333 |
| 2012/0274811 A1* | 11/2012 | Bakin | H01L 27/14621 348/239 |
| 2013/0321675 A1* | 12/2013 | Cote | H04N 9/64 348/242 |
| 2013/0335621 A1* | 12/2013 | Attar | H04N 5/232 348/360 |
| 2014/0002688 A1* | 1/2014 | Inoue | H04N 5/23296 348/222.1 |
| 2016/0241751 A1* | 8/2016 | Park | G02B 3/0031 |

FOREIGN PATENT DOCUMENTS

| | | |
|---|---|---|
| JP | 2000278605 A * | 10/2000 |
| JP | 2001-061109 | 3/2001 |
| JP | 2001-523929 A | 11/2001 |
| JP | 2003-283907 A | 10/2003 |
| JP | 2007-74079 A | 3/2007 |
| JP | 2007-129751 A | 5/2007 |
| JP | 2008-17116 A | 1/2008 |
| JP | 2009-162847 A | 7/2009 |
| JP | 2010-8873 A | 1/2010 |
| JP | 2012-18993 A | 1/2012 |
| JP | 2013-62587 A | 4/2013 |
| JP | 2013-157780 A | 8/2013 |
| JP | 2014-41202 A | 3/2014 |
| JP | 2014-99896 A | 5/2014 |
| WO | WO 2013/042281 A1 | 3/2013 |
| WO | WO 2014/024745 | 2/2014 |

OTHER PUBLICATIONS

Extended European Search Report for European Patent Application No. 15822521.9, dated Feb. 12, 2018, 6 pages.

\* cited by examiner

FIG. 1
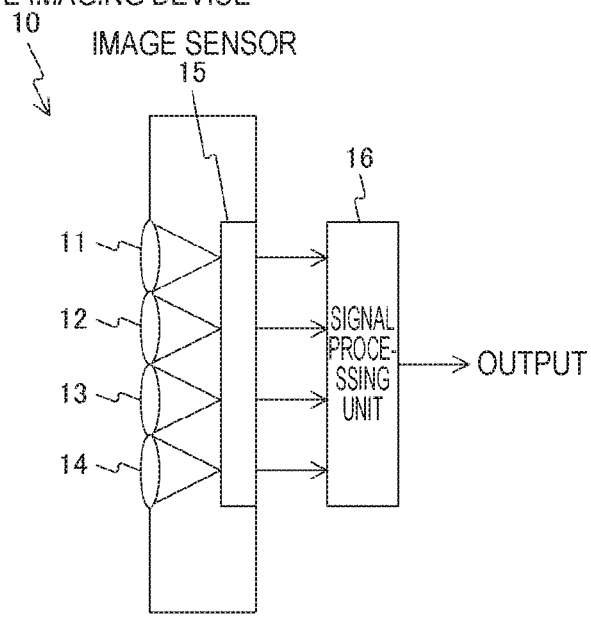
a
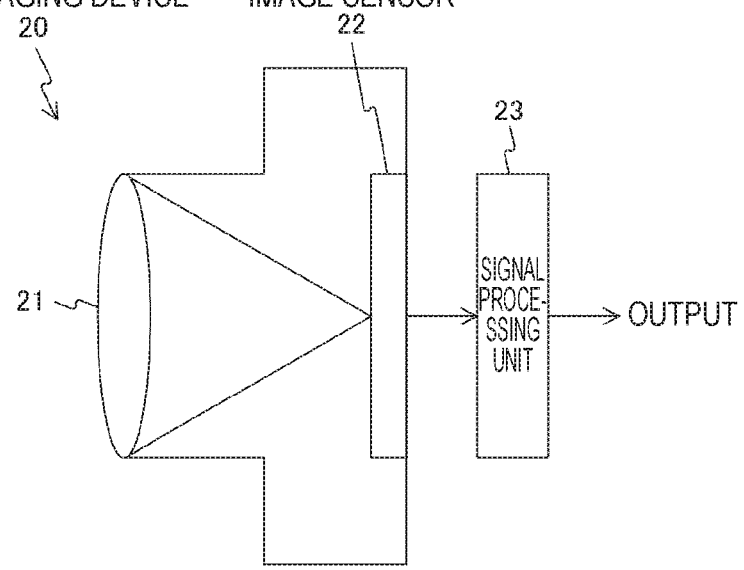
b

FIG. 4
TOP VIEW
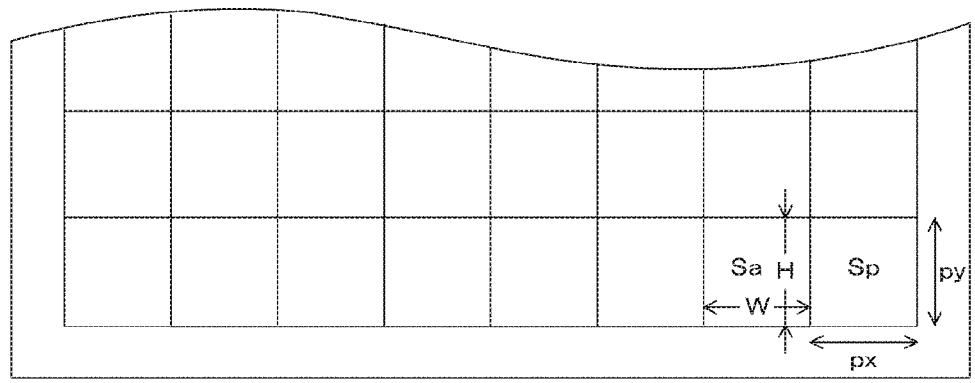
a
CROSS-SECTION VIEW
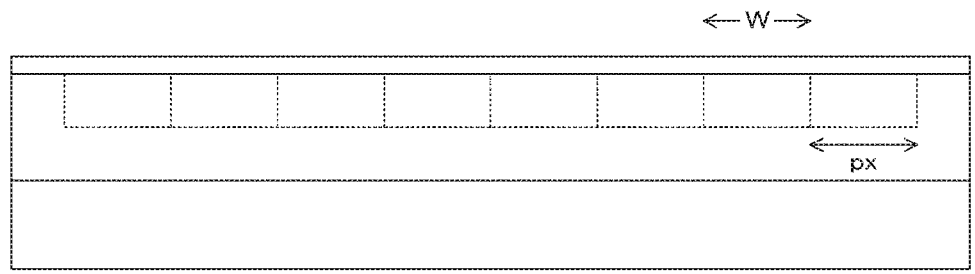
b

FIG. 5
TOP VIEW
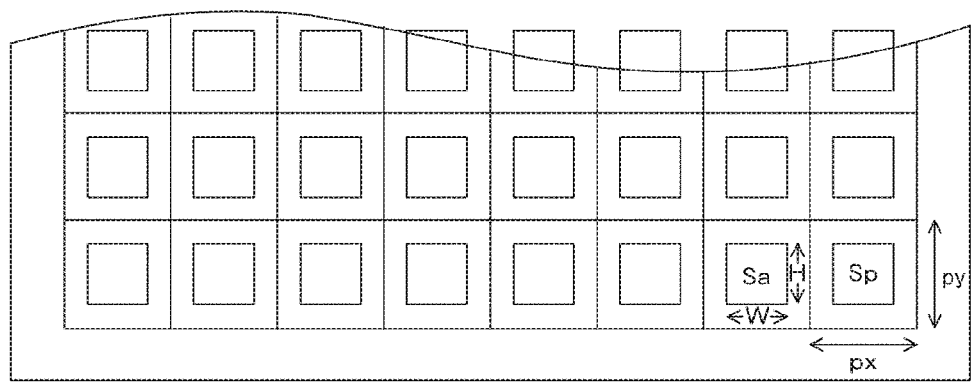
a
CROSS-SECTION VIEW
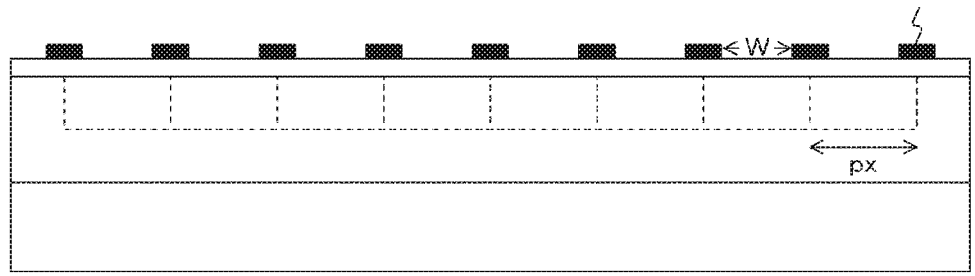
b

FIG. 6
TOP VIEW
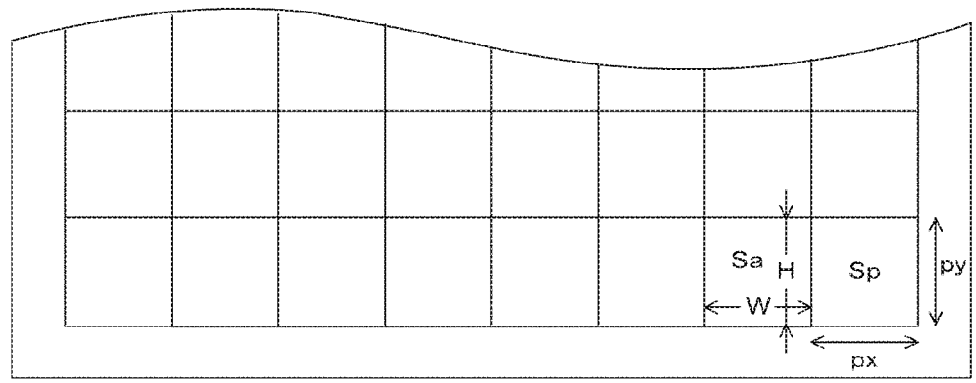
a
CROSS-SECTION VIEW
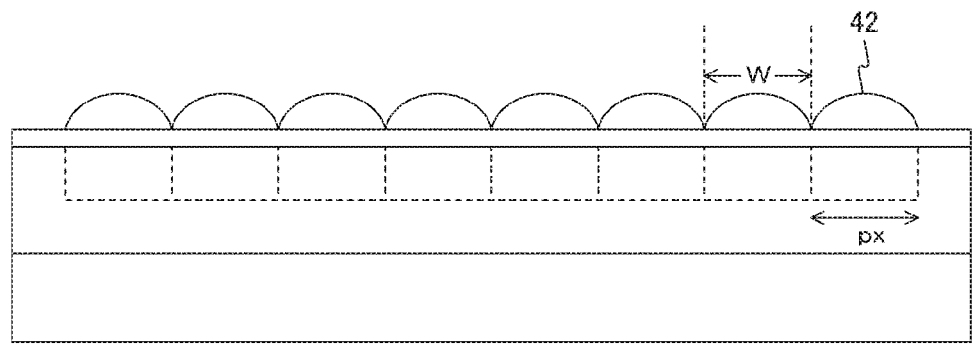
b

FIG. 7
TOP VIEW
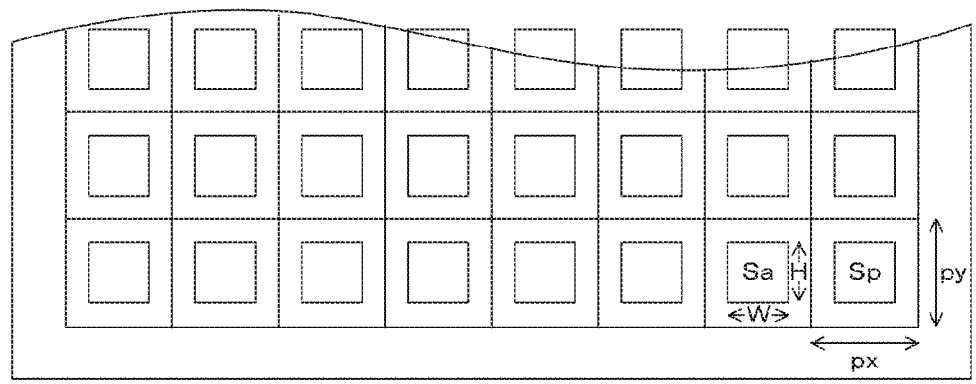
a
CROSS-SECTION VIEW
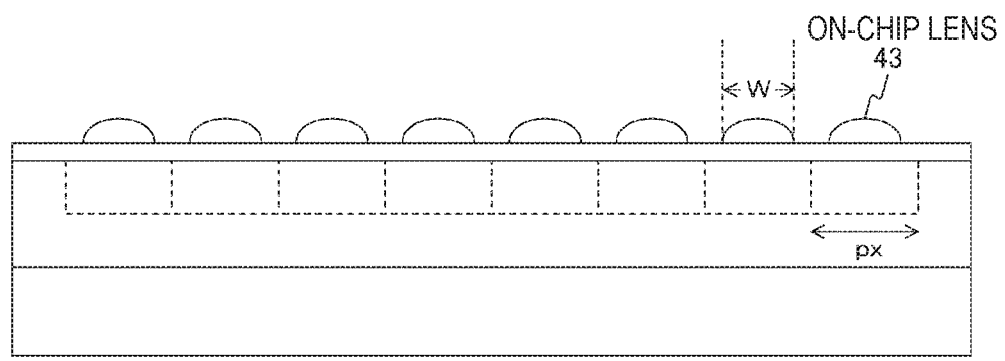
b

FIG. 8
TOP VIEW
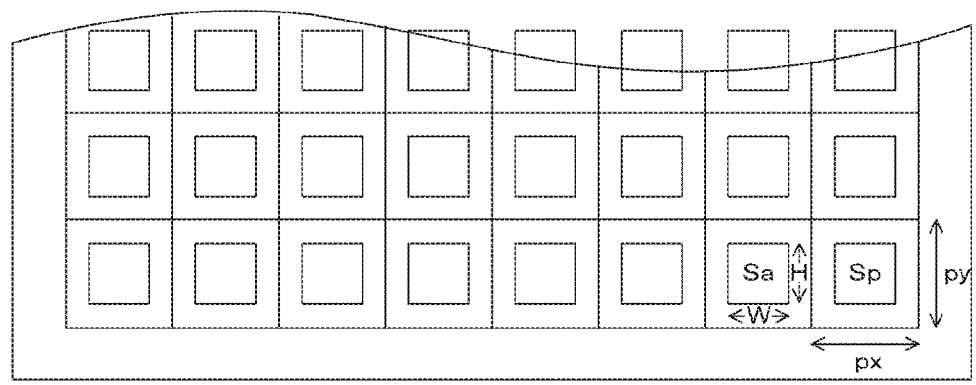
a
CROSS-SECTION VIEW
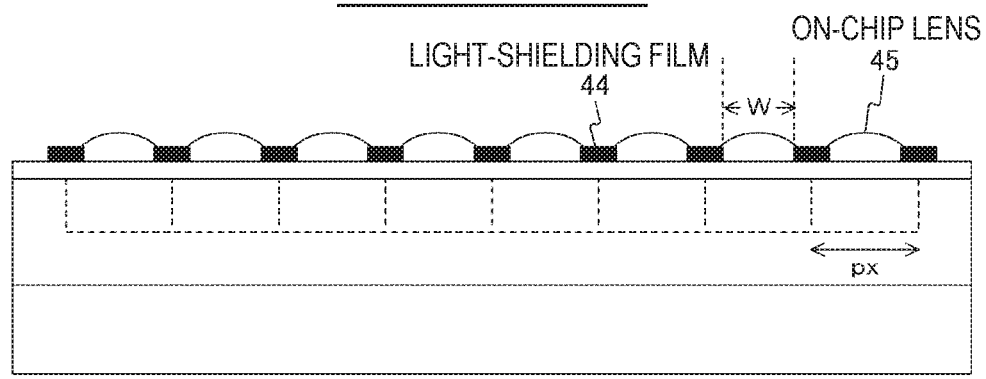
b

FIG. 42
BACK-ILLUMINATED CMOS IMAGE SENSOR
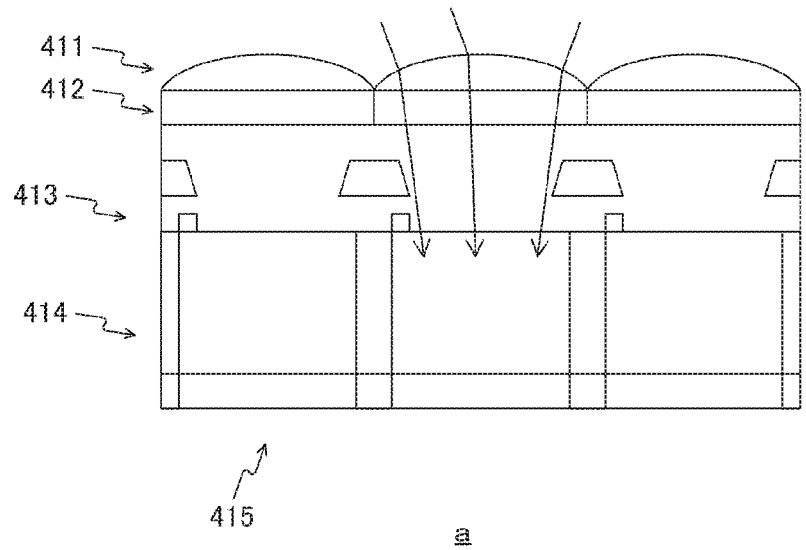
a
FRONT-ILLUMINATED CMOS IMAGE SENSOR
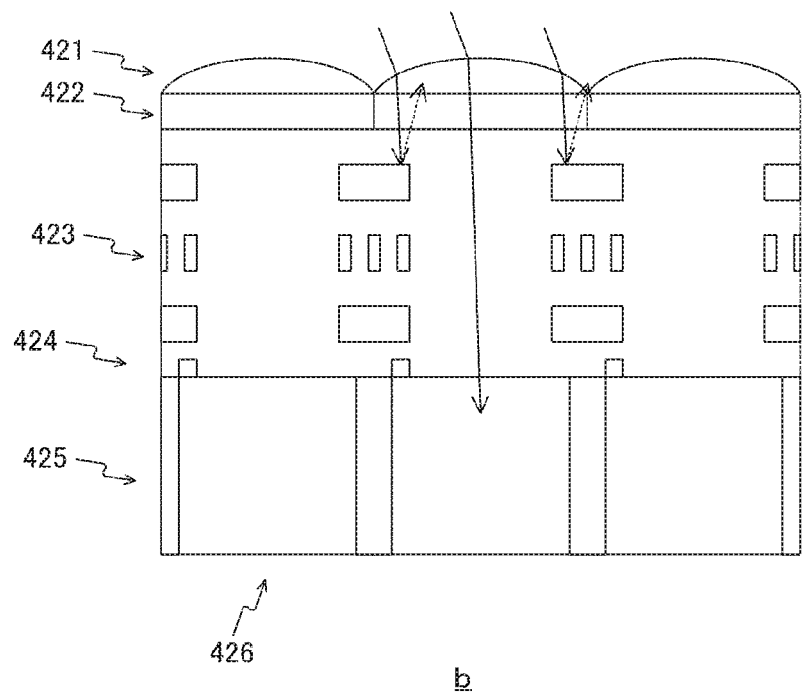
b

BACK-ILLUMINATED CMOS IMAGE SENSOR

FIG. 46
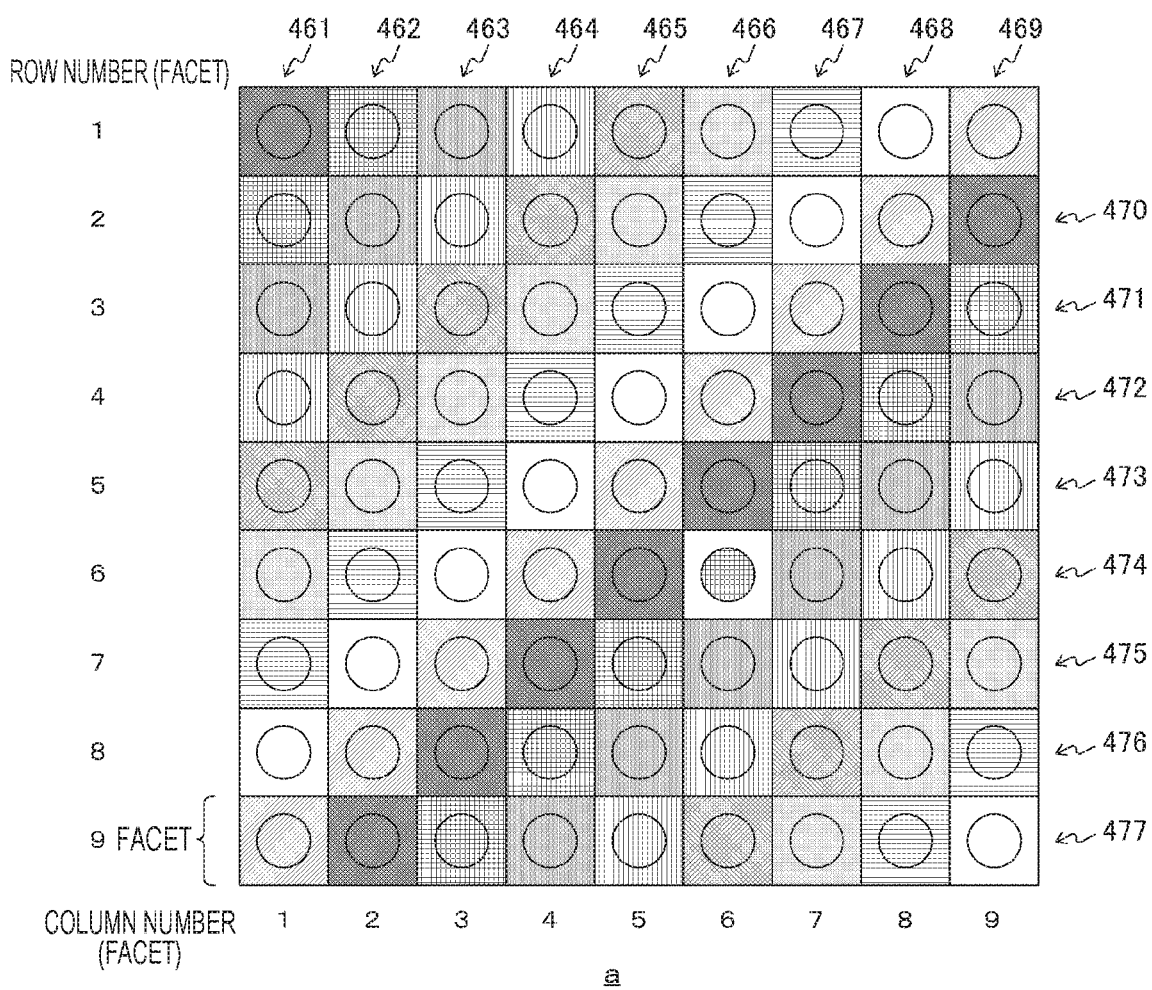
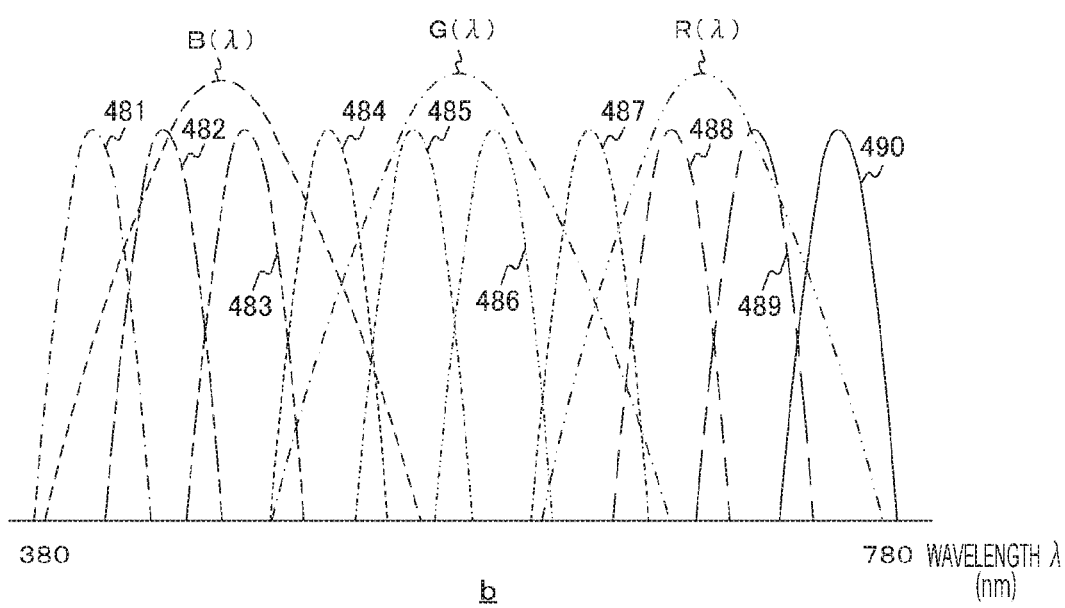

FIG. 47
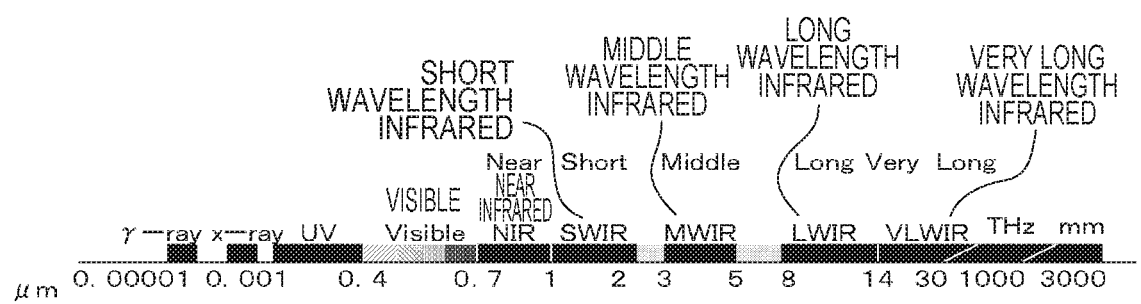
a
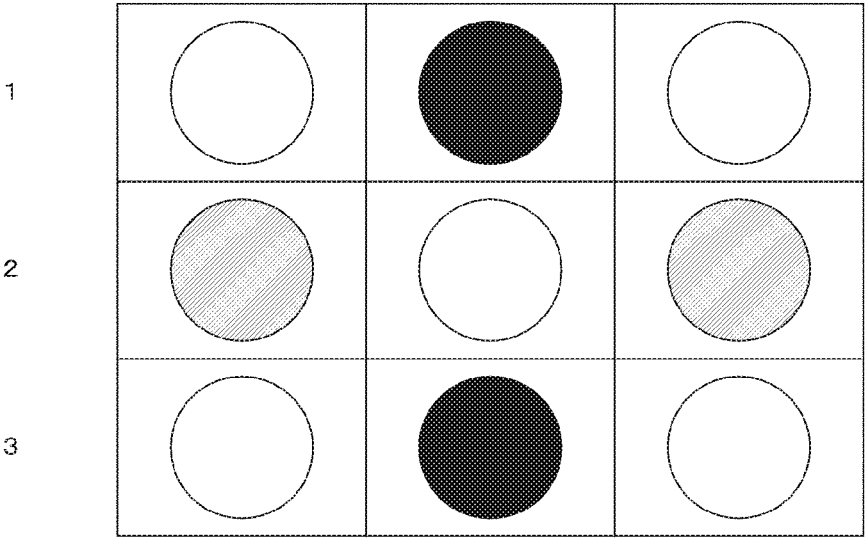
b

FIG. 48

EXAMPLES OF REPRESENTATIVE PHOTOELECTRIC CONVERSION
MATERIALS USED IN SHORT WAVELENGTH INFRARED, MIDDLE
WAVELENGTH INFRARED, AND LONG WAVELENGTH INFRARED CAMERAS

| NEAR INFRARED CAMERA | SHORT WAVELENGTH INFRARED CAMERA | MIDDLE AND LONG WAVELENGTH INFRARED CAMERA | LONG WAVELENGTH INFRARED CAMERA |
|---|---|---|---|
| Si | Ge<br>InGaAs<br>HgCdTe | InSb<br>AlGaAs<br>HgCdTe | Bolometer |

BACK-ILLUMINATED CMOS IMAGE SENSOR

COMPOUND-EYE IMAGING DEVICE

CROSS REFERENCE TO RELATED APPLICATIONS

This application is a national stage application under 35 U.S.C. 371 and claims the benefit of PCT Application No PCT/JP2015/063310 having an international filling date of 8 May 2015, which designated the United States, which PCT application claimed the benefit of Japanese Patent Application No. 2014-145570 filed 16 Jul. 2014, and Japanese Patent Application No. 2014-189701 filed 18 Sep. 2014, the disclosures of which are incorporated herein by reference in their entirety.

TECHNICAL FIELD

The present technology relates to a compound-eye imaging device. Specifically, the present technology relates to a compound-eye imaging device which generates image data.

BACKGROUND ART

Conventionally, there are imaging devices which image a subject and generate image data. For example, imaging devices such as a digital still camera, a digital video camera, and the like having one optical system are widespread.

In addition, for example, a compound-eye imaging device having a plurality of optical systems has been proposed (for example, see Patent Literature 1).

CITATION LIST

Patent Literature

Patent Literature 1: JP 2001-61109A

DISCLOSURE OF INVENTION

Technical Problem

In the conventional art described above, an image signal (image data) is generated by each of a plurality of facets corresponding to a plurality of optical systems. Also, an output image is generated by using image signals (image data) generated by each of the plurality of facets.

In this way, the output image is generated by using an image signal (image data) generated by each of the plurality of facets, and thus it is important to improve the picture quality of this output image.

The present technology has been created in consideration of this situation, and is intended to improve picture quality.

Solution to Problem

The present technology has been made to solve the above problem. According to a first aspect of the present technology, a compound-eye imaging device includes: a plurality of facet optical systems configured to be disposed to face a subject in a two dimensional shape; an imaging element configured to include, in units of facets, a plurality of pixels receiving light concentrated by the facet optical systems and generating image signals; and a signal processing unit configured to generate an image corresponding to the subject based on image signals generated by the imaging element. Accordingly, an effect of generating an image corresponding to a subject based on image signals generated by an imaging element having a plurality of pixels in units of facets is brought about.

According to the first aspect, spatial pixel shift may be performed by shifting positions of optical axes of the facet optical systems. Accordingly, an effect of performing spatial pixel shift by shifting the positions of optical axes of facet optical systems is brought about.

According to the first aspect, the signal processing unit may correct a shift of an image occurring in accordance with a color in a peripheral portion on a focal surface resulting from chromatic aberration of magnification of the facet optical systems. Accordingly, an effect of correcting a shift of an image occurring according to a color in a peripheral portion on a focal surface resulting from the chromatic aberration of magnification of a facet optical system is brought about.

According to the first aspect, at least one of the plurality of facet optical systems may have a different optical characteristic from other facet optical systems. Accordingly, an effect of using a compound-eye imaging device in which at least one of the plurality of facet optical systems has a different optical characteristic than other facet optical systems is brought about.

According to the first aspect, an f-number of a facet optical system in a peripheral portion of the imaging element may be smaller than f-numbers of other facet optical systems. Accordingly, an effect of using a compound-eye imaging device in which an f-number of a facet optical system in a peripheral portion of an imaging element is smaller than f-numbers of other facet optical systems is brought about.

According to the first aspect, the compound-eye imaging device may be configured with a wafer level camera module (WLCM) and a stacked compound-eye imaging device, and the number of the facets may be increased than a threshold value. Accordingly, an effect of using a compound-eye imaging device in which the number of facets is large based on a threshold value is brought about.

According to the first aspect, the compound-eye imaging device may further includes a control unit configured to perform at least one of stopping operation of a facet not in use among the plurality of facets and turning off an analog to digital converter (ADC) installed in the facet. Accordingly, an effect of performing at least one of stopping operation of a facet or turning off an ADC is brought about.

According to the first aspect, a distance sensor may be provided in at least one of the plurality of facets. Accordingly, an effect of using a distance sensor provided in at least one of a plurality of facets is brought about.

According to the first aspect, at least one of the plurality of facets may have a different polarization angle from other facets. Accordingly, an effect of using a compound-eye imaging device in which at least one of a plurality of facets has a different polarization angle than other facets is brought about.

According to the first aspect, at least one of the plurality of facets may have a different spectral sensitivity from other facets. Accordingly, an effect of using a compound-eye imaging device in which at least one of a plurality of facets has a different spectral sensitivity than other facets is brought about.

According to the first aspect, at least one of the plurality of facets may be made of different material from other facets. Accordingly, an effect of using a compound-eye imaging device in which at least one of a plurality of facets is made of a different material than other facets is brought about.

According to the first aspect, the imaging element may be manufactured by arranging singulated chips side by side as one pseudo-chip and adding a multi lens array (MLA). Accordingly, an effect of using an imaging element which is manufactured by arranging singulated chips side by side as one pseudo-chip and adding an MLA is brought about.

According to the first aspect, the imaging element may be manufactured through tiling. Accordingly, an effect of using an imaging element manufactured through tiling is brought about.

According to the first aspect, the imaging element may include a plurality of layers for acquiring color information varying at identical pixels in an incident direction of light. Accordingly, an effect of generating an image by using an imaging element composed of a plurality of layers for acquiring color information which varies at identical pixels in the incident direction of light is brought about.

According to the first aspect, the compound-eye imaging device may further includes: an image distance adjusting unit configured to adjust an image distance (distance from lens to image formation surface) of each of the facets. Accordingly, an effect of adjusting an image distance of each facet is brought about.

According to the first aspect, a focusing state of each of the facets may be changed. Accordingly, an effect of changing a focusing state of each facet is brought about.

According to the first aspect, different focal lengths may be set for the respective facets. Accordingly, an effect of setting different focal lengths for respective facets is brought about.

According to the first aspect, the compound-eye imaging device may further includes: a retaining unit configured to retain optical characteristic information about optical characteristics of the facet optical systems. The signal processing unit may generate the image corresponding to the subject by performing signal processing with the retained optical characteristic information. Accordingly, an effect of generating an image corresponding to a subject by performing signal processing with retained optical characteristic information is brought about.

According to the first aspect, the signal processing unit may generate the image by using both an image signal before temporal response correction processing is performed and an image signal after the temporal response correction is performed among the image signals generated by the imaging element. Accordingly, an effect of generating an image by using both an image signal before temporal response correction processing is performed and an image signal after the temporal response correction is performed among image signals generated by an imaging element is brought about.

According to the first aspect, the signal processing unit may correct, with regard to the image signals generated by the imaging element, a difference resulting from temporal response characteristics of photoelectric conversion by the imaging element. Accordingly, an effect of correcting, with regard to image signals generated by an imaging element, a difference resulting from temporal response characteristics of photoelectric conversion by the imaging element is brought about.

Advantageous Effects of Invention

According to the present technology, it is possible to achieve the remarkable effect of being able to improve picture quality. It should be noted that the effect described here is not necessarily limitative, and any effect described in the present disclosure may be exhibited.

BRIEF DESCRIPTION OF DRAWINGS

FIG. 1 is a diagram showing a configuration example of a compound-eye imaging device 10 which is a basis of the present technology.

FIG. 4 is a diagram simply showing an upper surface and a cross section of an image sensor which is a basis of the present technology.

FIG. 5 is a diagram simply showing an upper surface and a cross section of an image sensor which is a basis of the present technology.

FIG. 6 is a diagram simply showing an upper surface and a cross section of an image sensor which is a basis of the present technology.

FIG. 7 is a diagram simply showing an upper surface and a cross section of an image sensor which is a basis of the present technology.

FIG. 8 is a diagram simply showing an upper surface and a cross section of an image sensor which is a basis of the present technology.

FIG. 42 is a diagram showing a configuration example of a back-illuminated CMOS image sensor used in a compound-eye imaging unit 110 in accordance with a 14th embodiment of the present technology.

FIG. 46 shows an example of a case in which there are facets having different spectral sensitivities in a compound-eye imaging unit 110 in accordance with an 18th embodiment of the present technology.

FIG. 47 shows an example of a case in which a sensor has sensitivities to light other than visible light in a compound-eye imaging unit 110 in accordance with a 19th embodiment of the present technology.

FIG. 48 is a diagram showing example of photoelectric conversion materials constituting the compound-eye imaging unit 110 in accordance with the 19th embodiment of the present technology.

MODE(S) FOR CARRYING OUT THE INVENTION

Figure 2:
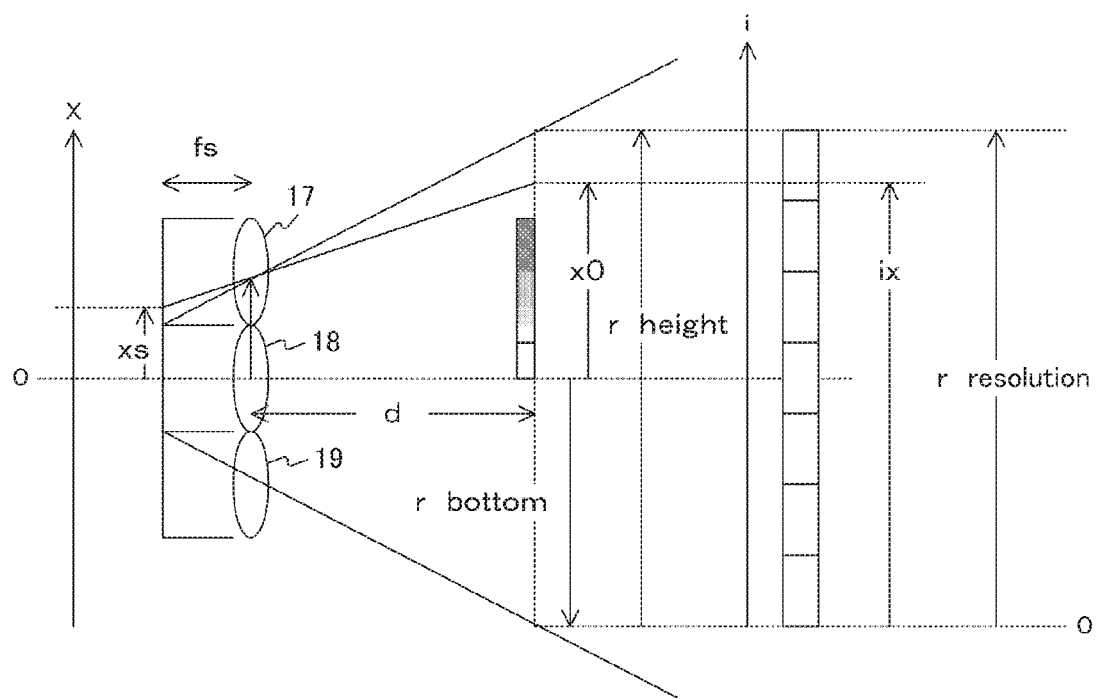
FIG. 2 is a diagram showing an example of deriving a reconstructed image from compound-eye images generated by a compound-eye imaging device which is a basis of the present technology.

Hereinafter, embodiments for implementing the present technology (hereinafter referred to as "embodiments") will be described. Description will be provided in the following order.

1. First embodiment (example of changing effective apertures of pixels in respective color filters (optical filters))

2. Second embodiment (example of performing spatial pixel shift by shifting positions of optical axes of facets)

3. Third embodiment (example of correcting chromatic aberration of magnification of facet lens in signal processing)

4. Fourth embodiment (example of optically designing facets in accordance with difference in focal length caused by axial chromatic aberration of facet lenses)

5. Fifth embodiment (example of configuring one facet with plurality of sub-facets)

6. Sixth embodiment (example of configuring at least one of plurality of facet lenses to have different optical characteristic and structure)

7. Seventh embodiment (example of performing pupil correction for each facet)

8. Eighth embodiment (example of improving shading characteristic by reducing f-numbers of peripheral optical systems having space to spare)

9. Ninth embodiment (example of improving sensitivity by increasing number of facets in wafer level camera module (WLCM) and stacked compound-eye imaging device)

10. 10th embodiment (example of increasing sensitivity and dynamic range by disposing facets having different sensitivities in WLCM)

11. 11th embodiment (example of performing readout from compound-eye imaging unit with plurality of readout methods)

12. 12th embodiment (example of reducing power consumption by turning off operation of facets or analog to digital converters (ADCs))

13. 13th embodiment (example of using global shutter complementary metal oxide semiconductor (CMOS) image sensor)

14. 14th embodiment (example of using back-illuminated CMOS image sensor)

15. 15th embodiment (example of using stacked image sensor)

16. 16th embodiment (example of disposing distance sensor in facet)

17. 17th embodiment (example of providing facets having different polarization angles)

18. 18th embodiment (example of providing facets having different spectral sensitivities)

19. 19th embodiment (example of providing facets composed of sensors having sensitivity to light other than visible light)

20. 20th embodiment (example of calculating distance information by using parallax of WLCM)

21. 21st embodiment (example in which at least one of plurality of facets is made of different material than other facets)

22. 22nd embodiment (example of manufacturing compound-eye imaging unit by arranging singulated chips of image sensors (imaging elements) side by side as one pseudo-chip and adding multi lens array (MLA) and the like)

23. 23rd embodiment (example of manufacturing compound imaging unit through tiling)

24. 24th embodiment (example of manufacturing compound-eye imaging unit through tiling, thinning down, rewiring, and interlayer connection)

25. 25th embodiment (example of imaging device in which plurality of compound-eye imaging units are arranged side by side and image is taken)

26. 26th embodiment (example of manufacturing compound-eye imaging device by varying surfaces or angles at which facets or plurality of compound-eye imaging units are arranged side by side)

27. 27th embodiment (example of bending compound-eye imaging device by affixing thinned-down compound-eye imaging device to reference surface or of varying reference surfaces of facets and varying optical axes of facets)

28. 28th embodiment (example of detecting sizes of deviation, slope, and distortion between relative positions of facets (or plurality of compound-eye imaging units) when facets (or plurality of compound-eye imaging units) are connected)

29. 29th embodiment (example in which light-receiving surface of imaging element has recessed shape in each facet)

30. 30th embodiment (example of imaging element composed of plurality of layers for acquiring color information varying at identical pixels in incident direction of light)

31. 31st embodiment (example of compound-eye imaging device having image distance adjusting unit for adjusting image distance of each facet)

32. 32nd embodiment (example of compound-eye imaging device changing focusing states of respective facets)

33. 33rd embodiment (example of compound-eye imaging device setting different focal lengths for respective facets)

34. 34th embodiment (example of compound-eye imaging device retaining and using information about optical characteristics of facet optical systems (optical characteristic information) in signal processing)

35. 35th embodiment (example of compound-eye imaging device using both image signals before and after temporal response correction)

36. 36th embodiment (example of compound-eye imaging device correcting difference in temporal response characteristics of photoelectric conversion)

1. First Embodiment

[Configuration Example of Imaging Device]

FIG. 1 is a diagram showing a configuration example of a compound-eye imaging device 10 which is a basis of the present technology. Also, FIG. 1 shows a configuration example of a single-eye imaging device 20 as a comparative example of the compound-eye imaging device 10. In other words, a of FIG. 1 shows the configuration example of the compound-eye imaging device 10, and b of FIG. 1 shows the configuration example of the single-eye imaging device 20. For convenience of description, each configuration is simplified and shown in a and b of FIG. 1.

The compound-eye imaging device 10 shown in a of FIG. 1 is a camera that is one camera including a plurality of facet lenses 11 to 14. Light concentrated by each of the plurality of facet lenses 11 to 14 is received by an image sensor (imaging element) 15. Then, an image signal which has been photoelectrically converted by the image sensor 15 is subjected to signal processing by a signal processing unit 16. Due to this signal processing, one image is generated and output based on light concentrated by each of the plurality of facet lenses 11 to 14.

The single-eye imaging device 20 shown in b of FIG. 1 is a camera that is one camera including one lens 21. Light concentrated by the lens 21 is received by an image sensor 22. Then, an image signal which has been photoelectrically converted by the image sensor 22 is subjected to signal processing by a signal processing unit 23. Due to this signal processing, one image is generated and output based on the light concentrated by the lens 21.

Here, a major advantage of the compound-eye imaging device 10 is that it is possible to shorten the distance from the surface of a lens (facet lens) to an image sensor more than in the single-eye imaging device 20. For this reason, for example, it is possible to thin down the thickness of the camera. Also, it is possible to extract distance information from the camera to a subject by using parallax and the like caused by the plurality of facets. Further, by performing signal processing for image information obtained by the facets based on the structure of the compound-eye imaging device 10, it is possible to obtain a resolution higher than the resolution of a facet.

Among these advantages of the compound-eye imaging device 10, a method of obtaining a resolution higher than the resolution of a facet by performing signal processing for image information obtained by the facets based on the structure of the compound-eye imaging device 10 will be described in detail with reference to FIG. 2.

[Example of Deriving Reconstructed Image from Compound-Eye Images]

FIG. 2 is a diagram showing an example of deriving a reconstructed image from a compound-eye image generated by a compound-eye imaging device which is a basis of the present technology. FIG. 2 shows an example of a compound-eye imaging device in which three facet lenses 17 to 19 are installed in a vertical direction.

For example, it is possible to calculate x0 by using the following formula $$x0 = \{(ix/r \text{ resolution}) \times r \text{ height}\} + (r \text{ bottom} \times xs) = \{(xc-x0) \times fs/d\} + xc$$

By using x0 calculated with this formula, it is possible to derive a reconstructed image from compound-eye images.

[Example of Extracting Distance Information from Compound-Eye Images]

Figure 3:
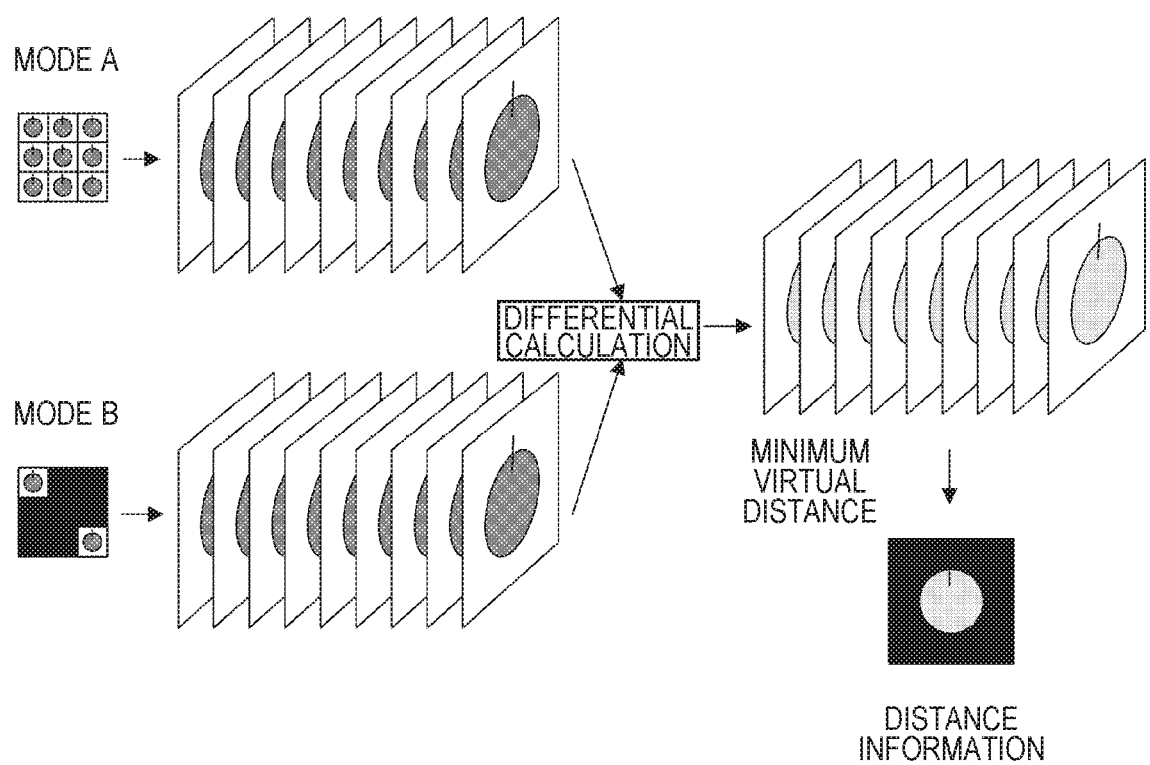
FIG. 3 is a diagram showing an example of extracting distance information from compound-eye images generated by a compound-eye imaging device which is a basis of the present technology.

FIG. 3 is a diagram showing an example of extracting distance information from compound-eye images generated by a compound-eye imaging device which is a basis of the present technology.

For example, it is possible to extract distance information from a compound-eye imaging device to a subject by using parallax and the like caused by a plurality of facets. For example, image data generated in each of mode A in which an imaging operation is performed by using nine facets and mode B in which an imaging operation is performed by using two facets, is used.

Then, with regard to the image data generated in mode A and the image data generated in mode B, a plurality of virtual distances are set, and reconstructed images are generated. Subsequently, a differential calculation is performed on this image data, and a virtual distance which is the minimum is extracted, so that distance information can be calculated based on the virtual distance.

[Example of Calculating Effective Aperture]

Next, an effective aperture and an effective aperture ratio of an image sensor will be described with reference to the drawings.

An effective aperture denotes an area in a pixel in which it is possible to effectively receive incident light. For example, in a front side image sensor, even when the aperture area of a photodiode in a pixel is small, it is possible to obtain an effective aperture which is similar to a pixel area by attaching an on-chip lens. Also, for example, with regard to a backside image sensor, even when there is no on-chip lens, it is possible to make an effective aperture similar to a pixel area.

FIG. 4 to FIG. 8 are diagrams showing simplified upper surfaces and cross sections of image sensors which are bases of the present technology. a of FIG. 4 to FIG. 8 shows top views of image sensors, and b of FIG. 4 to FIG. 8 shows cross-sectional views of the image sensors.

In a of FIG. 4 to FIG. 8, a plurality of rectangles disposed in two dimensions indicate pixels. Also, in b of FIG. 4 to FIG. 8, a plurality of rectangles of dotted lines indicate pixels. Also, in b of FIG. 5 and b of FIG. 8, a plurality of rectangles colored black indicate light-shielding films (for example 41 and 44). Also, in b of FIG. 6 and FIG. 8, a plurality of semicircles indicate on-chip lenses (for example, 42, 43, and 45).

Also, px denotes a length of a pixel in a horizontal direction. Also, py denotes a length of a pixel in a vertical direction. Also, W denotes a length of an effective aperture in a horizontal direction. Also, H denotes a length of an effective aperture in a vertical direction. In this case, an effective aperture area Sa can be calculated as Sa=W×H, and a pixel area Sp can be calculated as Sp=px×py.

Also, an effective aperture ratio denotes a ratio of an effective aperture area to a pixel area. As shown in FIG. 4, when it is possible to show the shape of a pixel and an effective aperture as rectangles, an effective aperture ratio G is expressed by the following formula.

$$G=Sa/Sp=(W\times H)/(Px\times Py)$$

Here, FIG. 4 shows an example of an image sensor which has a pixel aperture ratio of 100% like a backside image sensor.

Also, FIG. 5 shows an example of an image sensor whose pixel aperture ratio becomes less than 100% by providing a backside image sensor with inter-pixel light-shielding films (the light-shielding films 41) for suppression of color mixing.

Also, FIG. 6 shows an example of an image sensor whose pixel aperture ratio of 100% is retained by providing a backside image sensor with on-chip lenses 42 for suppression of color mixing.

Also, FIG. 7 shows an example of an image sensor whose pixel aperture ratio becomes less than 100° % by providing a backside image sensor with on-chip lenses 43 smaller than a pixel area for suppression of color mixing.

Also, FIG. 8 shows an example of an image sensor whose pixel aperture ratio becomes less than 100° % by providing a backside image sensor with inter-pixel light-shielding films (the light-shielding films 44) for suppression of color mixing and further providing on-chip lenses 45 smaller than a pixel area.

1. First Embodiment

A first embodiment of the present technology shows an example of changing effective apertures of pixels in respective color filters (optical filters).

[Configuration Example of Compound-Eye Imaging Device]

Figure 9:
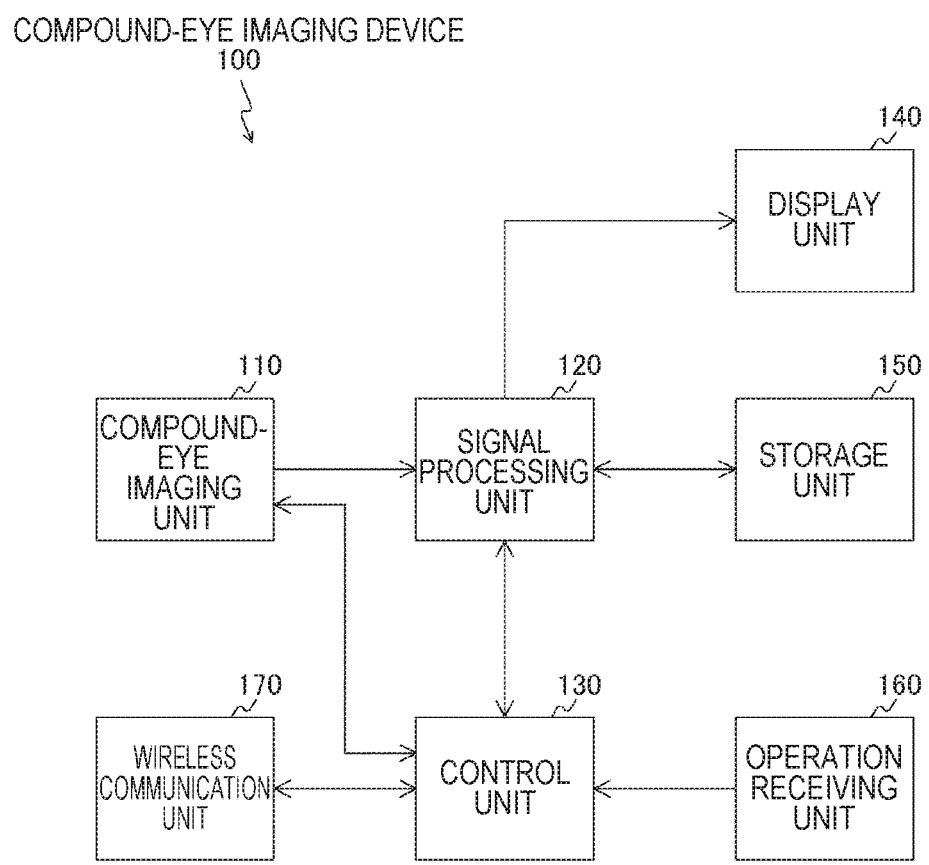
FIG. 9 is a block diagram showing a functional configuration example of a compound-eye imaging device 100 in accordance with a first embodiment of the present technology.

FIG. 9 is a block diagram showing a functional configuration example of a compound-eye imaging device 100 in accordance with the first embodiment of the present technology.

The compound-eye imaging device 100 includes a compound-eye imaging unit 110, a signal processing unit 120, a control unit 130, a display unit 140, a storage unit 150, an operation receiving unit 160, and a wireless communication unit 170. Although FIG. 9 shows an example in which the compound-eye imaging device 100 includes the display unit 140, the operation receiving unit 160, and the wireless communication unit 170, the compound-eye imaging device 100 may be configured without at least one of them. Also, for example, an interface which exchanges data with an external device may be provided in the compound-eye imaging device 100. In this case, for example, the compound-eye imaging device 100 can cause the external device (for example, a display device) connected through the interface to output information (for example, image display). Also, for example, the compound-eye imaging device 100 can acquire information (for example, information about an operation input of a user) which has been input to the external device (for example, an input device) connected through the interface. Also, for example, the compound-eye imaging device 100 can exchange information (for example, image information) with another device by using wireless communication due to the external device (for example, a wireless communication device) connected through the interface.

The compound-eye imaging unit 110 images a subject to generate an image signal (image data) based on control of the control unit 130, and outputs the generated image signal to the signal processing unit 120. For example, the compound-eye imaging unit 110 includes a plurality of facet optical systems (facet lenses), imaging elements (image sensors), and color filters. Here, the facet optical systems (facet lenses) are disposed to face a subject in a two dimensional shape. Also, the imaging elements (image sensors) include a plurality of pixels, which receive light concentrated by the facet optical systems and generate image signals, in units of facets. Also, the color filters are installed in the respective facets. A configuration of the compound-eye imaging unit 110 will be described in detail in the first embodiment and other embodiments of the present technology.

The signal processing unit 120 performs predetermined signal processing on the image signal (image data) generated by the compound-eye imaging unit 110 based on control of the control unit 130, and outputs the image data which has been subjected to the signal processing to the display unit 140 or the storage unit 150. In other words, the signal processing unit 120 generates an image corresponding to the subject based on the image signal (image data) generated by the compound-eye imaging unit 110.

The control unit 130 controls each unit of the compound-eye imaging device 100 based on a control program.

The display unit 140 displays an image based on the image data which has been subjected to the signal processing by the signal processing unit 120.

The storage unit 150 stores the image data which has been subjected to the signal processing by the signal processing unit 120.

The operation receiving unit 160 is an operation receiving unit which receives a user operation, and outputs a control signal in accordance with the received user operation to the control unit 130.

The wireless communication unit 170 transmit and receive each piece of information (for example, image data) to and from another device based on control of the control unit 130 by using wireless communication. Here, for example, it is possible to use a wireless local area network (LAN) for wireless communication. By way of this wireless LAN, for example, wireless fidelity (Wi-Fi) can be used. Also, for example, Bluetooth (registered trademark), near field communication (NFC), infrared rays, radio waves for cellular phones, and the like can be used for wireless communication.

[Example of Changing Effective Apertures of Pixels in Respective Color Filters]

Figure 10:
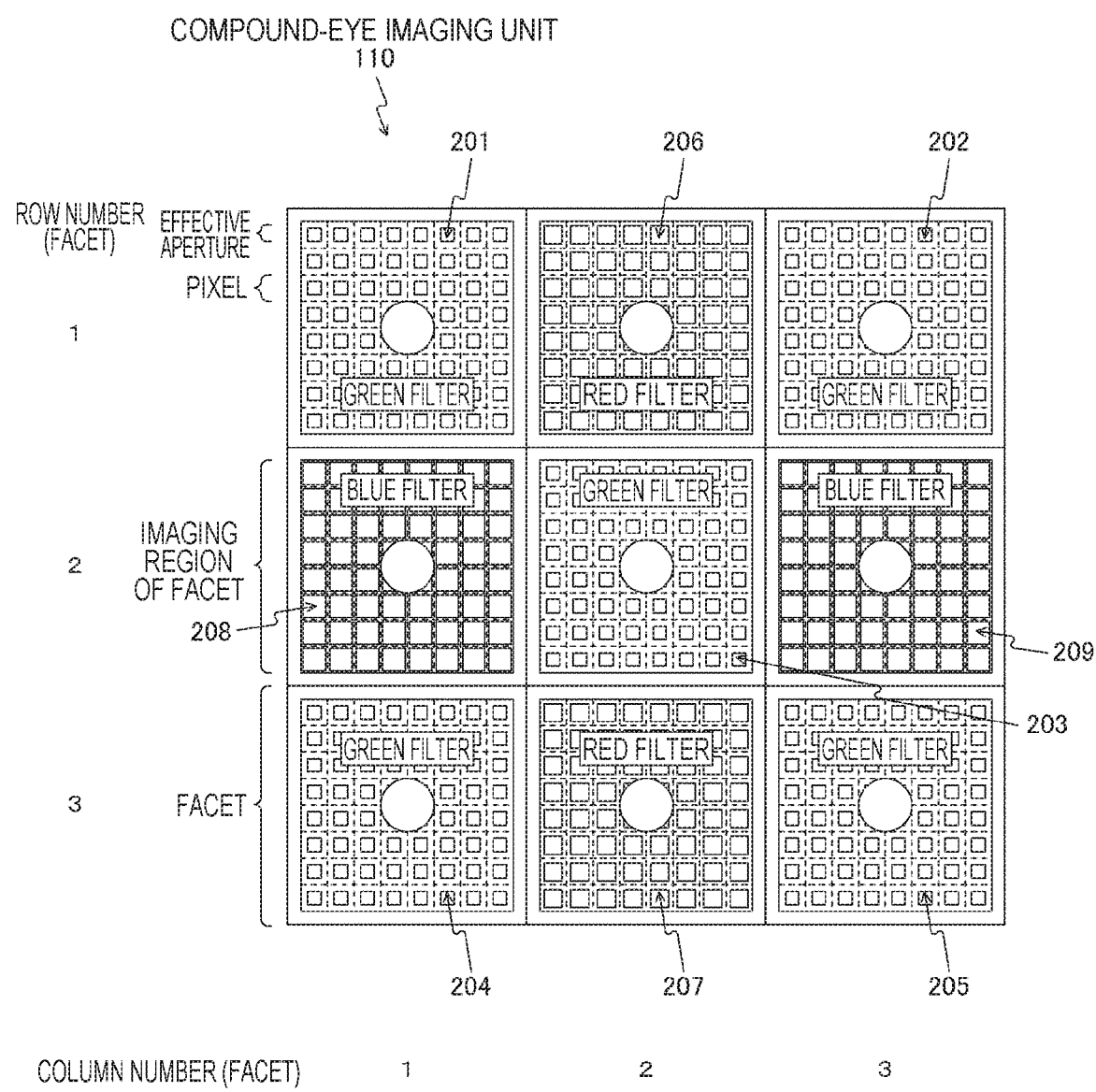
FIG. 10 is a diagram simply showing an image sensor of the compound-eye imaging unit 110 in accordance with the first embodiment of the present technology.
Figure 11:
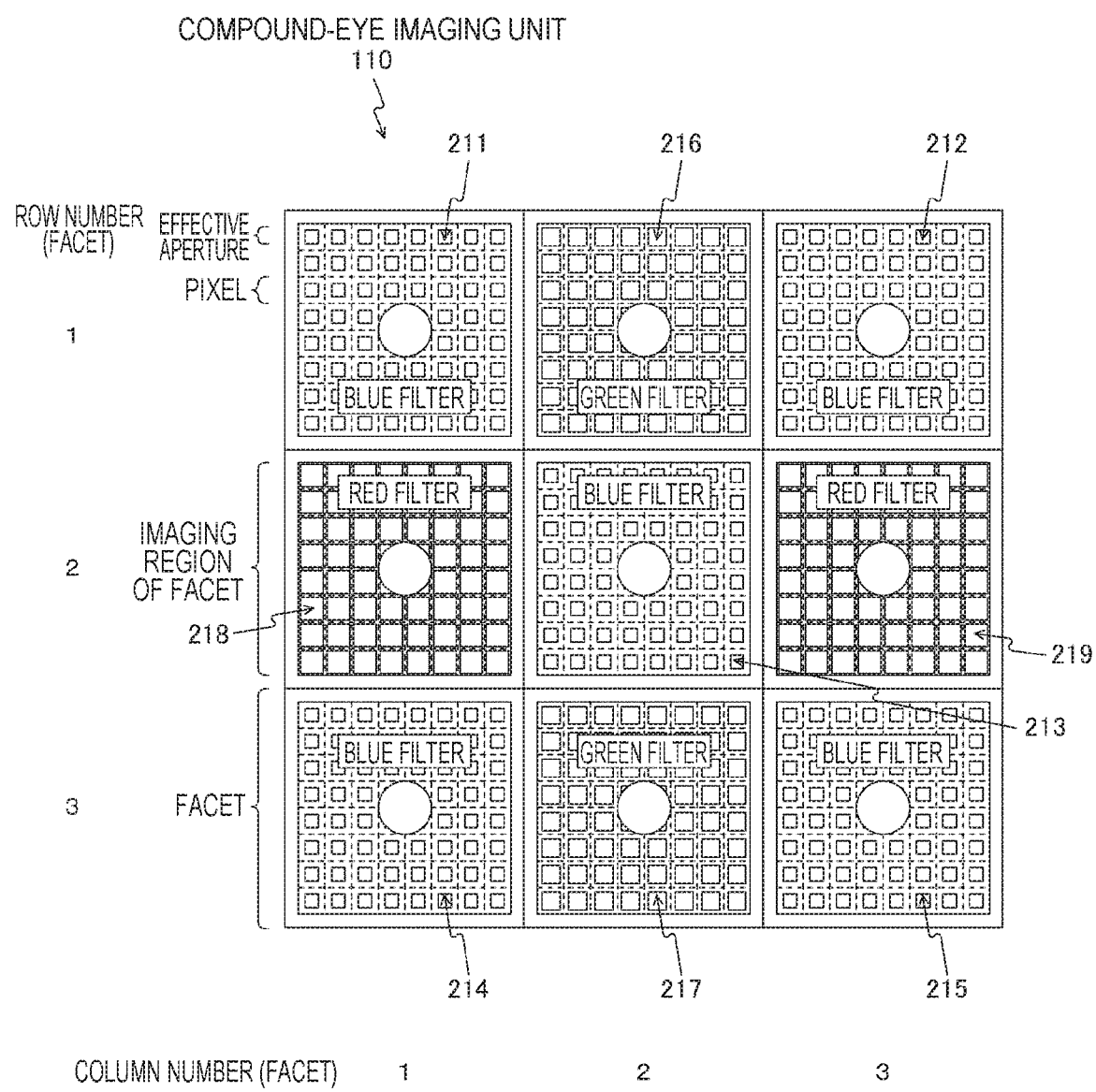
FIG. 11 is a diagram simply showing an image sensor of the compound-eye imaging unit 110 in accordance with the first embodiment of the present technology.
Figure 12:
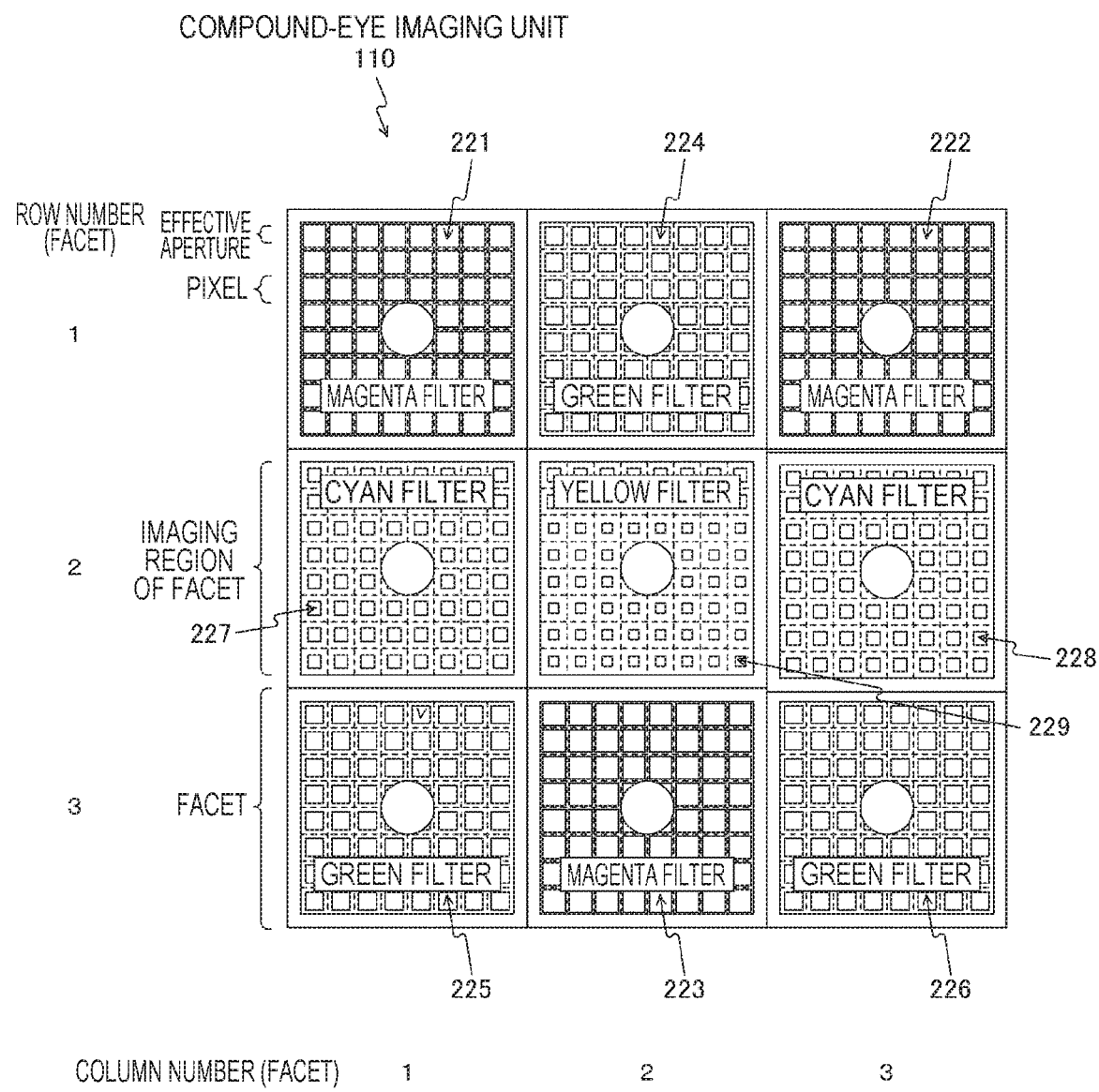
FIG. 12 is a diagram simply showing an image sensor of the compound-eye imaging unit 110 in accordance with the first embodiment of the present technology.

FIG. 10 to FIG. 12 are diagrams simply showing image sensors including the compound-eye imaging unit 110 in accordance with the first embodiment of the present technology. In FIG. 10 to FIG. 12, top views of the image sensors included in the compound-eye imaging unit 110 are shown.

FIG. 10 to FIG. 12 show examples of image sensors configured with a plurality of (3×3) facets. Also, FIG. 10 to FIG. 12 show that row numbers 1 to 3 and column numbers 1 to 3 for specifying the plurality of facets are attached around the image sensors.

Also, in FIG. 10 to FIG. 12, each pixel is represented by a rectangle of dotted lines, and effective apertures are represented by rectangles of solid lines. In other words, a rectangle of solid lines indicating an effective aperture is shown in a rectangle of dotted lines indicating each pixel. Also, in FIG. 10 to FIG. 12, a circle indicating a facet lens is shown on each facet.

In an embodiment of the present technology, for convenience of description, an example of disposing only one facet lens in each facet (or sub-facet (shown in FIG. 22 to FIG. 24)) is shown. However, an optical system configured with a plurality of lenses may be disposed in each facet (or sub-facet).

[Example of Using Red Filter, Green Filter, and Blue Filter]

FIG. 10 and FIG. 11 show examples of using a red filter, a green filter, and a blue filter.

[Example of Maximizing Effective Apertures of Blue Filters and Minimizing Effective Apertures of Green Filters]

FIG. 10 shows an example in which green filters 201 to 205, red filters 206 and 207, and blue filters 208 and 209 are disposed in an image sensor having a rectangular shape configured with a plurality of (3×3) facets. Specifically, in the example, the green filters 201 to 205 are disposed on diagonal lines in the image sensor having a rectangular shape, and a line of the red filters 206 and 207 and a line of the blue filters 208 and 209 meet at right angles. In FIG. 10, for convenience of description, the name of each filter is shown in a white rectangle on each facet.

FIG. 10 shows an example in which effective apertures of the blue filters 208 and 209 are maximized, effective apertures of the red filters 206 and 207 have a second largest value, and effective apertures of the green filters 201 to 205 are minimized.

Also, FIG. 10 shows an example of a case in which color filters of each color are on-chip in the image sensor or a case in which color filters of each color are adjacent to the image sensor. Also, FIG. 10 shows an example of a case in which color filters of each color are adjacent to facet lenses or diaphragms.

[Example of Maximizing Effective Apertures of Red Filters and Minimizing Effective Apertures of Blue Filters]

FIG. 11 shows an example in which blue filters 211 to 215 are disposed on diagonal lines in an image sensor having a rectangular shape configured with a plurality of (3×3) facets, and a line of red filters 218 and 219 and a line of green filters 216 and 217 meet at right angles.

FIG. 11 shows an example in which effective apertures of the red filters 218 and 219 are maximized, effective apertures of the green filters 216 and 217 have a second largest value, and effective apertures of the blue filters 211 to 215 are minimized.

Also, FIG. 11 shows an example of a case in which color filters of each color are on-chip in the image sensor or a case in which color filters of each color are adjacent to the image sensor. Also, FIG. 11 shows an example of a case in which color filters of each color are adjacent to facet lenses or diaphragms.

[Example of Using Cyan Filters, Magenta Filters, Yellow Filter, and Green Filters]

FIG. 12 shows an example of using cyan filters, magenta filters, a yellow filter, and green filters.

[Example of Maximizing Effective Apertures of Magenta Filters and Minimizing Effective Aperture of Yellow Filter]

FIG. 12 shows an example in which magenta filters 221 to 223 in a V shape and green filters 224 to 226 in a V shape are disposed opposite to each other in an image sensor having a rectangular shape configured with a plurality of (3×3) facets. Also, in the example, the yellow filter 229 is disposed at the center, and the cyan filters 227 and 228 and the yellow filter 229 are alternately disposed on the same line.

FIG. 12 shows an example in which effective apertures of the magenta filters 221 to 223 are maximized, effective apertures of the green filters 224 to 226 have a second largest value, effective apertures of the cyan filters 227 and 228 have a third largest value, and an effective aperture of the yellow filter 229 is minimized.

Also, FIG. 12 shows an example of a case in which color filters of each color are on-chip in the image sensor or a case in which color filters of each color are adjacent to the image sensor. Also, FIG. 12 shows an example of a case in which color filters of each color are adjacent to facet lenses or diaphragms.

[Example of Image Processing for Correcting Parallax]

Here, an example of an image processing method for correcting parallax when effective apertures of pixels of respective color filters in an image sensor vary will be described.

As described above, since the compound-eye imaging device 100 is a structure composed of a plurality of facets, parallax occurs between facets in accordance with the distance of a subject in some cases. In this way, when parallax occurs between facets, if an image is output as an output signal of the compound-eye imaging device without the parallax corrected, the image becomes as if a number images corresponding to the number of facets having parallax overlap, and becomes an unnatural image.

Therefore, by performing signal processing on raw data having the parallax obtained from these facets and correcting the parallax, it is possible to obtain natural image information. Also, this natural image information can be made into an image obtained by the compound-eye imaging device.

First, an example of calculating a difference in pixel output is presented. For example, a difference $\delta ijkl$ between a pixel output of a k-th row and an l-th column in a facet of an i-th row and a j-th column and a pixel output of a k-th row and an l-th column in a facet of an I-th row and a J-th column is represented in Formula 1 below. In other words, $\delta ijkl$ indicates the difference between the pixel output of the k-th row and the l-th column in the facet of the i-th row and the j-th column and the pixel output of the k-th row and the l-th column in the other facet (facet of the I-th row and the J-th column).

$$\delta ijkl = Sijkl - SIJkl \quad \text{Formula 1}$$

Here, Sijkl indicates an output signal of each facet. Also, i indicates a row number of a facet in an image sensor. Also, j indicates a column number of the facet in the image sensor. Also, k indicates a row number of a pixel in the facet. Also, l indicates a column number of the pixel in the facet. Also, I indicates a row number of a facet in an output image. Also, J indicates a column number of the facet in the output image.

For example, when there is no parallax or when the parallax has a size that can be ignored, δijkl is zero or a numerical value very close to zero. On the other hand, when there is parallax, δijkl is not zero but a finite numerical value.

Next, an example of correcting parallax is presented.

The difference δijkl between an output signal Sij(k+ε)(L+ζ) of a pixel 8 rows and columns away from a pixel of a k-th row and 1-th column in a facet of an i-th row and j-th column and a pixel output SIJkl of a k-th row and an l-th column in a facet of an I-th row and a J-th column is represented in Formula 2 below.

$$\delta ijkl = Sij(k+\varepsilon)(L+\zeta) - SIJkl \qquad \text{Formula 2}$$

ε and ζ for minimizing the δijkl calculated by using Formula 2 are calculated. Then, the pixel output of the (k+ε)th row and the (l+ζ)th column in the facet of the i-th row and the j-th column is replaced by a pixel output of a k-th row and an I-th column in the facet of an i-th row and a j-th column. Also, the pixel output of the (k+ε)th row and the (l+ζ)th column in the facet of the i-th row and the j-th column is replaced by a pixel output of a (k+ε)th row and an (l+ζ)th column in the facet of the I-th row and the J-th column. In other words, e indicates a correction number of a pixel row number in a facet. Also, C indicates a correction number of a pixel column number in the facet.

By performing such parallax correction, it is possible to make an image after the signal processing by the compound-eye imaging device into a natural image in which no images overlap.

In the first embodiment of the present technology, an example of using visible light primary color filters of R, G, B, and the like and visible light complementary color filters of yellow (Ye), cyan (Cy), magenta (Mg), and the like as color filters (optical filters) has been shown. However, the first embodiment of the present technology can also be applied to a case of using other color filters (optical filters). For example, the first embodiment of the present technology can also be applied to entire visible light region filters, such as a white (W) filter, a clear (C) filter, and the like, and color filters (optical filters) other than visible light, such as an infrared (Ir) filter and the like.

Here, it is assumed that effective pixel aperture ratios of a compound-eye imaging device are designed to be the similar for all optical filters. In this way, when an effective pixel aperture ratio of a compound-eye imaging device is the same for all optical filters, the MTF (spatial frequency characteristic) of an aperture effect of a pixel becomes the same in all the optical filters. Then, the degree of improvement in high-pass characteristics of the MTF caused by spatial pixel shift is restricted by these MTF characteristics that are all the same. Specifically, since a null point of the MTF caused by an aperture effect is the same in all optical filters, there is a risk that it will be difficult to improve a spatial frequency close to the null point.

Also, when an effective pixel aperture ratio of a compound-eye imaging device is the same in all optical filters, there is a risk that a saturated charge amount of an entire imaging element will be set by signal charge of pixels of an optical filter having the highest sensitivity. Accordingly, there is a risk that a dynamic range, which is an imaging element characteristic, will be narrow.

Therefore, in the first embodiment of the present technology, effective apertures of pixels in respective color filters are changed. In this way, it is possible to improve a resolution. Also, it is possible to widen a dynamic range, which is an imaging element characteristic.

2. Second Embodiment

A second embodiment of the present technology shows an example of performing spatial pixel shift by shifting the positions of optical axes of facets.

[Example of Performing Spatial Pixel Shift by Shifting Positions of Optical Axes of Facets]

FIG. 13 to FIG. 17 are diagrams simply showing image sensors of a compound-eye imaging device in accordance with the second embodiment of the present technology. In FIG. 13 to FIG. 17, each pixel is simply shown as a rectangle, and a facet lens is simply shown as a circle, like in FIG. 10 to FIG. 12. Also, in FIG. 13 to FIG. 17, examples of image sensors having a rectangular shape configured with a plurality of (3×3) facets are shown, like in FIG. 10 to FIG. 12.

[Example of Using Red Filters, Green Filters, and Blue Filters]

FIG. 13 to FIG. 17 show examples of using red filters, green filters, and blue filters. Also, FIG. 13 to FIG. 17 show examples in which the red filters, the green filters, and the blue filters are disposed like FIG. 10.

[Example of Shifting all Colors in Diagonal Direction (Same Direction) by Half Pixels]

Figure 13:
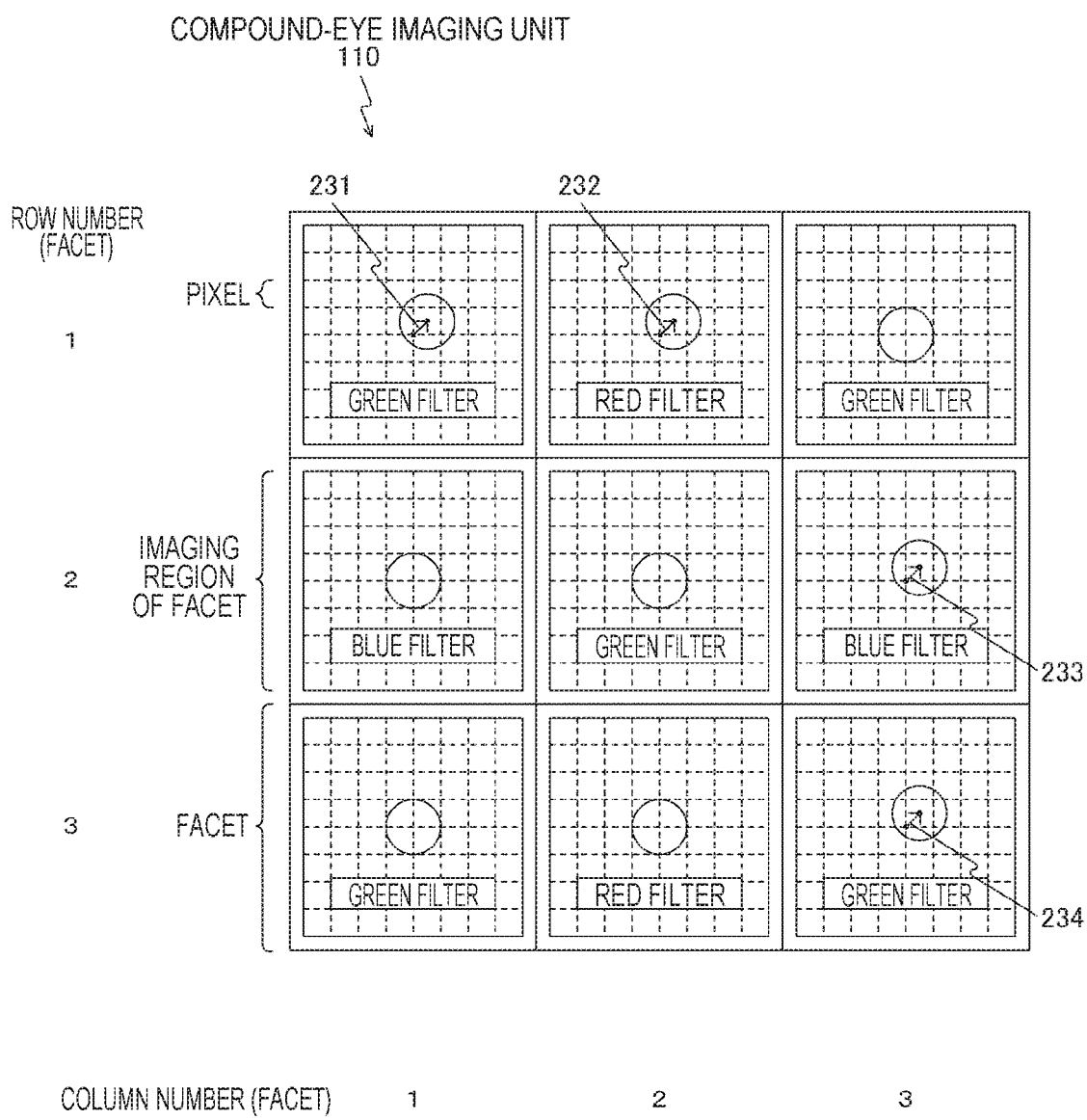
FIG. 13 is a diagram simply showing an image sensor of a compound-eye imaging device in accordance with a second embodiment of the present technology.

FIG. 13 shows an example of shifting color filters of all colors in a diagonal direction (the same direction) by half pixels.

Also, FIG. 13 shows an example of a case in which color filters of each color are on-chip in the image sensor or a case in which color filters of each color are adjacent to the image sensor. Also, FIG. 13 shows an example of a case in which color filters of each color are adjacent to facet lenses or diaphragms.

For example, optical axes of facets of a part of color filters are shifted in a diagonal direction by half pixels. In this case, the shift direction is the same direction for respective colors. For example, FIG. 13 shows an example of shifting optical axes of four facets in a direction indicated by arrows 231 to 234.

[Example of Shifting all Colors in Diagonal Directions (Different Directions) by Half Pixels]

Figure 14:
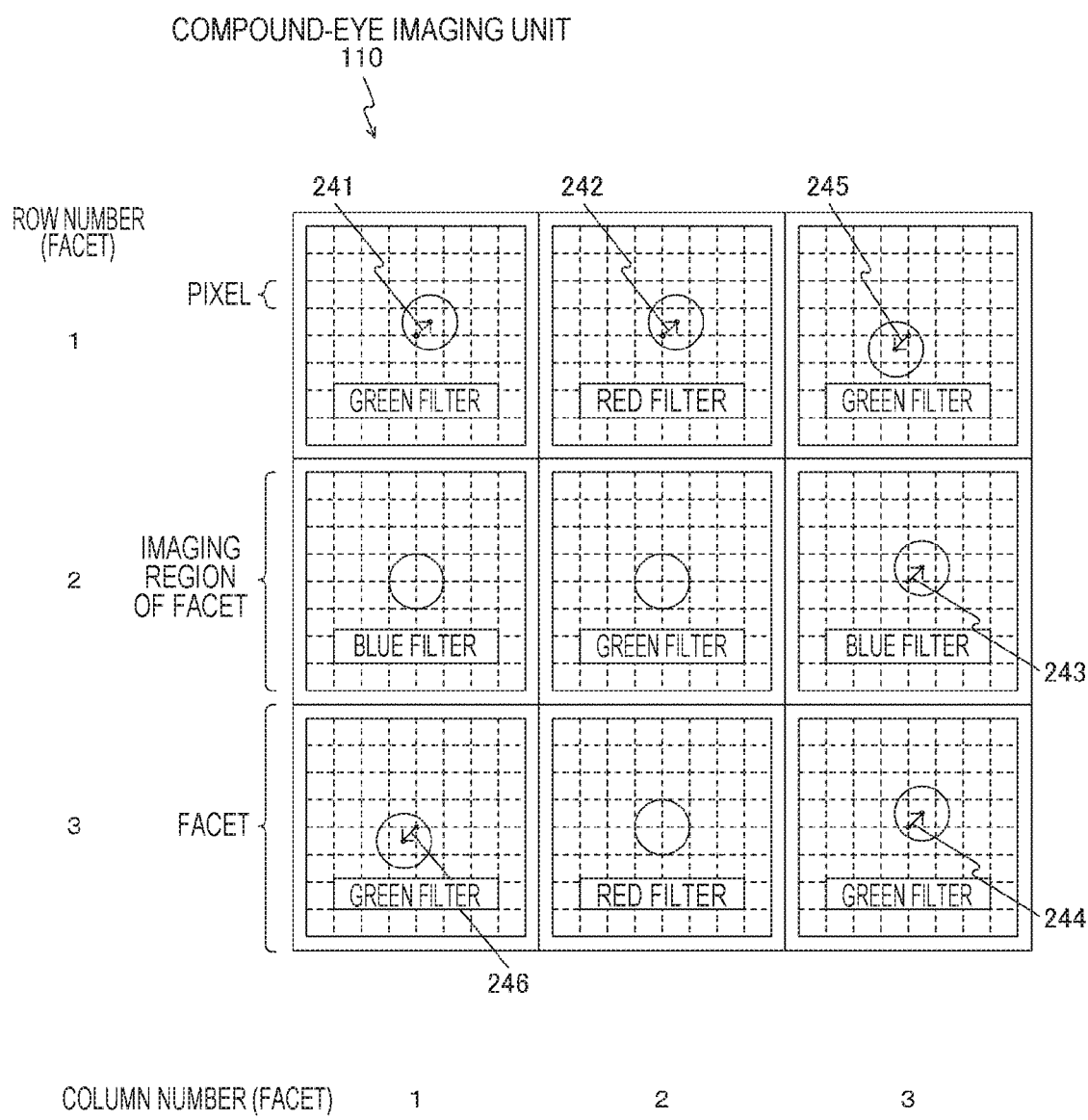
FIG. 14 is a diagram simply showing an image sensor of a compound-eye imaging device in accordance with a second embodiment of the present technology.

FIG. 14 shows an example of shifting color filters of all colors in diagonal directions (different directions) by half pixels.

Also, FIG. 14 shows an example of a case in which color filters of each color are on-chip in the image sensor or a case in which color filters of each color are adjacent to the image sensor. Also, FIG. 14 shows an example of a case in which color filters of each color are adjacent to facet lenses or diaphragms.

For example, optical axes of facets of a part of color filters are shifted in a diagonal direction by half pixels. In this case, optical axes of facets of green filters are shifted in opposite directions, and optical axes of facets of a red filter and a blue filter are shifted in the same direction. For example, in FIG. 14, optical axes of facets of a part of the green filters, the red filter, and the blue filter are shifted in a direction (the same direction) indicated by arrows 241 to 244. Also, in FIG. 14, optical axes of facets of a part of the green filters are shifted in a direction (opposite direction) indicated by arrows 245 and 246.

[Example of Shifting all Colors in Diagonal Direction (Same Direction)]

Figure 15:
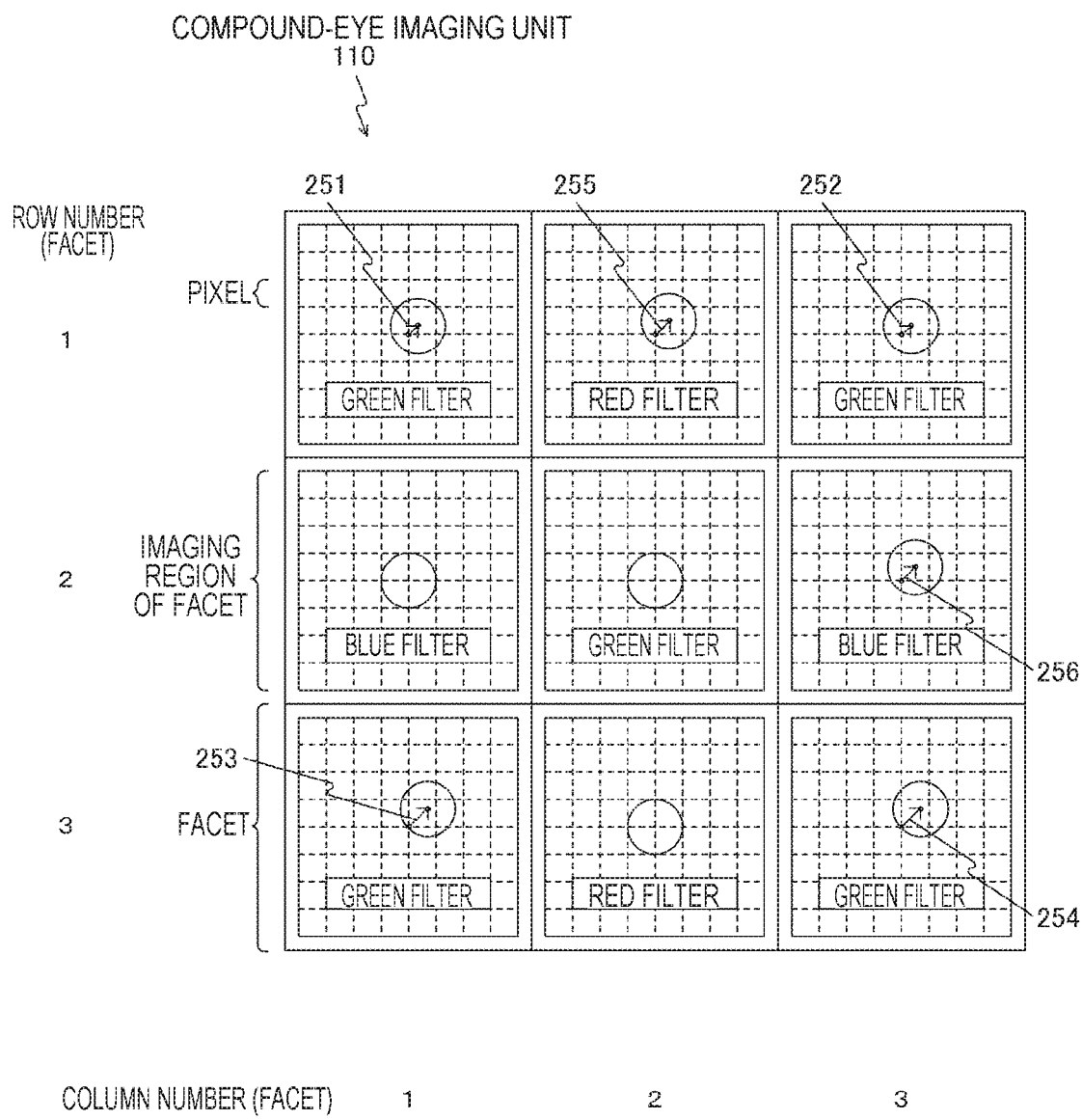
FIG. 15 is a diagram simply showing an image sensor of a compound-eye imaging device in accordance with a second embodiment of the present technology.

FIG. 15 shows an example of shifting color filters of all colors in a diagonal direction (the same direction).

Also, FIG. 15 shows an example of a case in which color filters of each color are on-chip in the image sensor or a case in which color filters of each color are adjacent to the image sensor. Also, FIG. 15 shows an example of a case in which color filters of each color are adjacent to facet lenses or diaphragms.

For example, optical axes of facets of a part of color filters are shifted in a diagonal direction by half pixels. Also, optical axes of facets of a part of the color filters are shifted in a diagonal direction by ⅓ pixels or ⅔ pixels. For example, optical axes of facets of green filters are shifted in a diagonal direction by ⅓ pixels and ⅔ pixels, and optical axes of facets of a red filter and a blue filter are shifted in the diagonal direction by half pixels. For example, in FIG. 15, optical axes of facets of a part of the green filters are shifted by ⅓ pixels in a direction indicated by arrows 251 and 252. Also, optical axes of facets of a part of the green filters are shifted by ⅔ pixels in a direction indicated by arrows 253 and 254. Also, optical axes of facets of the red filter and the blue filter are shifted by half pixels in a direction indicated by arrows 255 and 256.

[Example of Shifting all Colors in Diagonal Direction (Same Direction)]

Figure 16:
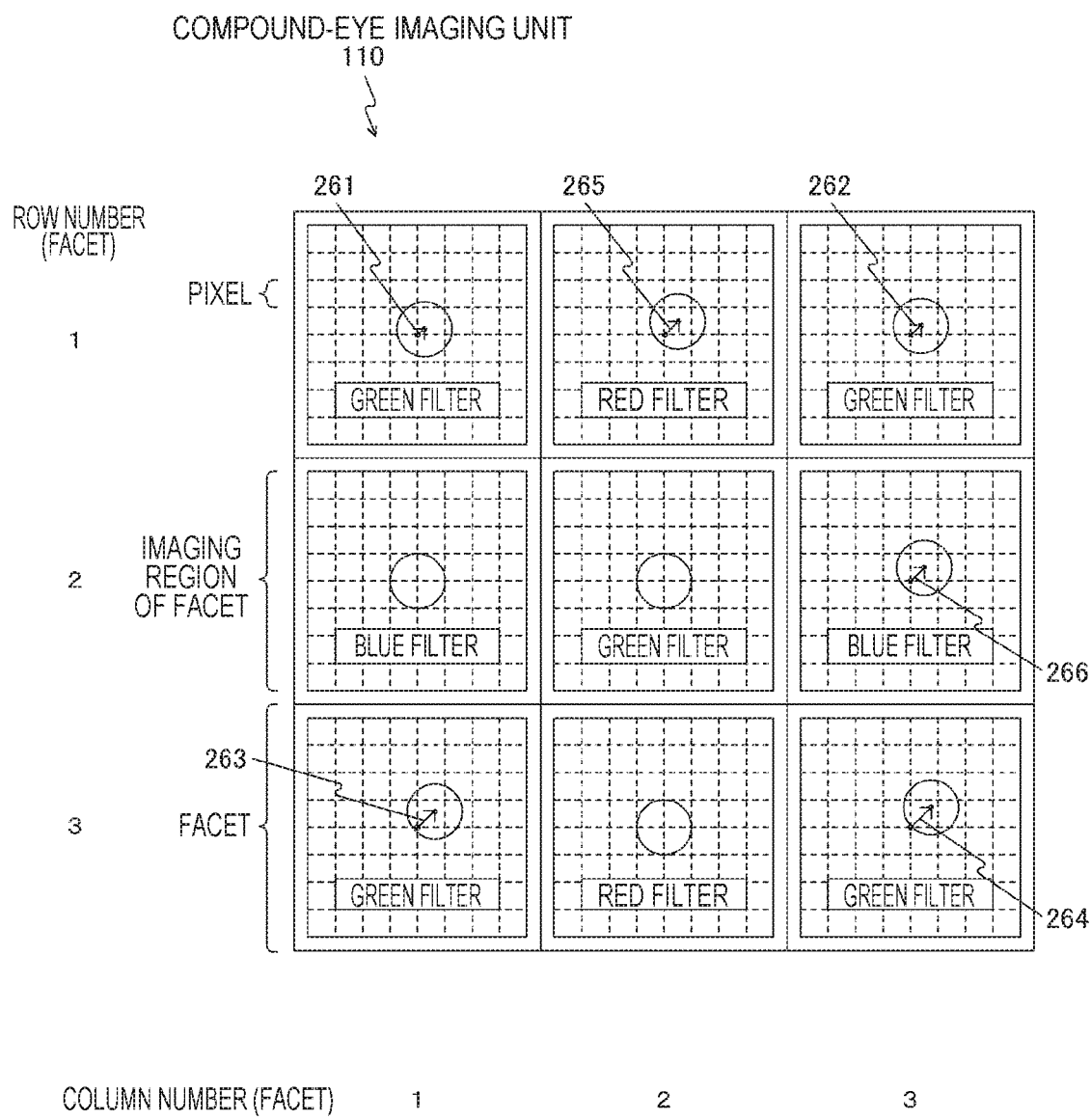
FIG. 16 is a diagram simply showing an image sensor of a compound-eye imaging device in accordance with a second embodiment of the present technology.

FIG. 16 shows an example of shifting color filters of all colors in a diagonal direction (the same direction).

Also, FIG. 16 shows an example of a case in which color filters of each color are on-chip in the image sensor or a case in which color filters of each color are adjacent to the image sensor. Also, FIG. 16 shows an example of a case in which color filters of each color are adjacent to facet lenses or diaphragms.

For example, optical axes of facets of a part of color filters are shifted in a diagonal direction by half pixels. Also, optical axes of facets of a part of the color filters are shifted in the diagonal direction by ⅕ pixels, ⅖ pixels, ⅗ pixels, and ⅘ pixels. For example, optical axes of facets of green filters are shifted in the diagonal direction by ⅕ pixels, ⅖ pixels, ⅗ pixels, and ⅘ pixels, and optical axes of facets of a red filter and a blue filter are shifted in the diagonal direction by half pixels. For example, in FIG. 16, an optical axis of a facet of a part of the green filters is shifted by ⅕ pixels in a direction indicated by an arrow 261. Also, an optical axis of a facet of a part of the green filters is shifted by ⅖ pixels in a direction indicated by an arrow 262. Also, an optical axis of a facet of a part of the green filters is shifted by ⅗ pixels in a direction indicated by an arrow 263. Also, an optical axis of a facet of a part of the green filters is shifted by ⅘ pixels in a direction indicated by an arrow 264. Also, optical axes of facets of the red filter and the blue filter are shifted by half pixels in a diagonal direction indicated by arrows 265 and 266.

[Example of Shifting all Colors in Respective Directions]

Figure 17:
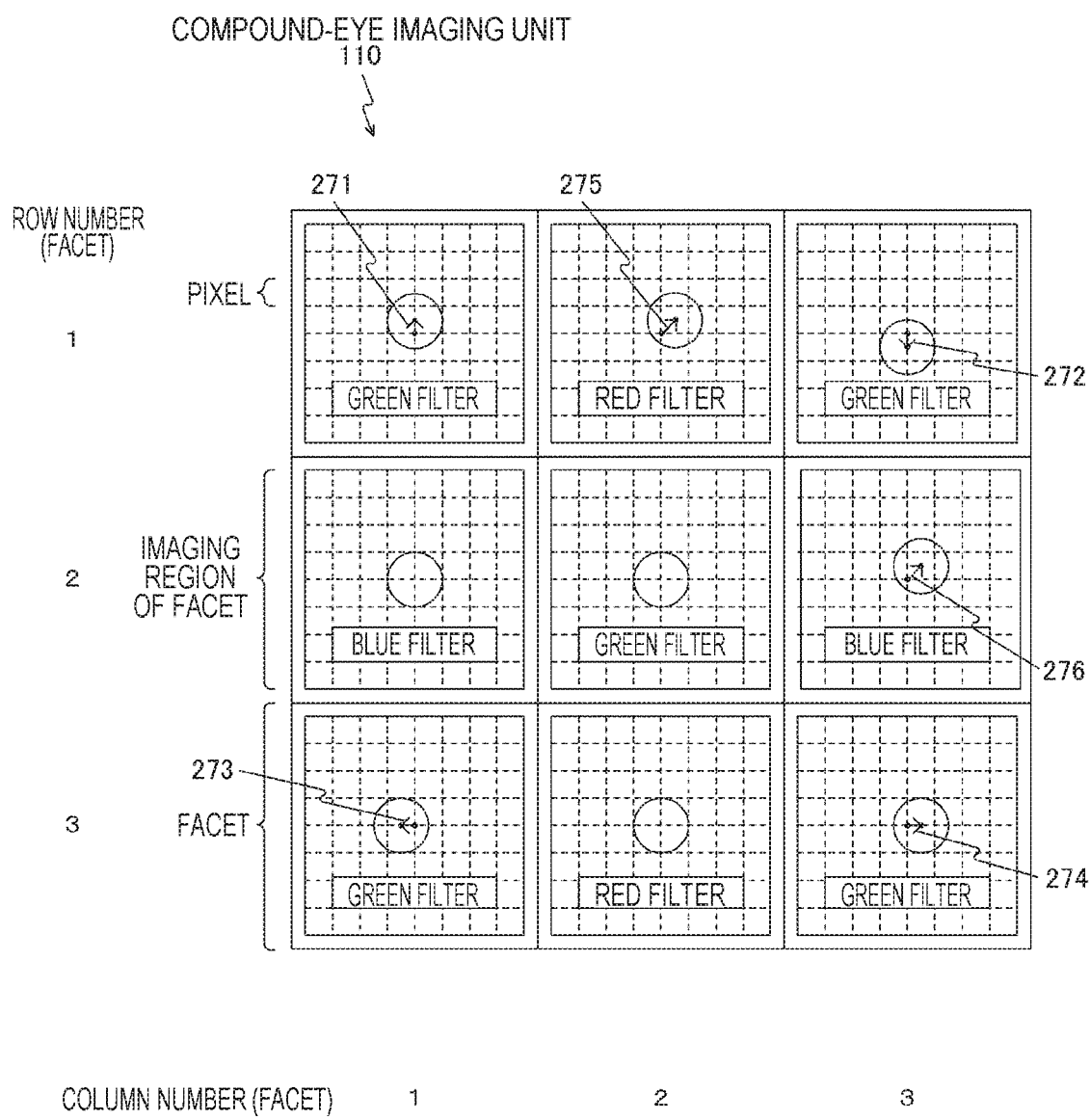
FIG. 17 is a diagram simply showing an image sensor of a compound-eye imaging device in accordance with a second embodiment of the present technology.

FIG. 17 shows an example of shifting color filters of all colors in horizontal directions, vertical directions, and a diagonal direction by half pixels.

Also, FIG. 17 shows an example of a case in which color filters of each color are on-chip in the image sensor or a case in which color filters of each color are adjacent to the image sensor. Also, FIG. 17 shows an example of a case in which color filters of each color are adjacent to facet lenses or diaphragms.

For example, optical axes of facets of a part of green filters are shifted by half pixels in opposite vertical directions, optical axes of facets of a part of the green filters are shifted by half pixels in opposite horizontal directions, and optical axes of facets of a red filter and a blue filter are shifted by half pixels in a diagonal direction. For example, in FIG. 17, an optical axis of a facet of a part of green filters is shifted by half pixels in a direction (a vertical direction) indicated by an arrow 271. Also, an optical axis of a facet of a part of the green filters is shifted by half pixels in a direction (an opposite direction to the direction indicated by the arrow 271) indicated by an arrow 272. Also, an optical axis of a facet of a part of the green filters is shifted by half pixels in a direction (a horizontal direction) indicated by an arrow 273. Also, an optical axis of a facet of a part of the green filters is shifted by half pixels in a direction (an opposite direction to the direction indicated by the arrow 273) indicated by an arrow 274. Also, optical axes of facets of a red filter and a blue filter are shifted by half pixels in a direction indicated by arrows 275 and 276.

In this way, in the second embodiment of the present technology, spatial pixel shift is performed by shifting the positions of optical axes of facets. Accordingly, it is possible to improve a resolution.

3. Third Embodiment

A third embodiment of the present technology shows an example of correcting the chromatic aberration of magnification of a facet lens through signal processing.

[Example of Correcting Chromatic Aberration of Magnification Through Signal Processing]

First, a method of correcting chromatic aberration of magnification through signal processing will be described.

Figure 18:
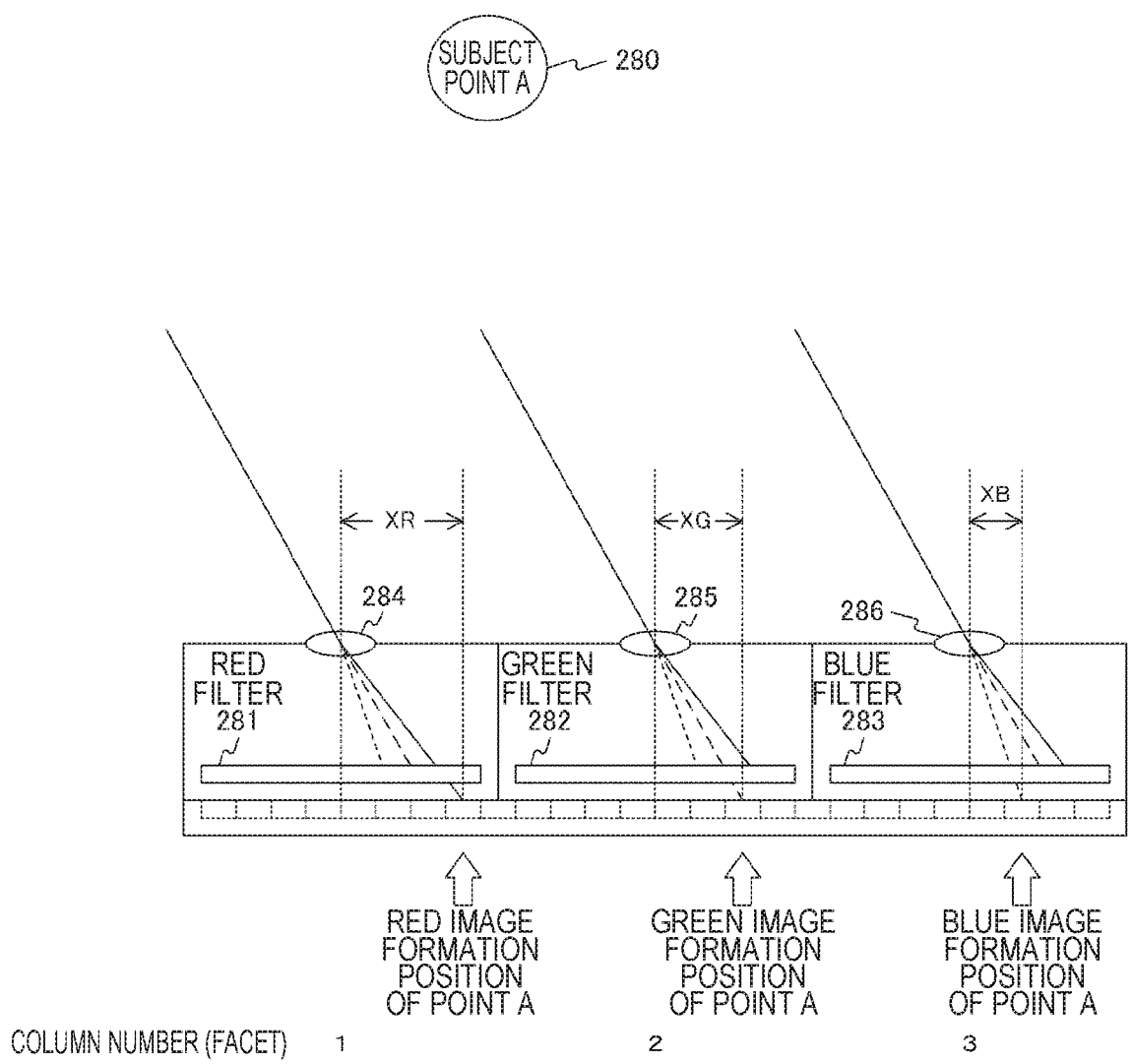
FIG. 18 is a diagram showing a cross section of a compound-eye imaging unit 110 in accordance with a third embodiment of the present technology.

FIG. 18 is a diagram showing a cross section of a compound-eye imaging unit 110 in accordance with the third embodiment of the present technology. FIG. 18 simply shows relationships among facet lenses, color filters, and an image sensor.

Here, magnification of each color on an imaging surface caused by the chromatic aberration of magnification of facet lenses 284 to 286 is defined as follows.

NR: red image surface magnification
NG: green image surface magnification
NB: blue image surface magnification In FIG. 18, an image formation position of point A (280) of a subject in a facet of a red filter 281 is XR. Also, an image formation position of point A (280) of the subject in a facet of a green filter 282 is XG. Also, an image formation position of point A (280) of the subject in a facet of a blue filter 283 is XB.

As shown in FIG. 18, the image formation positions XR, XG and XB are positions that are all different due to the chromatic aberration of magnification of the facet lenses 284 to 286.

Here, since the chromatic aberration of magnification of the facet lenses 284 to 286 can be found in advance by designed values or measured values, NR, NG, NB are already known. Therefore, as shown in the following formulae, the image formation positions XR and XB can be corrected.

$$X'R=(NG/NR)XR$$

$$X'B=(NG/NB)XB$$

The signal processing unit 120 can suppress or remove the chromatic aberration of magnification by performing correction through signal processing employing the formulae mentioned above. In other words, the signal processing unit 120 corrects a blur of an image which occurs in accordance with a color in a peripheral portion on a focal surface resulting from the chromatic aberration of magnification of the facet lenses.

For example, a case in which a facet lens is designed so that chromatic aberration characteristics of the facet lens are improved like reduced chromatic aberration, such as the chromatic aberration of magnification, axial chromatic aberration, and the like of the facet lens is assumed. In this case, the structure of the facet lens is complicated, and the cost of the facet lens is high.

Therefore, in the third embodiment of the present technology, a facet lens is designed and configured so that an image shifted due to a color in a peripheral portion on a focal surface resulting from the chromatic aberration of magnification of a facet lens is left as it is, and the shift of the image caused by a difference in color is corrected through signal processing. Accordingly, the structure of the facet lens can be simplified, and the cost of the facet lens can be reduced.

4. Fourth Embodiment

A fourth embodiment of the present technology shows an example of optically designing facets in accordance with a difference in focal length caused by the axial chromatic aberration of facet lenses.

[Example of Optical Design of Facet]

Figure 19:
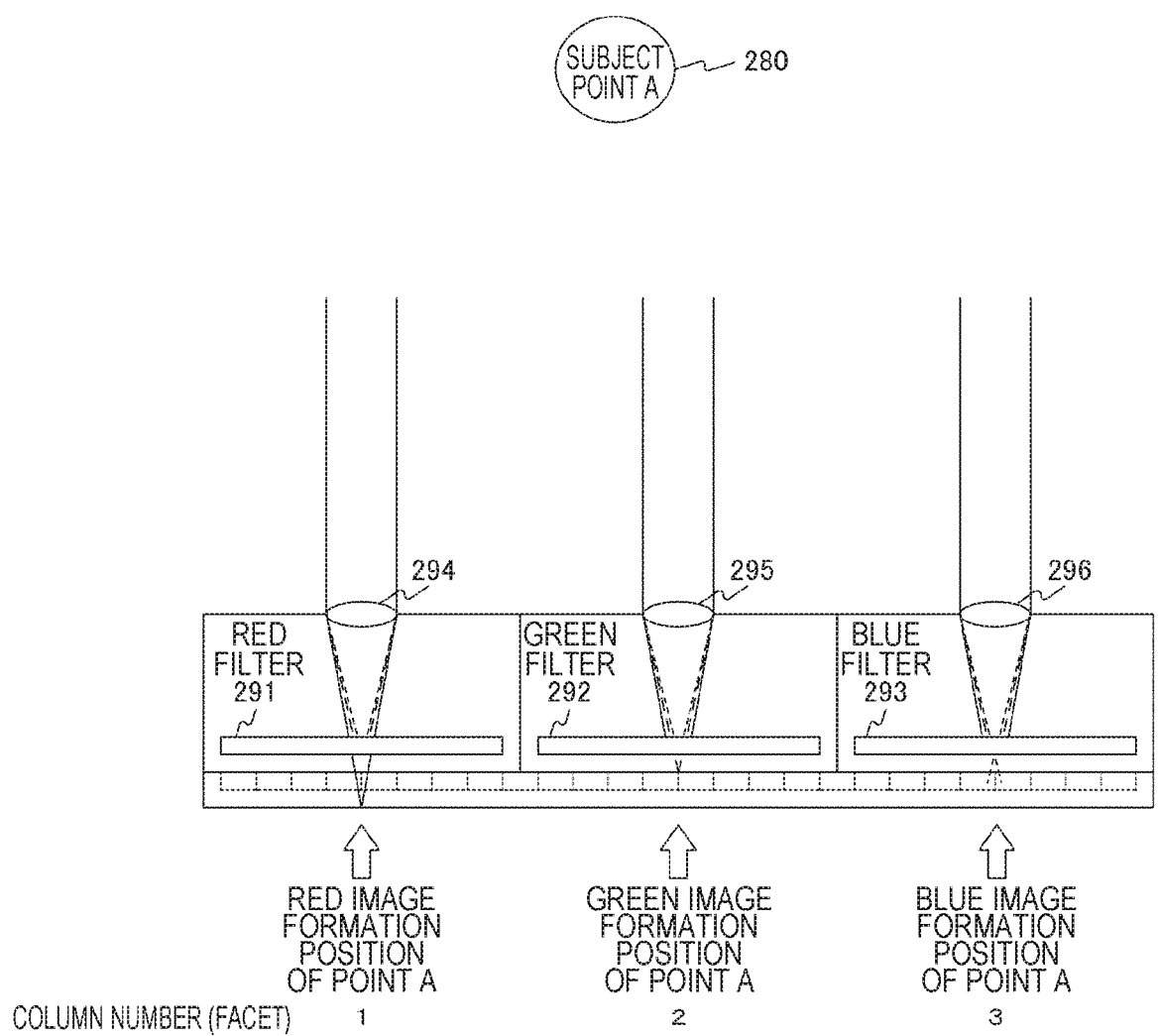
FIG. 19 is a diagram showing a cross section of a compound-eye imaging unit 110 in accordance with a fourth embodiment of the present technology.
Figure 20:
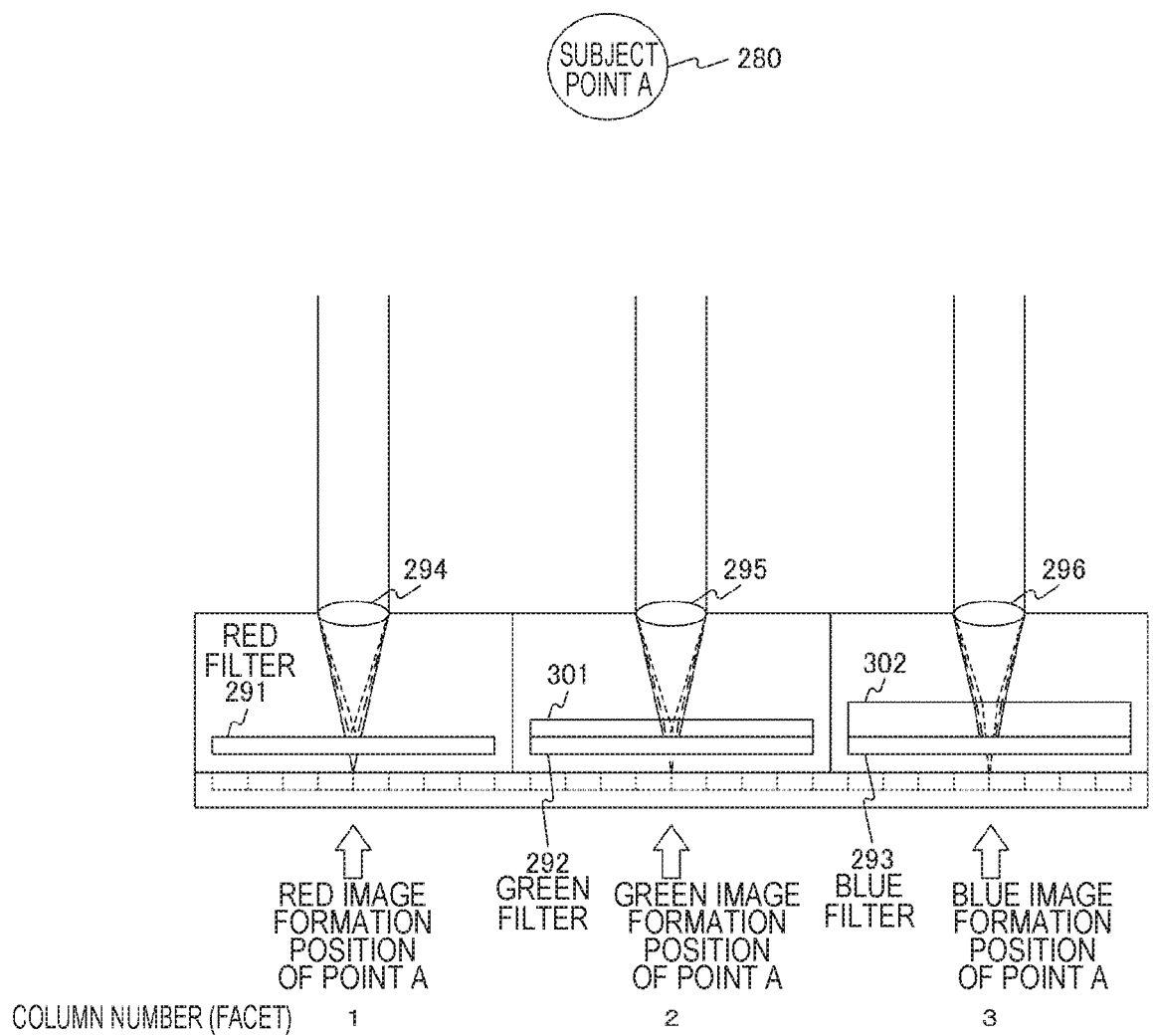
FIG. 20 is a diagram showing a cross section of a compound-eye imaging unit 110 in accordance with a fourth embodiment of the present technology.
Figure 21:
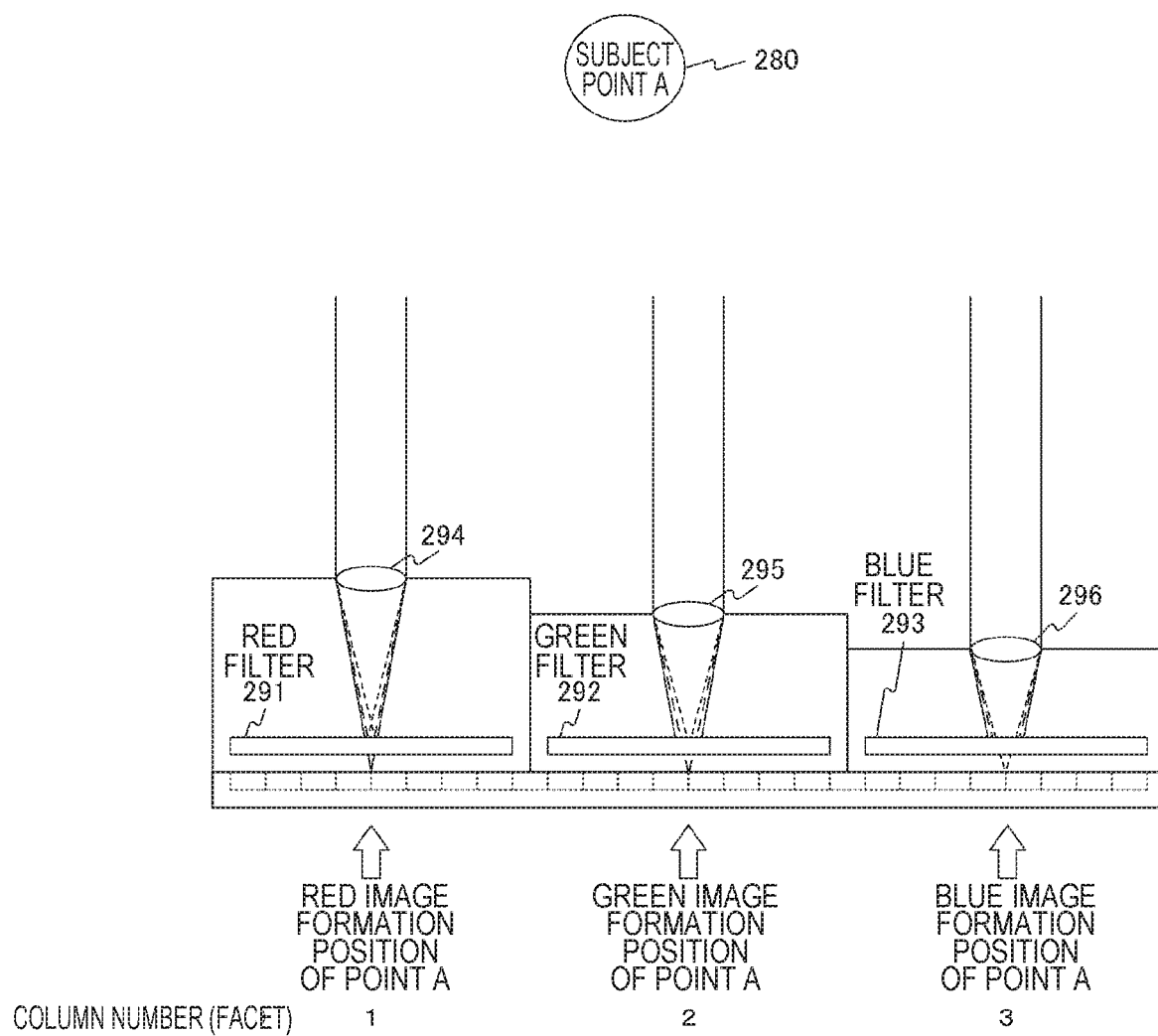
FIG. 21 is a diagram showing a cross section of a compound-eye imaging unit 110 in accordance with a fourth embodiment of the present technology.

FIG. 19 to FIG. 21 are diagrams showing cross sections of a compound-eye imaging unit 110 in accordance with the fourth embodiment of the present technology. FIG. 19 to FIG. 21 simply show relationships among facet lenses, color filters, and an image sensor. In FIG. 19 to FIG. 21, pixels constituting an image sensor are indicated by rectangles of dotted lines.

FIG. 19 shows relationships between facet lenses 294 to 296 and an image sensor when there is axial chromatic aberration in facet lenses but the axial chromatic aberration is not corrected.

As shown in FIG. 19, due to the axial chromatic aberration of the facet lenses 294 to 296, a focal length varies in accordance with color (in other words, the wavelength of light). For this reason, in the compound-eye imaging device shown in FIG. 19, it is not possible to simultaneously focus all colors. Therefore, examples of optical designs capable of simultaneously focusing all colors are shown in FIG. 20 and FIG. 21.

FIG. 20 shows an example in which materials 301 and 302 changing an optical path length are installed between the facet lenses 294 to 296 and an image sensor.

For example, the materials 301 and 302 which change an optical path length are inserted between the facet lenses 294 to 296 and the image sensor with different thicknesses for respective colors. Accordingly, it is possible to improve the axial chromatic aberration of the facet lenses 294 to 296 with regard to the overall compound-eye imaging device without much correcting the axial chromatic aberration with regard to individual facet lenses. For example, the thickness of the material 302 installed in a facet of the blue filter 293 is made larger than the thickness of the material 301 installed in a facet of the green filter 292.

FIG. 21 shows an example of changing the distances between the facet lenses 294 to 296 and an image sensor.

For example, the distances between the facet lenses 294 to 296 and the image sensor are changed for respective colors. For example, the distance between the facet lens 295 in a facet of the green filter 292 and the image sensor is made shorter than the distance between the facet lens 294 in a facet of a red filter 291 and the image sensor. Also, for example, the distance between the facet lens 296 in a facet of the blue filter 293 and the image sensor is made shorter than the distance between the facet lens 295 in the facet of the green filter 292 and the image sensor.

Accordingly, it is possible to improve the axial chromatic aberration of facet lenses with regard to the overall compound-eye imaging device without much correcting the axial chromatic aberration with regard to individual facet lenses.

Here, facet lenses of an ordinary single-eye imaging device are manufactured so that chromatic aberration of magnification and axial chromatic aberration are reduced as much as possible. For this reason, it is necessary to bond two facet lenses of, for example, crown glass and flint glass as materials of a facet lens together and configure the two facet lenses as one facet lens, and to increase the number of facet lenses. For this reason, the cost of a facet lens is high, and the overall facet lens is thick.

In contrast, a compound-eye imaging device in accordance with the third embodiment of the present technology does not excessively correct the chromatic aberration of magnification and the axial chromatic aberration of facet lenses and can correct the chromatic aberration of magnification through signal processing. Also, in a compound-eye imaging device in accordance with the fourth embodiment of the present technology, a facet can be optically designed in accordance with axial chromatic aberration. Accordingly, the cost of a facet lens can be reduced, and the thickness of the facet lens can be reduced.

5. Fifth Embodiment

A fifth embodiment of the present technology shows an example of configuring one facet with a plurality of sub-facets.

[Configuration Example of Compound-Eye Imaging Unit in which One Facet Includes Plurality of Sub-Facets]

Figure 22:
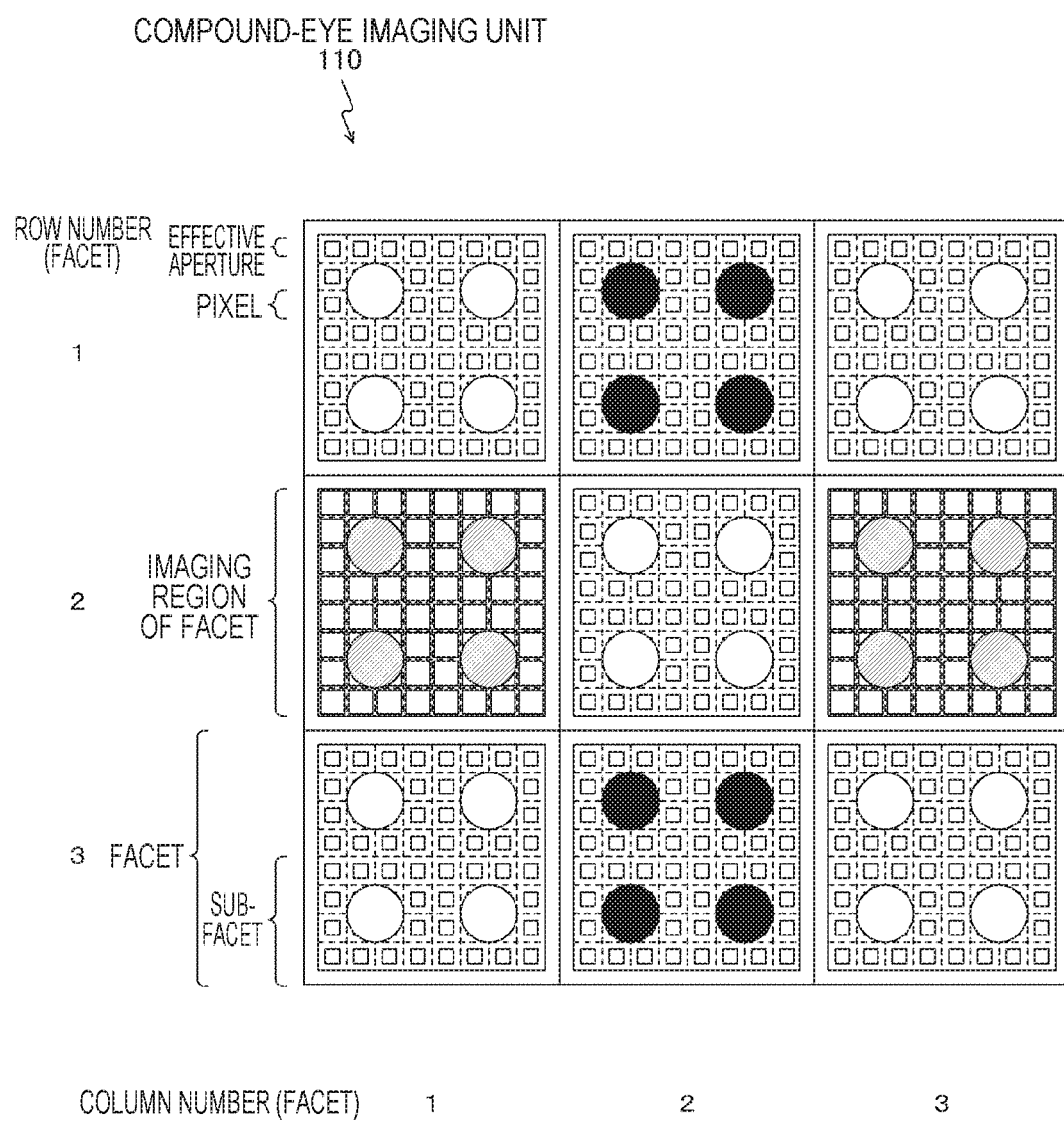
FIG. 22 is a diagram showing a configuration example of a compound-eye imaging unit 110 in accordance with a fifth embodiment of the present technology.
Figure 23:
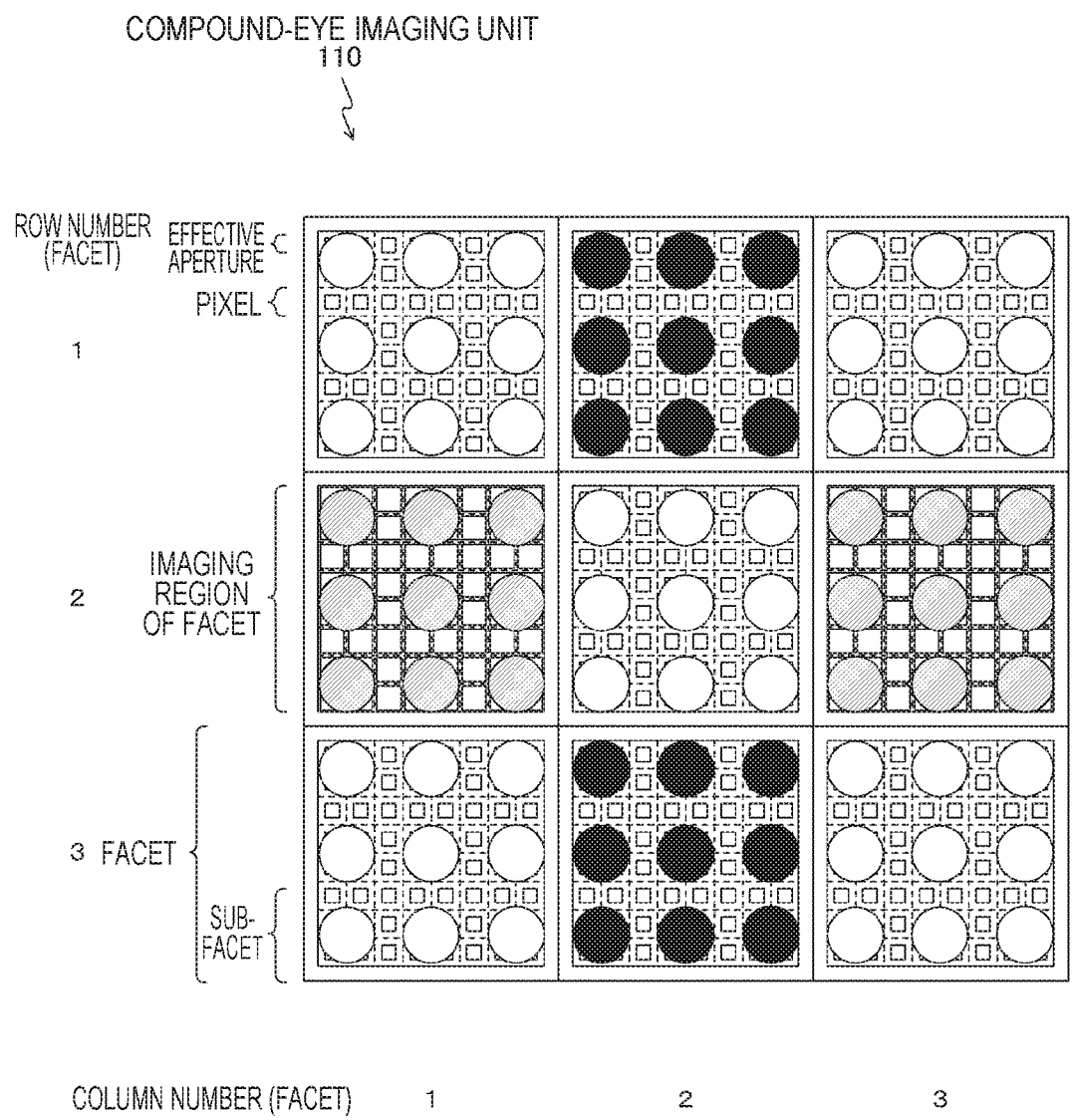
FIG. 23 is a diagram showing a configuration example of a compound-eye imaging unit 110 in accordance with a fifth embodiment of the present technology.
Figure 24:
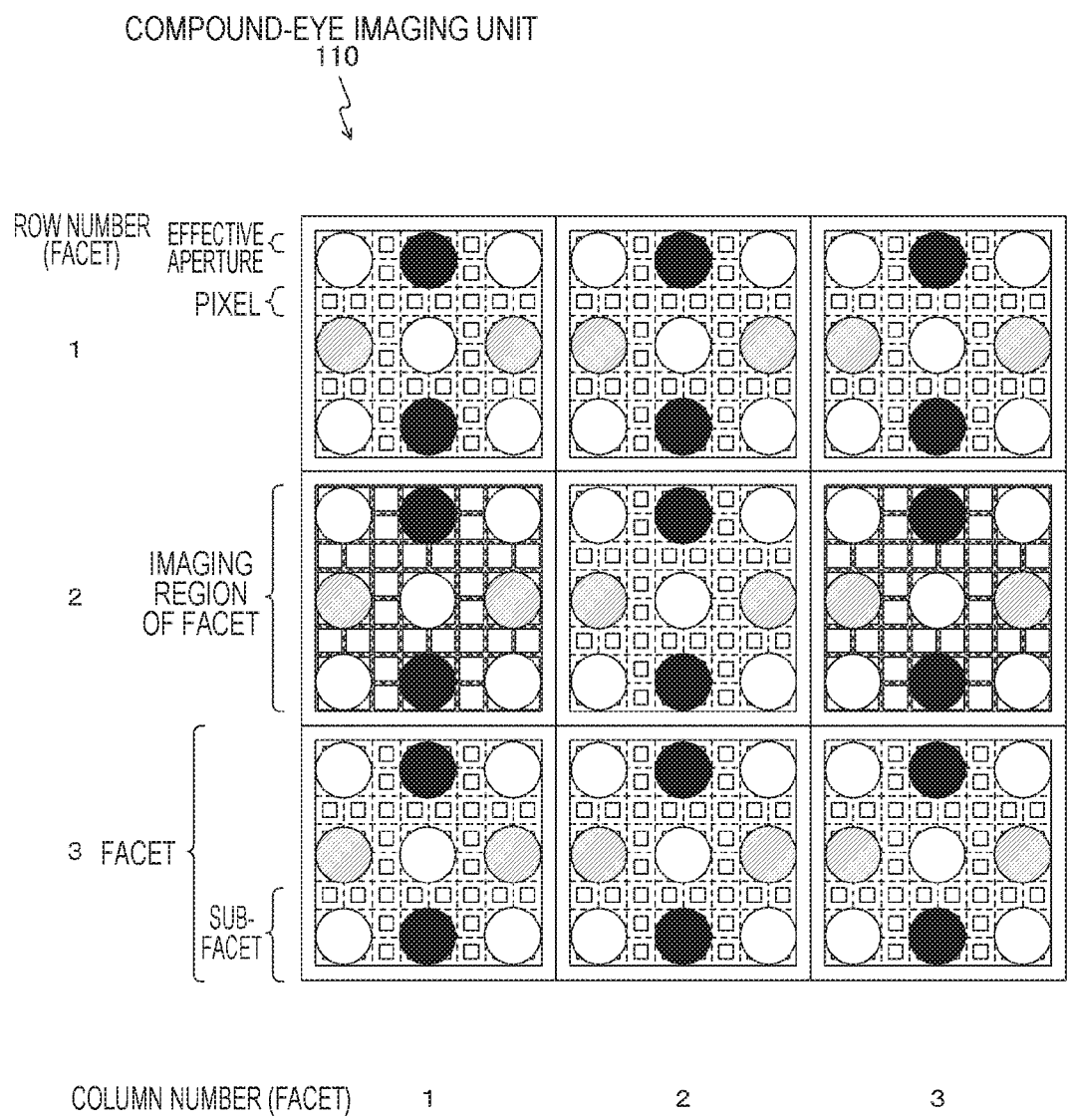
FIG. 24 is a diagram showing a configuration example of a compound-eye imaging unit 110 in accordance with a fifth embodiment of the present technology.

FIG. 22 to FIG. 24 are diagrams showing configuration examples of a compound-eye imaging unit 110 in accordance with the fifth embodiment of the present technology. Also, FIG. 22 to FIG. 24 show examples of a case in which a color filter of each color is adjacent to facet lenses or diaphragms.

FIG. 22 shows an example of configuring one facet with four sub-facets. In FIG. 22 to FIG. 24, types of color filters are represented by forms of facet lenses. Specifically, facet lenses disposed in a facet of a green filter are indicated by circles colored white, facet lenses disposed in a facet of a red filter are indicated by circles colored black, and facet lenses disposed in a facet of a blue filter are indicated by circles in which diagonal lines are added.

As shown in FIG. 22, each facet is configured with four sub-facets. The disposition of color filters is the same as the example shown in FIG. 10 and the like. Also, a sub-facet is, for example, a unit configured with one facet lens and an image sensor.

FIG. 23 shows an example of configuring one facet with nine sub-facets. The disposition of color filters is the same as the example shown in FIG. 22. Also, the example of FIG. 23 is almost the same as the example shown in FIG. 22 besides the fact that one sub-facet is configured with one facet lens and an image sensor.

FIG. 24 shows an example of configuring one facet with nine sub-facets and changing color filters in each facet. In this way, it is possible to change color filters of sub-facets in one facet. In this case, the disposition of color filters in a facet can be made the same as the overall disposition of the compound-eye imaging unit 110 shown in FIG. 22.

Also, even in the case of configuring one facet with four or another number (for example, 16) of sub-facets, color filters in each facet may be changed.

[Example of Image Processing when Facet is Configured with Sub-Facets]

Here, as described above, an example of an image processing method for a case in which a facet is configured with sub-facets will be described.

As described above, it is possible to configure a facet not with one facet lens but with a plurality of facet lenses (in other words, with sub-facets). In particular, by making the angle of view of sub-facets smaller than the angle of view intended to be realized with a whole facet, it is possible to reduce the load of designing and manufacturing optical systems of sub-facets.

Figure 25:
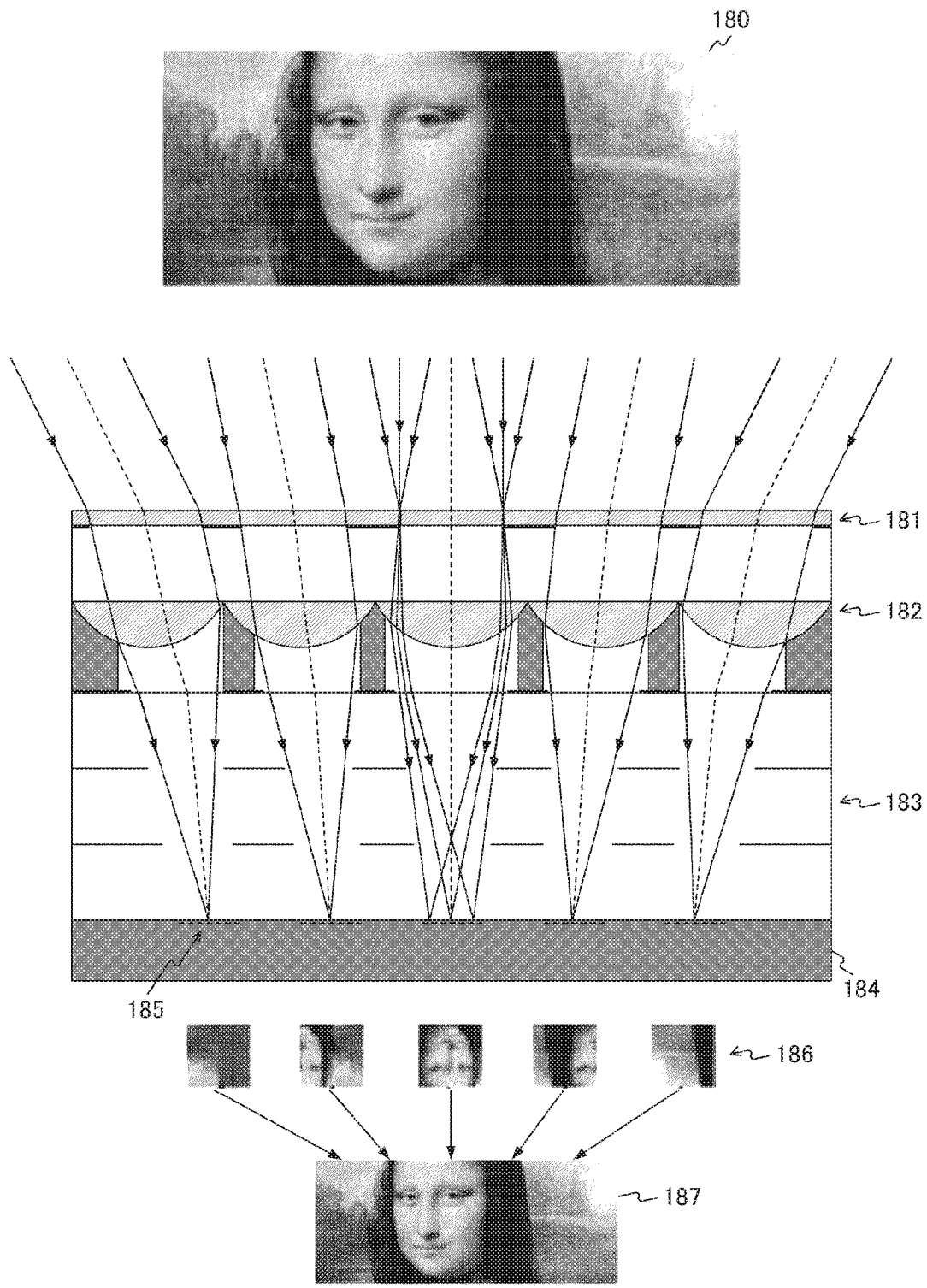
FIG. 25 is a diagram schematically showing an example of image processing by a compound-eye imaging device in accordance with a fifth embodiment of the present technology.

FIG. 25 is a diagram schematically showing an example of image processing by a compound-eye imaging device in accordance with the fifth embodiment of the present technology. Specifically, FIG. 25 shows an example of image processing according to Fraunhofer. In other words, an example of image processing of narrowing the angle of view of facets, shifting an imaging region of each facet to take an image, and joining raw data obtained from these facets together to obtain an output image is shown.

A stitching process according to Fraunhofer is not the concept of sub-facets but a process of varying imaging regions of all facets little by little.

The compound-eye imaging device shown in FIG. 25 includes an opening unit 181, a microlens array 182, a light shielding unit 183, an image sensor 184, and an imaging region 185. Light from a subject 180 is incident on the imaging region 185. In this was, the light incident on the imaging region 185 is photoelectrically converted, and image signals (image data) 186 are generated. By joining these image signals (image data) 186 together, it is possible to obtain an output image 187.

In contrast, as described above, when sub-facets are installed, it is possible to apply the optical system of a facet composed of sub-facets to other facets by using the facet as one unit. In other words, there are a plurality of sub-facets which have the same (or approximately the same) imaging region in one compound-eye imaging device. In this sub-facet structure, an optical system can be repeated in units of facets, and thus design and manufacturing of an optical system of a compound-eye imaging device are facilitated.

Also, as described above, an image processing method for a case in which a facet is configured with sub-facets can be basically the same as image processing according to Fraunhofer. In other words, as shown in FIG. 25, image processing is performed so that outputs of respective adjacent sub-facets are joined with regard to pixels which are the same output of the adjacent sub-facets. By performing image processing in this way, it is possible to make an output image from the compound-eye imaging device after the signal processing into one image having a wide imaging region like a subject.

For this reason, for example, even when the angle of view is widened, it is possible to reduce the load of designing and manufacturing the structure of optical systems of facets, and to reduce the cost.

6. Sixth Embodiment

A sixth embodiment of the present technology shows an example of configuring at least one of a plurality of facet lenses to have a different optical characteristic and structure.

[Configuration Example in which at Least One of Plurality of Facet Lenses has Different Optical Characteristic and Structure]

FIG. 26 to FIG. 29 are diagrams showing configuration examples of a compound-eye imaging unit 110 in accordance with the sixth embodiment of the present technology.

Figure 26:
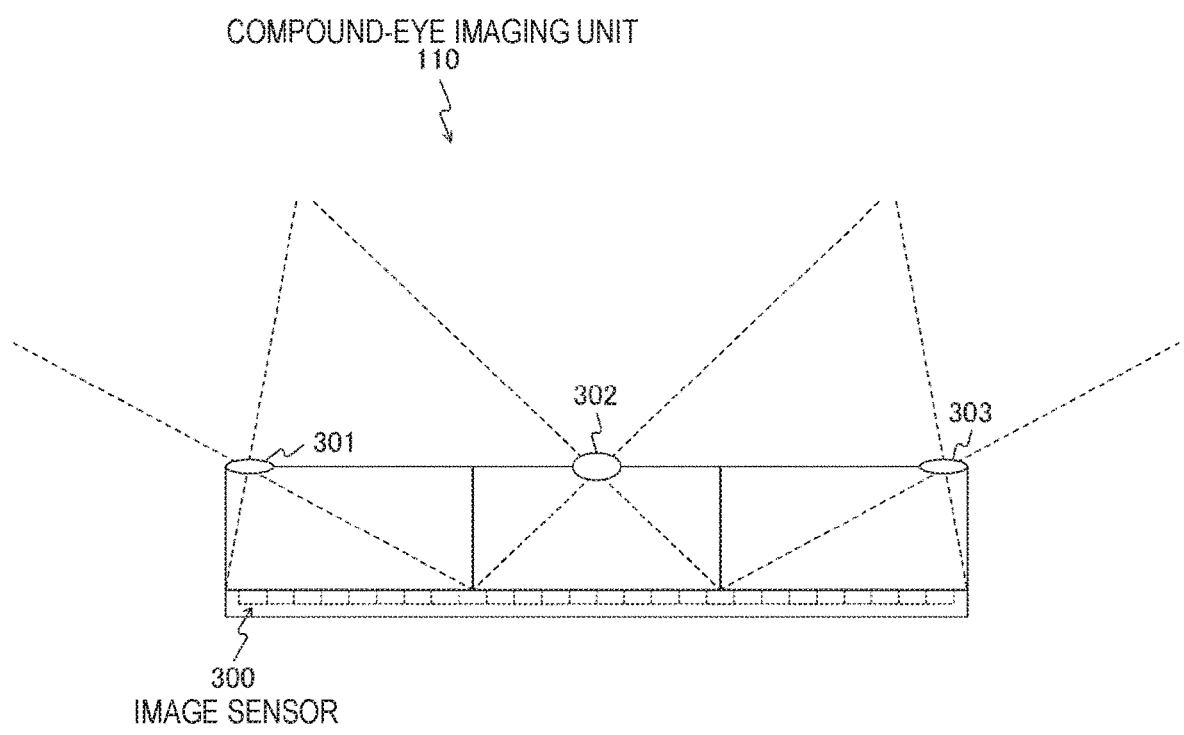
FIG. 26 is a diagram showing a configuration example of a compound-eye imaging unit 110 in accordance with a sixth embodiment of the present technology.

FIG. 26 shows an example of configuring an optical characteristic of facets disposed in a peripheral portion of an image sensor 300 of the compound-eye imaging unit 110 and an optical characteristic of a central portion facet differently.

Specifically, for the central portion facet, an optimal design in which an incident angle of a main light beam of a facet lens 302 is set to 0 degrees (or about 0 degrees) is made. On the other hand, for the facets disposed in the peripheral portion of an image sensor 300, an optimal design in which incident angles of main light beams of facet lenses 301 and 303 are set to angles other than 0 degrees (or angles different from the incident angle of the first facet optical system) is made.

In this way, FIG. 26 shows an example of the compound-eye imaging unit 110 having a multi lens array (MLA) in which facet optical systems employing different optimal designs are mixed.

Figure 27:
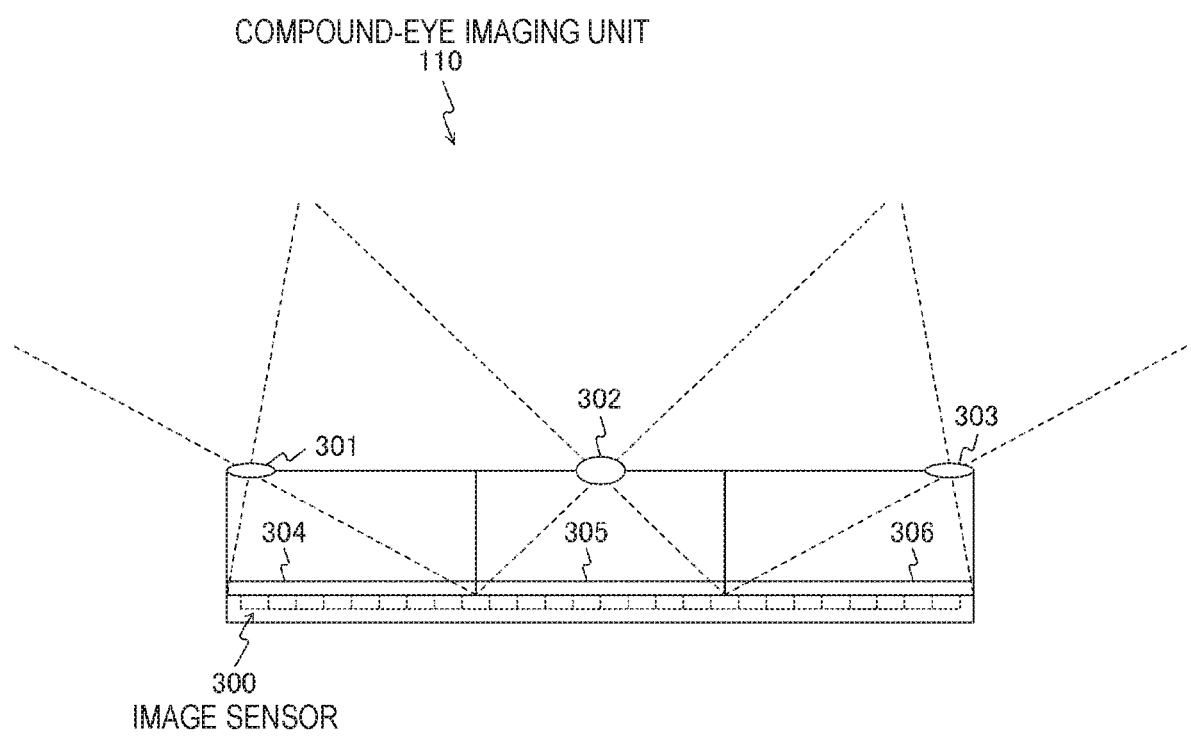
FIG. 27 is a diagram showing a configuration example of a compound-eye imaging unit 110 in accordance with a sixth embodiment of the present technology.

FIG. 27 shows an example of configuring an optical characteristic of facets disposed in a peripheral portion of an image sensor 300 of the compound-eye imaging unit 110 and an optical characteristic of a central portion facet differently.

Specifically, like FIG. 26, an optimal design in which an incident angle of a main light beam of the facet lens 302 is set to 0 degrees is made for the central portion facet. On the other hand, for the facets disposed in the peripheral portion of the image sensor 300, an optimal design in which incident angles of main light beams of the facet lenses 301 and 303 are set to angles other than 0 degrees is made. Further, in FIG. 27, an optical characteristic of a multi lens array is optimized for a color characteristic of each facet.

In this way, FIG. 27 shows an example of the compound-eye imaging unit 110 having a multi lens array (MLA) in which facet optical systems employing different optimal designs are mixed.

Also, FIG. 27 shows an example of a case in which color filters 304 to 306 of each color are on-chip in the image sensor 300 or a case in which color filters 304 to 306 of each color are adjacent to the image sensor 300.

Figure 28:
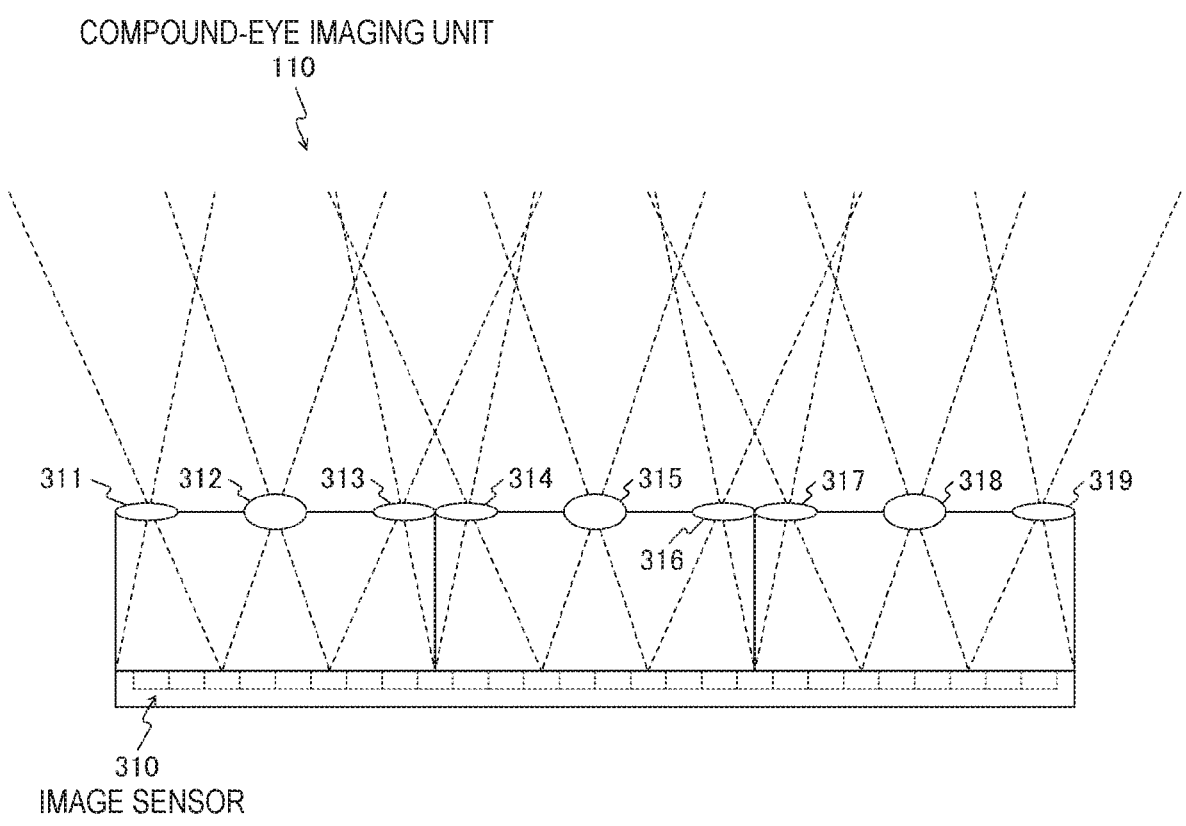
FIG. 28 is a diagram showing a configuration example of a compound-eye imaging unit 110 in accordance with a sixth embodiment of the present technology.
Figure 29:
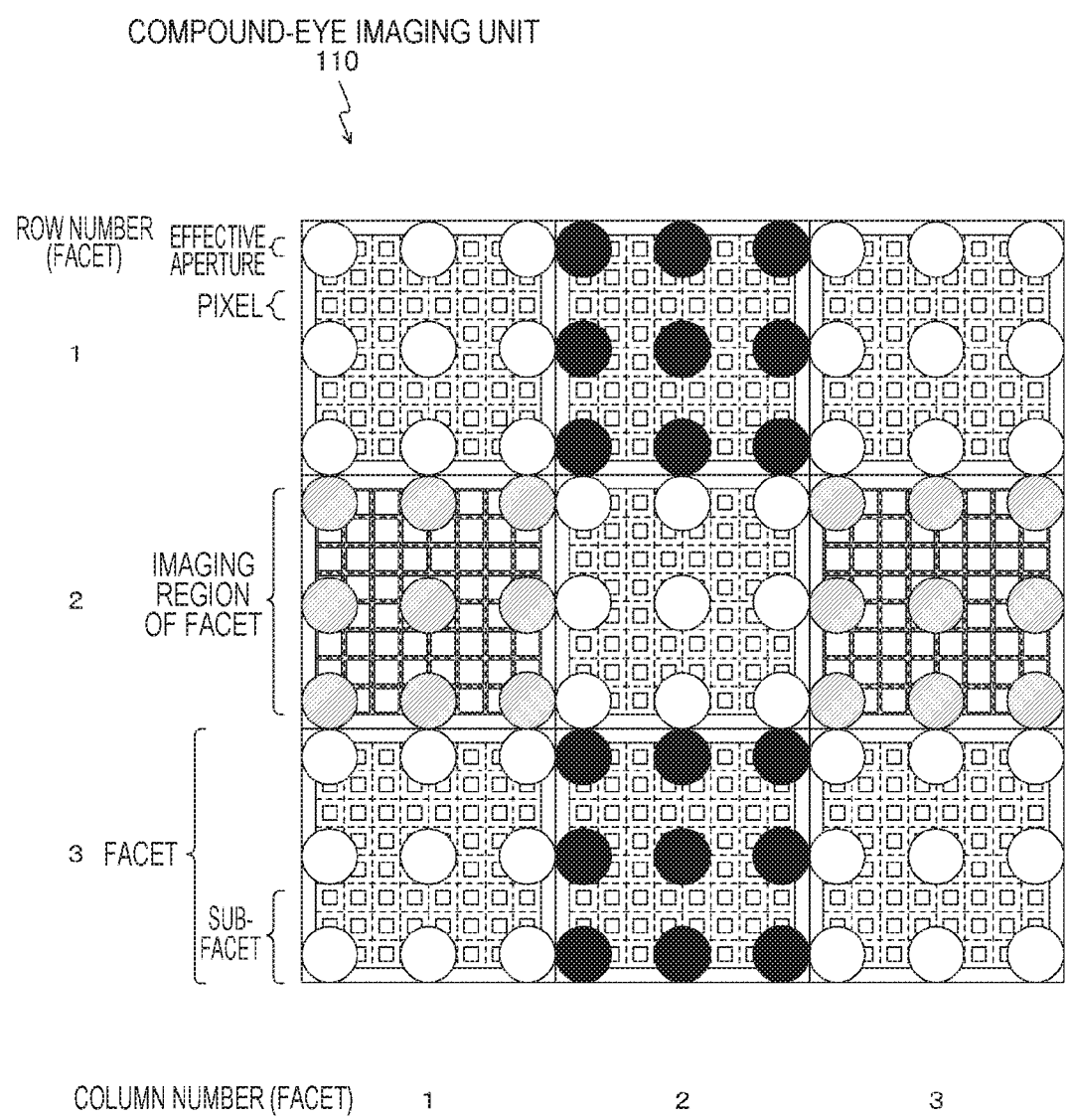
FIG. 29 is a diagram showing a configuration example of a compound-eye imaging unit 110 in accordance with a sixth embodiment of the present technology.

FIG. 28 and FIG. 29 each show an example of configuring an optical characteristic of facets disposed in a peripheral portion of an image sensor 300 of the compound-eye imaging unit 110 and an optical characteristic of a central portion facet differently. FIG. 28 shows a cross-sectional view, and FIG. 29 shows a top view.

Specifically, like FIG. 26, an optimal design in which an incident angle of main light beams of facet lenses 312, 315, and 318 is set to 0 degrees is made for sub-facets at the centers of facets. On the other hand, for sub-facets disposed in peripheral portions of facets, an optimal design in which incident angles of main light beams of facet lenses 311, 313, 314, 316, 317, and 319 are set to angles other than 0 degrees is made. In this way, in FIG. 28 and FIG. 29, optical characteristics of sub-facets and positions of facet lenses are configured differently from an optical characteristic of an ordinary facet.

In this way, FIG. 28 and FIG. 29 each show an example of the compound-eye imaging unit 110 having a multi lens array (MLA) in which facet optical systems employing different optimal designs are mixed.

Also, FIG. 28 and FIG. 29 show a case in which a color filter of each color is adjacent to facet lenses or diaphragms.

Here, a case in which optical characteristics of facet lenses are made the same over all imaging regions is assumed. In this case, the cost of a facet lens increases, and the facet lens becomes thick and large in size.

Therefore, in the sixth embodiment of the present technology, facet optical systems employing an optimal design in which an incident angle of a main light beam is set to 0 degrees and facet optical systems employing an optimal design (in particular, optimal design in a region such as a peripheral portion of the angle of view) in which an incident angle of a main light beam is set to an angle other than 0 degrees are mixed. Accordingly, manufacturing of a facet lens of a facet is facilitated, and it is possible to reduce the cost of the facet lens and to thin down the facet lens.

Further, due to facet optical systems employing an optimal design in a region such as a peripheral portion of the angle of view, it is possible to improve color reproducibility and a resolution characteristic of the peripheral portion of the angle of view. Also, it is possible to improve a peripheral resolution.

7. Seventh Embodiment

A seventh embodiment of the present technology shows an example of performing pupil correction for each facet.
[Example of Performing Pupil Correction for Each Facet]

Figure 30:
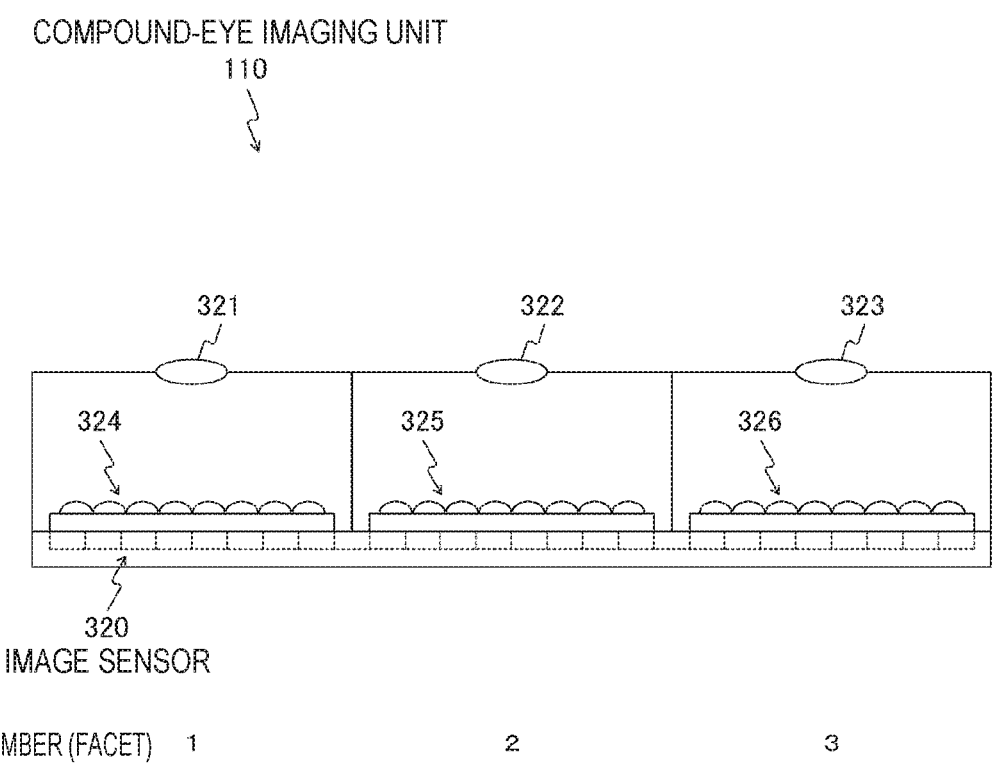
FIG. 30 is a diagram showing a configuration example of a compound-eye imaging unit 110 in accordance with a seventh embodiment of the present technology.

FIG. 30 is a diagram showing a configuration example of a compound-eye imaging unit 110 in accordance with the seventh embodiment of the present technology. FIG. 30 shows a cross-sectional view of the compound-eye imaging unit 110 which performs pupil correction for each facet.

For example, on-chip lenses 324 to 326 for performing pupil correction are disposed on pixels constituting an image sensor 320 of each facet.

In this way, by disposing the on-chip lenses 324 to 326 on the pixels constituting the image sensor 320 of each facet, it is possible to perform what is known as pupil correction for each facet. For this reason, it is possible to improve a shading characteristic of the facets, and to improve a shading characteristic of an overall image. Also, a signal to noise ratio (S/N) of a peripheral portion of the overall image can be made favorable.

8. Eighth Embodiment

An eighth embodiment of the present technology shows an example of improving a shading characteristic by reducing f-numbers of peripheral optical systems having space to spare.
[Example of Reducing f-Numbers of Peripheral Optical Systems Having Space to Spare]

Figure 31:
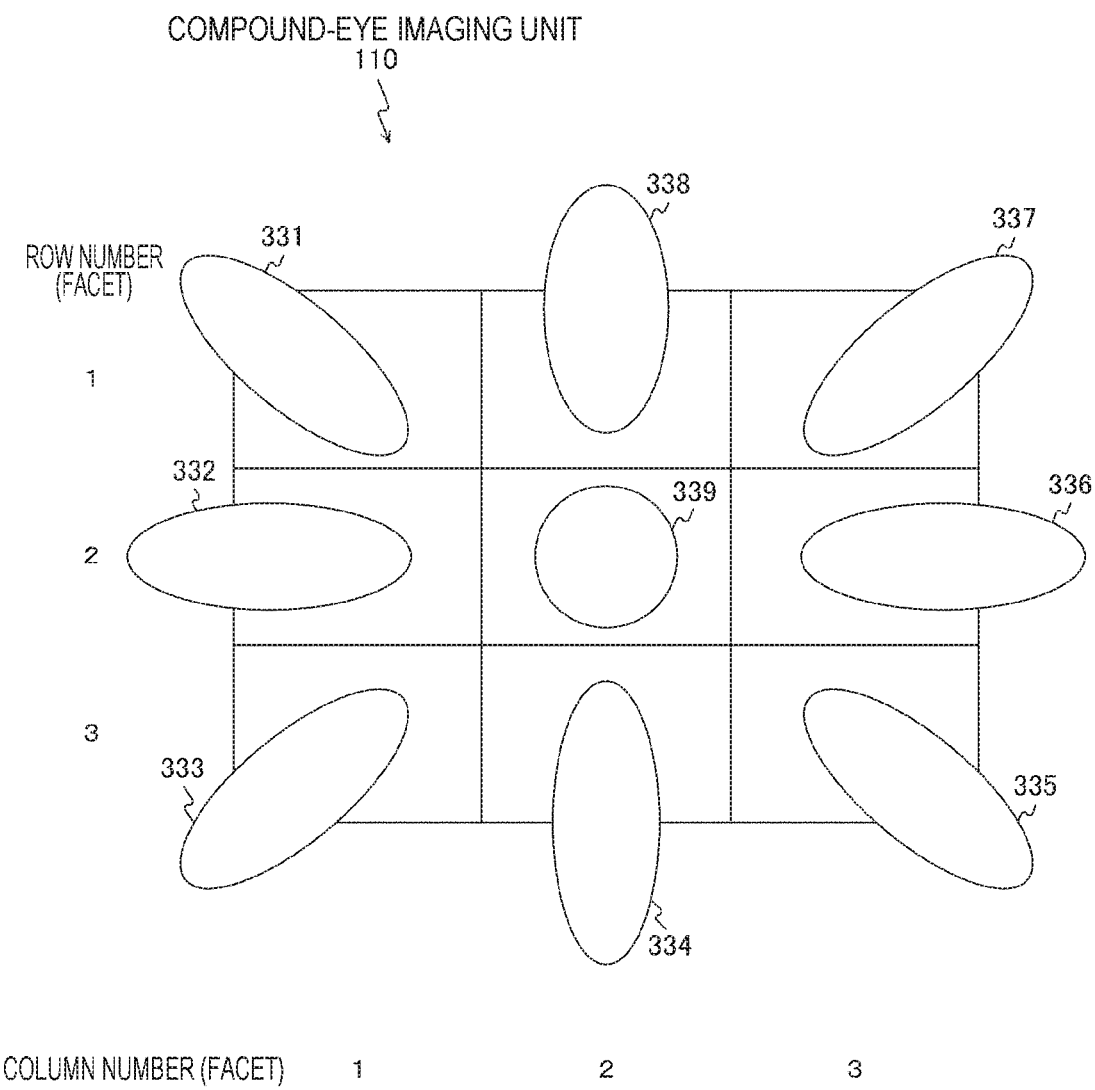
FIG. 31 is a diagram showing a configuration example of a compound-eye imaging unit 110 in accordance with an eighth embodiment of the present technology.
Figure 32:
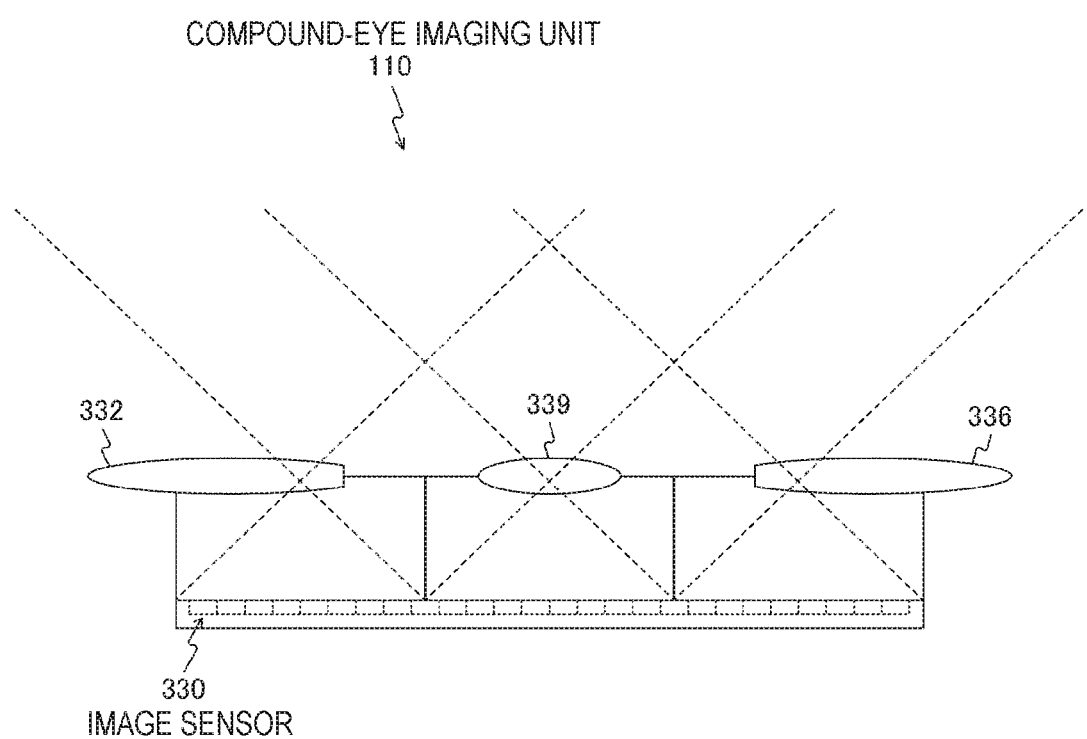
FIG. 32 is a diagram showing a configuration example of a compound-eye imaging unit 110 in accordance with an eighth embodiment of the present technology.
Figure 33:
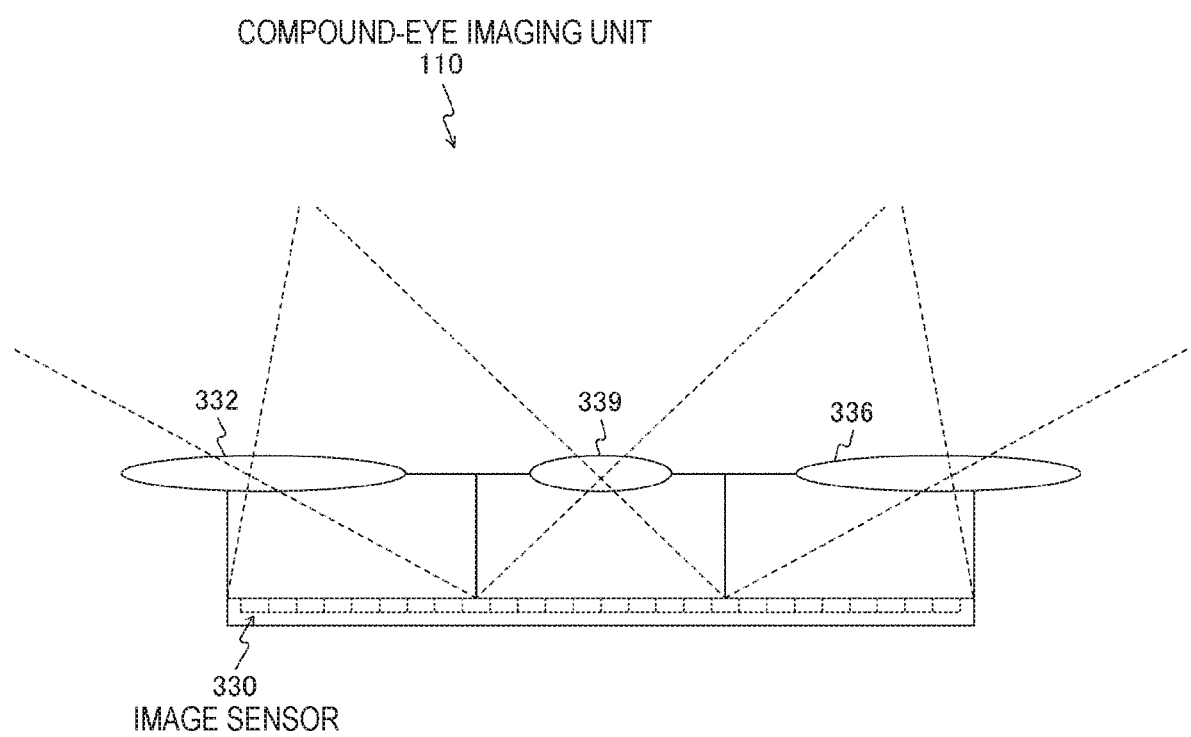
FIG. 33 is a diagram showing a configuration example of a compound-eye imaging unit 110 in accordance with an eighth embodiment of the present technology.

FIG. 31 to FIG. 33 are diagrams showing configuration examples of a compound-eye imaging unit 110 in accordance with the eighth embodiment of the present technology. FIG. 31 shows a top view of the compound-eye imaging unit 110, and FIG. 32 and FIG. 33 show cross-sectional views of the compound-eye imaging unit 110.

FIG. 31 to FIG. 33 show examples of a case in which an image sensor 330 and facet lenses 331 to 339 are disposed in a 3×3 array. There is space to spare around the compound-eye imaging unit 110. For this reason, in order to reduce f-numbers of optical systems around the compound-eye imaging unit 110, the facet lenses 331 to 339 are made in shapes shown in FIG. 31 to FIG. 33 (shapes as if protruding from the compound-eye imaging unit 110). Accordingly, it is possible to improve a shading characteristic.

FIG. 32 shows an example of making positional relationships of optical axes of facets disposed in a peripheral portion of the compound-eye imaging unit 110 with regard to facet imaging regions and a positional relationship of an optical axis of a facet disposed in a central portion with regard to a facet imaging region approximately the same.

FIG. 33 shows an example of making positional relationships of optical axes of facets disposed in a peripheral portion of a compound-eye imaging device with regard to facet imaging regions and a positional relationship of an optical axis of a facet disposed in a central portion with regard to a facet imaging region significantly different.

In this way, without designing or manufacturing facet optical systems included in a multi lens array (MLA) to have the same characteristic, f-numbers of peripheral optical systems having space to spare are reduced. Accordingly, it is possible to improve a shading characteristic occurring in one facet optical system.

9. Ninth Embodiment

A ninth embodiment of the present technology shows an example of improving a sensitivity by increasing the number of facets in a wafer level camera module (WLCM) and a stacked compound-eye imaging device.
[Configuration Example of Case of Increasing Number of Facets]

Figure 34:
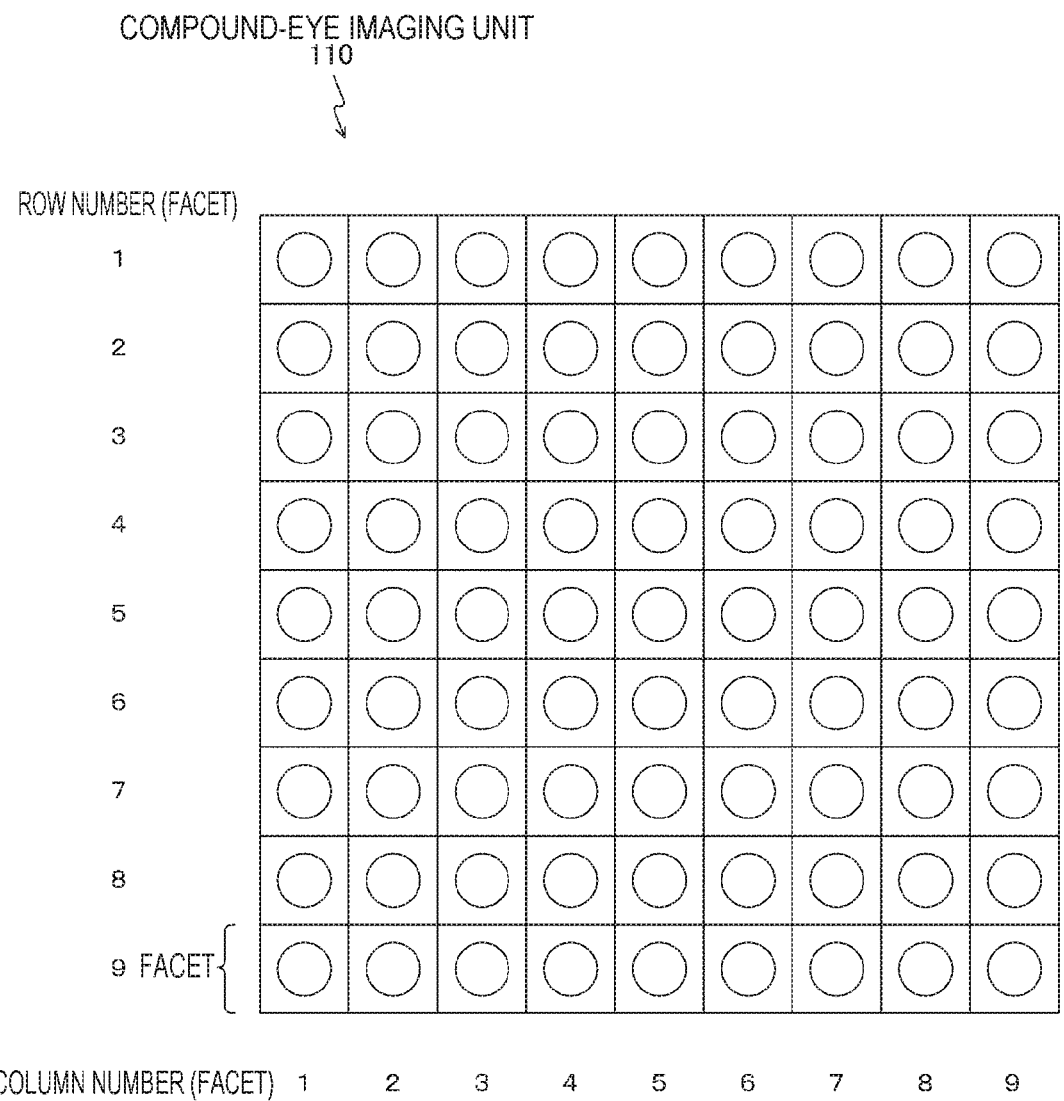
FIG. 34 is a diagram showing a configuration example of a compound-eye imaging device in accordance with a ninth embodiment of the present technology.

FIG. 34 is a diagram showing a configuration example of a compound-eye imaging device in accordance with the ninth embodiment of the present technology. FIG. 34 shows an example of a case in which the number of facets is 81 (9×9).

For example, at the research level of universities, there are attempts to dispose a plurality of individual cameras in the form of an array and improve functions and picture quality of all of the plurality of single-eye cameras. Also, there are attempts to dispose a plurality of camera modules in the form of an array and improve functions and picture quality of all of the plurality of camera modules.

It is supposed that it will be difficult to improve the precision of relative positions of a plurality of single-eye cameras or a plurality of camera modules up to the level of a pixel size of an image sensor with these methods.

For this reason, it is supposed that it will be difficult to achieve an improvement in resolution resulting from spatial pixel shift and an improvement in signal to noise ratio (S/N) resulting from synchronous addition in units of pixels.

In contrast, since WLCM can realize the precision of facet positions corresponding to the alignment precision of semiconductor manufacturing, it is possible to obtain the precision of relative positions at the level of a pixel size. For this reason, it is possible to achieve an improvement in resolution resulting from spatial pixel shift and an improvement in signal to noise ratio (S/N) resulting from synchronous addition in units of pixels.

10. 10th Embodiment

A 10th embodiment of the present technology shows an example of disposing facets having different sensitivities in a WLCM and improving a sensitivity and a dynamic range.

[Configuration Example of Case of Disposing Facets Having Different Sensitivities in WLCM]

FIG. 35 to FIG. 39 are diagrams showing configuration examples of a compound-eye imaging unit 110 in accordance with the 10th embodiment of the present technology.

Figure 37:
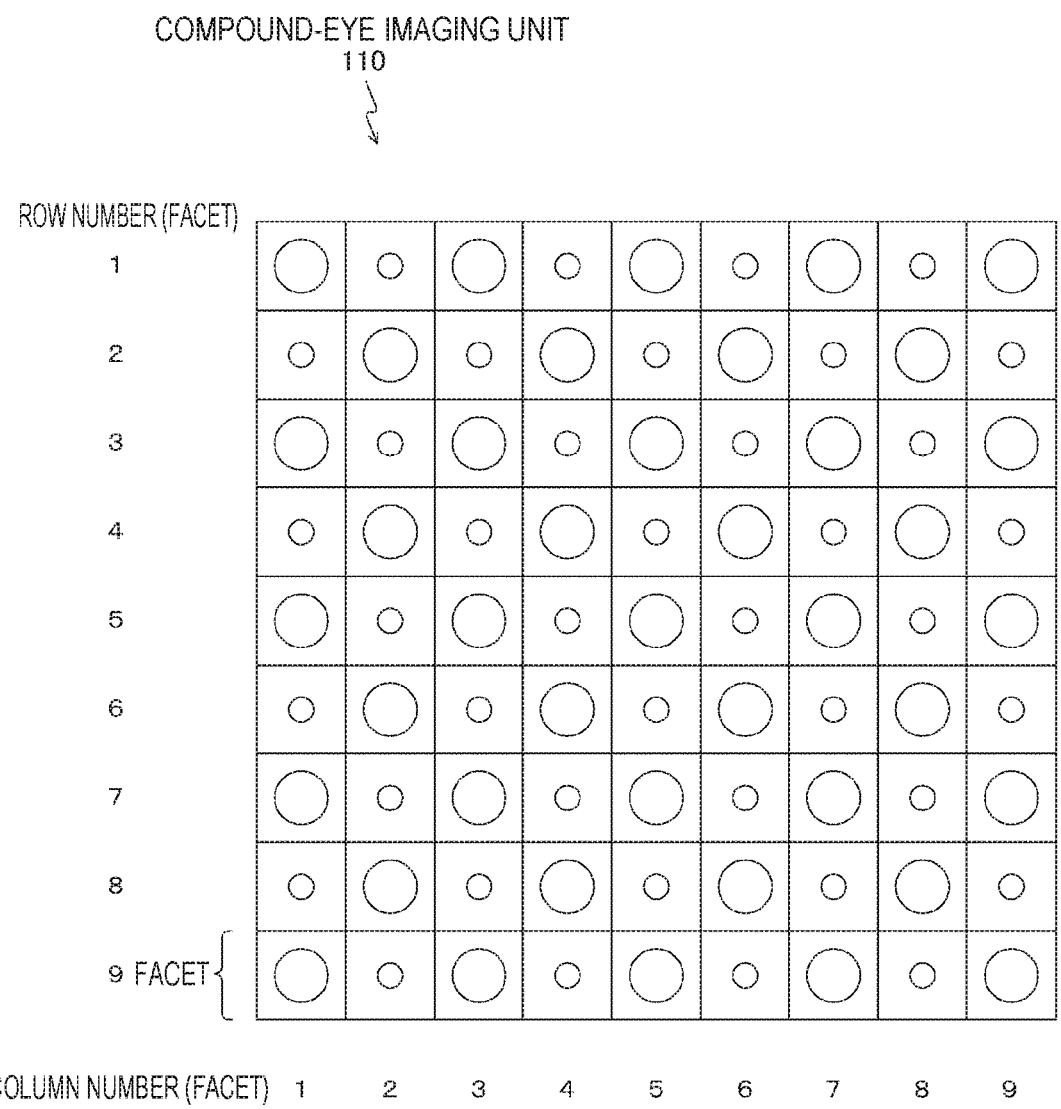
FIG. 37 is a diagram showing a configuration example of a compound-eye imaging unit 110 in accordance with a 10th embodiment of the present technology.
Figure 38:
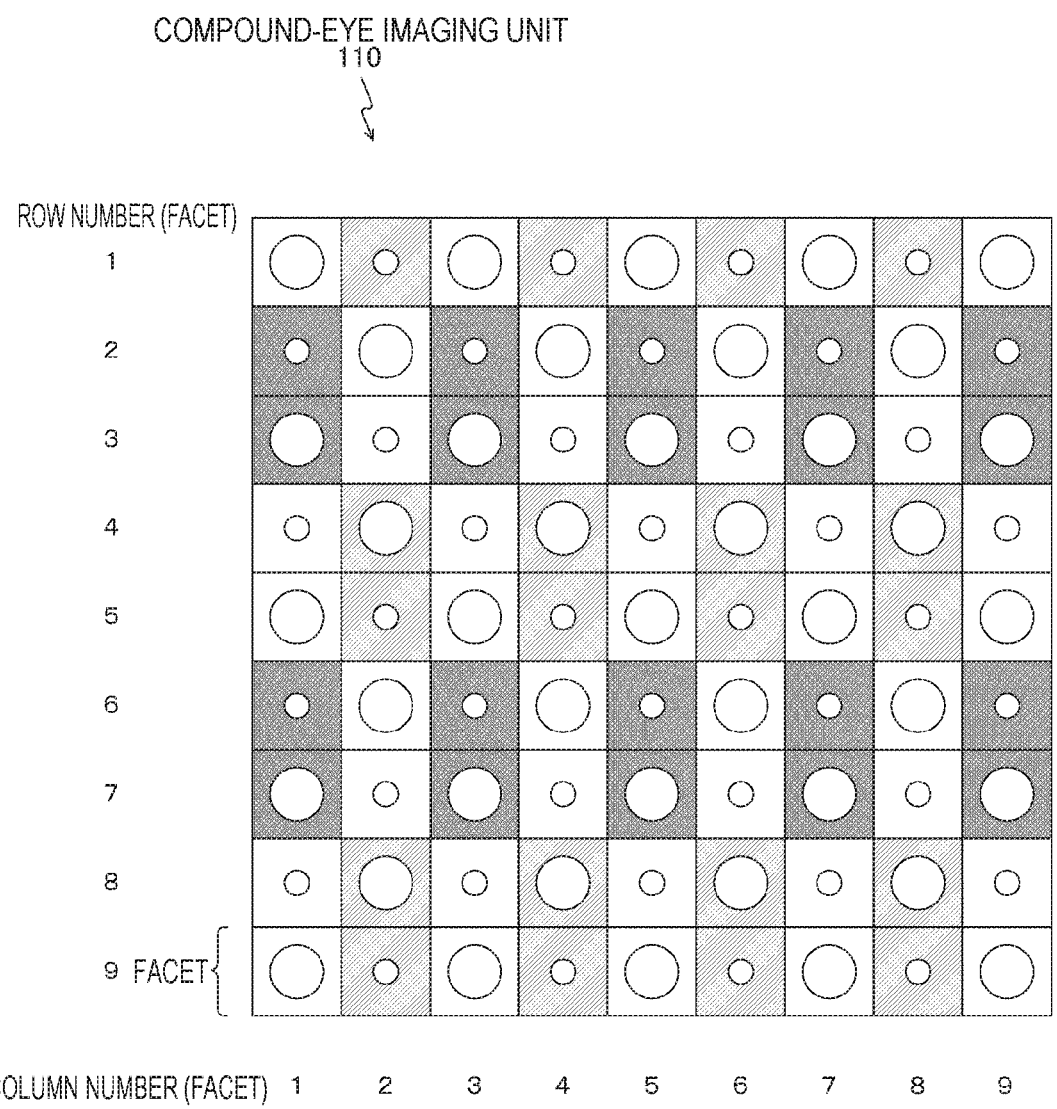
FIG. 38 is a diagram showing a configuration example of a compound-eye imaging unit 110 in accordance with a 10th embodiment of the present technology.
Figure 39:
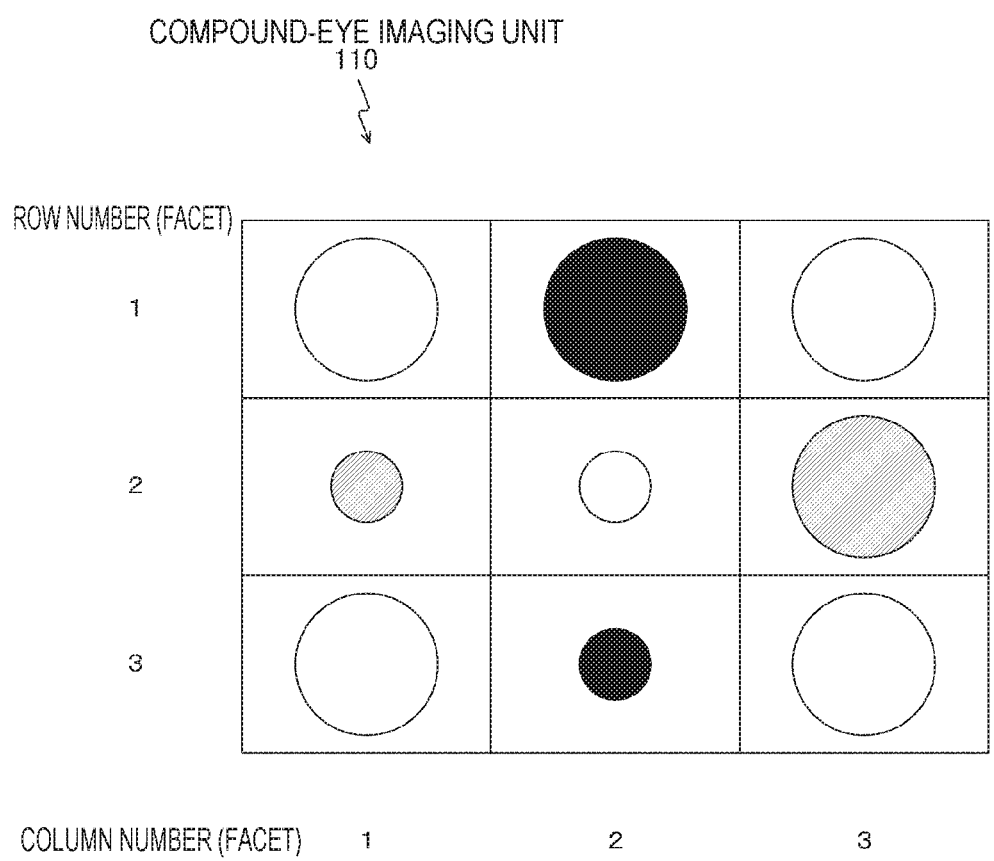
FIG. 39 is a diagram showing a configuration example of a compound-eye imaging unit 110 in accordance with a 10th embodiment of the present technology.

FIG. 35 to FIG. 38 show examples of image sensors configured with a plurality of (9×9) facets. Also, FIG. 39 shows an example of an image sensor configured with a plurality of (3×3) facets.

Figure 35:
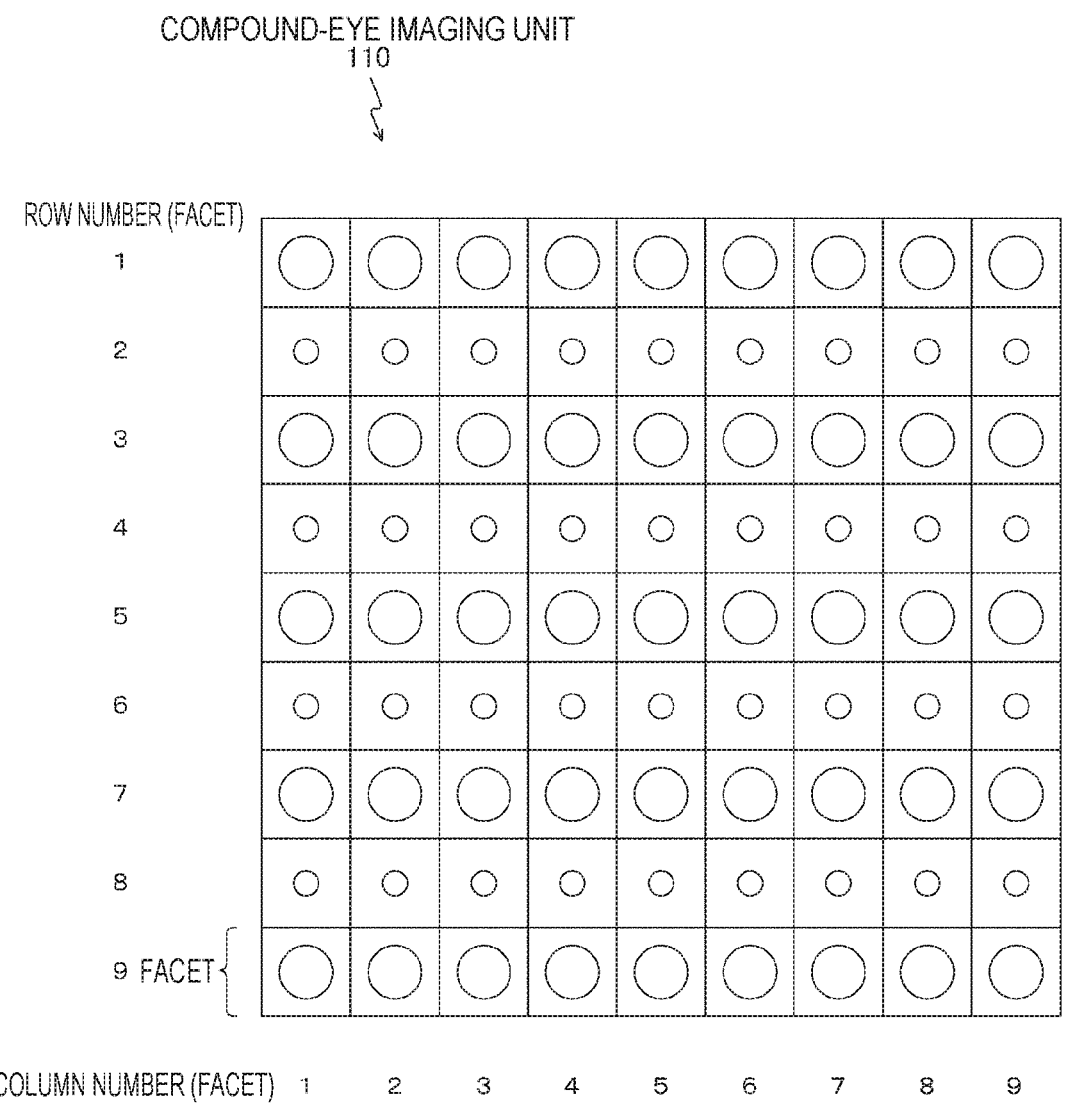
FIG. 35 is a diagram showing a configuration example of a compound-eye imaging unit 110 in accordance with a 10th embodiment of the present technology.
Figure 36:
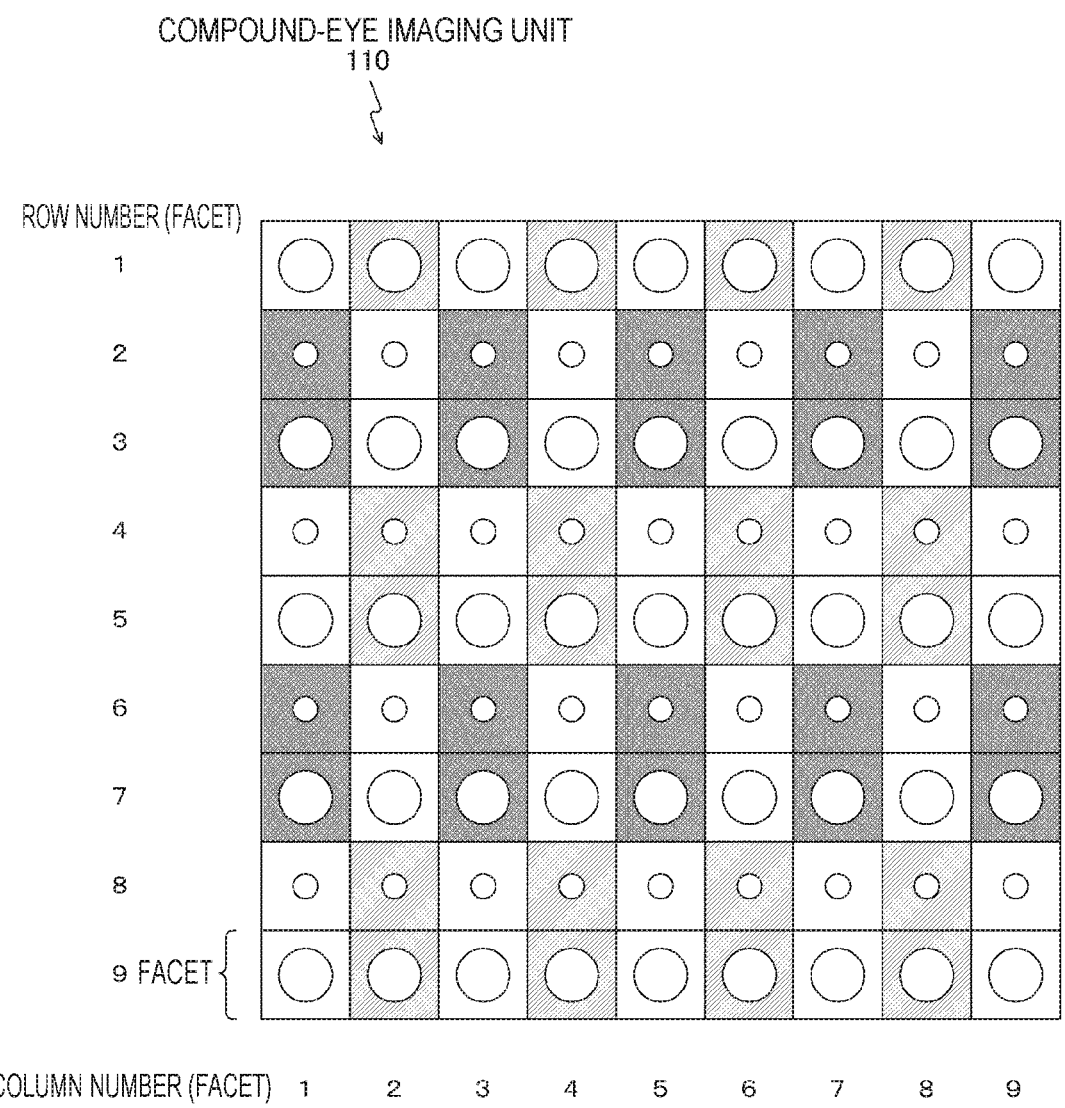
FIG. 36 is a diagram showing a configuration example of a compound-eye imaging unit 110 in accordance with a 10th embodiment of the present technology.

FIG. 35 shows an example of a case in which high-sensitivity facets and low-sensitivity facets are alternately disposed in a column. FIG. 36 shows an example of a case of disposing color filters in an image sensor in which high-sensitivity facets and low-sensitivity facets are alternately disposed in a column.

In FIG. 36 to FIG. 39, the sensitivity of a facet is indicated by the size of a circle. Specifically, high-sensitivity facets are indicated by big circles, and low-sensitivity facets are indicated by small circles. Also, in FIG. 36 and FIG. 38, the type of a color filter is represented by the form of a pixel. Specifically, rectangles corresponding to facets of green filters are colored white, rectangles corresponding to facets of red filters are colored black, and rectangles corresponding to facets of blue filters are represented by diagonal lines added therein.

FIG. 37 shows an example of a case in which high-sensitivity facets and low-sensitivity facets are disposed in a checkerboard pattern. FIG. 38 shows an example of a case of disposing color filters in an image sensor in which high-sensitivity facets and low-sensitivity facets are disposed in a checkerboard pattern.

FIG. 39 shows a disposition example other than the dispositions shown in FIG. 35 to FIG. 38. In FIG. 39, types of color filters are represented by forms of facet lenses. Specifically, facet lenses disposed in a facet of a green filter are indicated by circles colored white, facet lenses disposed in a facet of a red filter are indicated by circles colored black, and facet lenses disposed in a facet of a blue filter are indicated by circles in which diagonal lines are added.

For example, as a sensitivity of an imaging device, a sensitivity characteristic of one camera module is determined for a conventional wafer level camera module. In contrast, in the 10th embodiment of the present technology, by disposing facets having different sensitivities in a WLCM, it is possible to improve a sensitivity and a dynamic range.

Also, a conventional compound-eye imaging device is supposed to be able to improve a sensitivity of a final output signal compared to a sensitivity of a facet by adding or signal processing a plurality of facet output signals. However, since an assembly process of an image sensor (imaging element), an MLA, and the like is performed in a separate course from a semiconductor process, it is supposed that it will be difficult to miniaturize (in particular, to reduce a thickness of) the whole compound-eye imaging device.

Also, a conventional compound-eye imaging device which sets a plurality of sensitivity characteristics of facets by preparing a plurality of sizes of diaphragms of the facets and can widen a dynamic range of a final output signal by signal processing output signals of the plurality of facets having these different sensitivities, has been proposed. However, since an assembly process of an image sensor (imaging element), an MLA, and the like is performed in a separate course from a semiconductor process, it is supposed that it will be difficult to miniaturize (in particular, to reduce a thickness of) the whole compound-eye imaging device.

Therefore, in the 10th embodiment of the present technology, it is possible to miniaturize a whole compound-eye imaging device by disposing facets having different sensitivities in a WLCM, and to improve a sensitivity and a dynamic range.

11. 11th Embodiment

An 11th embodiment of the present technology shows an example of performing a readout from a compound-eye imaging unit with a plurality of readout methods.

[Configuration Example of Performing Plurality of Readouts of Live View and High Picture Quality Mode]

Figure 40:
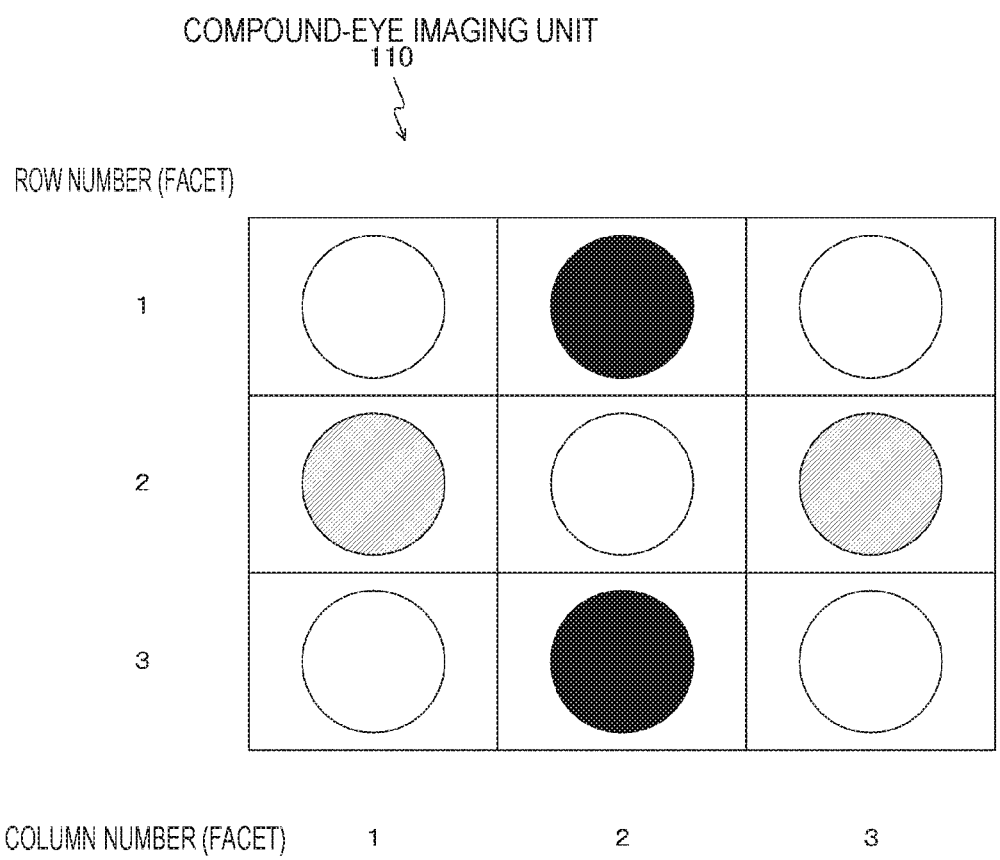
FIG. 40 is a diagram showing a configuration example of a compound-eye imaging unit 110 in accordance with an 11th embodiment of the present technology.

FIG. 40 is a diagram showing a configuration example of a compound-eye imaging unit 110 in accordance with the 11th embodiment of the present technology. FIG. 40 shows an example of an image sensor configured with a plurality of (3×3) facets.

For example, during display of live view the control unit 130 (shown in FIG. 9) reads out and outputs only image data from three facets (2, 1), (2, 2), and (3, 2) among the nine facets shown in FIG. 40.

Here, (x, y) is information indicating a position of a facet constituting the compound-eye imaging unit 110. x indicates a row number, and y indicates a column number.

Also, when a high picture quality mode is set, the control unit 130 reads out and outputs image data from all of the nine facets shown in FIG. 40.

In this way, in accordance with an imaging mode, the control unit 130 performs control to change a readout method from an image sensor constituting the compound-eye imaging unit 110.

Here, when video capturing is performed by using a compound-eye imaging device, it is necessary to play taken images on a monitor and check the images which are being captured.

If signal processing on all facets and output of an image of high picture quality are attempted, latency occurs due to the signal processing. Therefore, when a moving subject is photographed or photography is performed with a moving camera, a time lag occurs between movement of the subject and images appearing on the monitor, and there is a problem in photography.

In order to avoid such a situation, a plurality of readout methods of a live view mode and a high picture quality mode are introduced into a compound-eye imaging device. These methods are enabled by designing an image sensor and a system in advance so that an output signal of each facet can be selected.

Images output to a monitor (for example, the display unit 140 shown in FIG. 9) are images of as few facets as possible to reduce the load of signal processing and minimize latency. Also, when recording with high picture quality is necessary, recording of the high picture quality mode is performed in parallel. However, when recording with high picture quality is not necessary, images of a minimum number of necessary facets are recorded.

In this way, by performing a readout and recording among a plurality of facets in accordance with a situation of the time, it is possible to minimize latency and reduce power consumption. In other words, it is possible to achieve an improvement in a real time characteristic (an improvement in latency).

Also, since it takes time for a conventional compound-eye imaging device to obtain a final output signal, when acquisition of a video is attempted, images output in an electronic viewfinder are delayed. For this reason, it is extremely difficult to image a subject on the move. Therefore, in the 11th embodiment of the present technology, it is possible to minimize latency and suitably image a subject on the move by performing a readout and recording among a plurality of facets in accordance with a situation of the time.

Here, for example, a case in which a compound-eye imaging device has no display unit is assumed. In this case, it is conceivable to check images being captured by using a display of another information processing device (for example, a portable information processing device (for example, a smart phone, a tablet terminal, or a cellular phone)).

For example, a wireless communication unit (for example, the wireless communication unit 170 shown in FIG. 9) for performing wireless communication with another device is provided in the compound-eye imaging device. Then, while the compound-eye imaging device is performing photography, the wireless communication unit transmits minimum necessary information (image data) to another device and causes a display unit of the other device to display the images being captured. Accordingly, even when there is no monitor in a compound-eye imaging device or even when the compound-eye imaging device has a monitor but is not at hand, it is possible to check images being captured by using a display unit of another device.

In this way, when minimum necessary information (image data) is transmitted by the wireless communication unit to another device, a transmission method for transmitting readout images is useful due to the above-described readout method during display of live view.

12. 12th Embodiment

A 12th embodiment of the present technology shows an example of reducing power consumption by turning off operation of facets or analog to digital converters (ADCs). The 12th embodiment of the present technology is described with reference to FIG. 40.

For example, during display of live view, the control unit 130 (shown in FIG. 9) operates only three facets (2, 1), (2, 2), and (3, 2) among the nine facets shown in FIG. 40. In this case, other facets are placed in a standby mode in which the other facets are turned off, ADCs in the other facets are turned off, or the like.

In this way, the control unit 130 can perform control so that at least one of stopping operation of facets which are not in use among the plurality of facets and turning off the ADCs installed in the facets is performed.

Here, there is a risk that a conventional compound-eye imaging device will operate facets, power consumption will become large in order to obtain a final output signal, and a duration of a battery thereof as a portable device will be shortened. Therefore, in the 12th embodiment of the present technology, it is possible to achieve low power consumption by turning off operation of facets which are not in use or ADCs in the facets.

13. 13th Embodiment

A 13th embodiment of the present technology shows an example of using a global shutter complementary metal oxide semiconductor (CMOS) image sensor.

Figure 41:
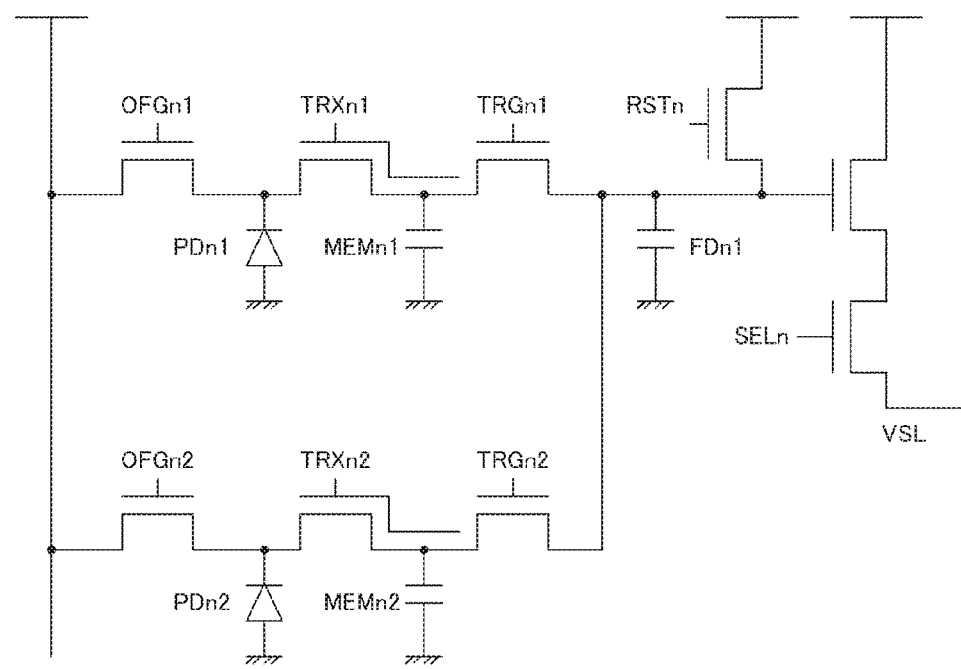
FIG. 41 is a diagram showing a configuration example of a global shutter CMOS image sensor 400 used in a compound-eye imaging unit 110 in accordance with a 13th embodiment of the present technology.

FIG. 41 is a diagram showing a configuration example of a global shutter CMOS image sensor 400 used in a compound-eye imaging unit 110 in accordance with the 13th embodiment of the present technology.

For example, a case of using a rolling shutter image sensor formed on the same chip is assumed. In this case, a time from the start to the end of accumulating imaging signals of a plurality of facets varies. For this reason, when a subject on the move is photographed, an image shift occurs in an output signal of each facet, and it is supposed that it will be difficult to obtain a final output signal. Likewise, when shaking or the like of a compound-eye imaging device occurs, an image shift occurs in an output signal of each facet, and it is supposed that it will be difficult to obtain a final output signal.

Therefore, in the 13th embodiment of the present technology, a global shutter CMOS image sensor 400 is used. Accordingly, even when a subject on the move is photographed or shaking and the like of a compound-eye imaging device occurs, it is possible to prevent an image shift of an output signal of each facet and obtain a suitable final output signal. In other words, it is possible to improve (or remove) an artifact of a moving subject.

14. 14th Embodiment

A 14th embodiment of the present technology shows an example of using a back-illuminated CMOS image sensor.

FIG. 42 is a diagram showing a configuration example of a back-illuminated CMOS image sensor used in a compound-eye imaging unit 110 in accordance with the 14th embodiment of the present technology. Also, FIG. 42 shows a configuration example of a front-illuminated CMOS image sensor as a comparative example. In other words, a of FIG. 42 shows a back-illuminated CMOS image sensor, and b of FIG. 42 shows a front-illuminated CMOS image sensor.

The back-illuminated CMOS image sensor shown in a of FIG. 42 includes on-chip lenses 411, color filters 412, a light-receiving surface 413, a substrate 414, and a photodiode 415. Also, the front-illuminated CMOS image sensor shown in b of FIG. 42 includes on-chip lenses 421, color filters 422, wiring 423, a light-receiving surface 424, a substrate 425, and a photodiode 426. Also, in a and b of FIG. 42, arrows indicate incident light.

As shown in b of FIG. 42, in a compound-eye imaging device employing a front-illuminated imaging element, a layer of the wiring 423 is on pixels, and thus there is a risk that a part of light incident on pixels will be blocked and a sensitivity will be degraded. Also, in relation to images of a peripheral portion of a focal surface, incident angles with respect to pixels become large, and a ratio of blocked light increases compared to a central portion. Therefore, there is a risk that shading of the images will be degraded. In other words, a ratio of blocked light in a region of diagonal incident light increases compared to a central portion, and there is a risk that shading of an image will be degraded.

Also, it is difficult for a compound-eye imaging device employing a front-illuminated CMOS image sensor to produce outputs of respective facets at the same time (or reduce time differences).

Therefore, by using a back-illuminated CMOS image sensor shown in a of FIG. 42, it is possible to improve a sensitivity. Also, it is possible to improve shading. Also, it is possible to produce outputs of respective facets at the same time (or reduce time differences).

15. 15th Embodiment

A 15th embodiment of the present technology shows an example of using a stacked image sensor. Also, the 15th embodiment of the present technology shows an example of producing parallel outputs of facets by using the stacked image sensor.

Figure 43:
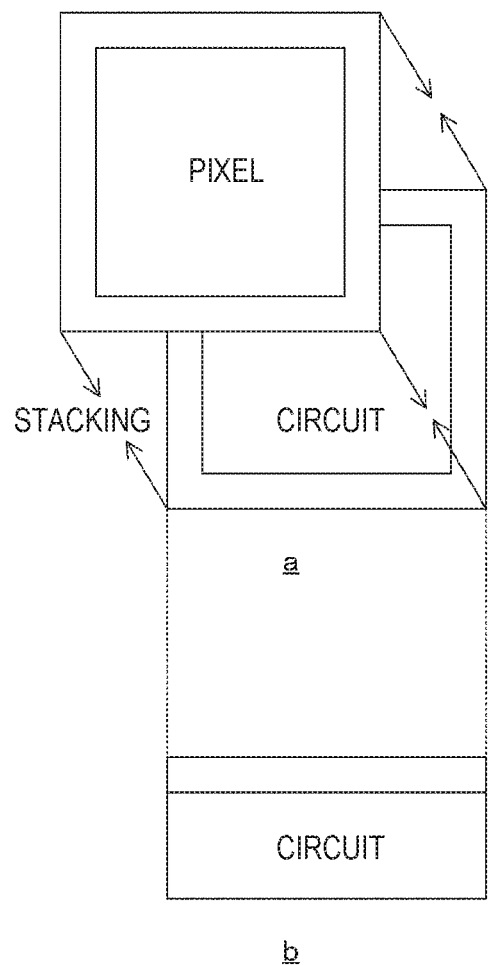
FIG. 43 is a diagram showing a configuration example of a stacked image sensor used in a compound-eye imaging unit 110 in accordance with a 15th embodiment of the present technology.

FIG. 43 is a diagram showing a configuration example of a stacked image sensor used in a compound-eye imaging unit 110 in accordance with the 15th embodiment of the present technology. Also, a of FIG. 43 shows a perspective view of the stacked image sensor (back-illuminated CMOS image sensor), and b of FIG. 43 shows a side view of the stacked image sensor (back-illuminated CMOS image sensor).

The stacked image sensor (back-illuminated CMOS image sensor) shown in FIG. 43 is an image sensor in which pixels and circuit are stacked.

Here, a compound-eye imaging device is assumed to be configured with a chip of an image sensor (imaging element) of a single layer. It is supposed that it will be difficult for this compound-eye imaging device to produce outputs of respective facets at the same time (or reduce time differences).

Also, when outputs of respective facets are produced at the same time (or reduction of time differences is attempted), an output circuit is necessary for each facet, and a circuit region which is not an imaging region is necessary between facets. Therefore, the chip size of the image sensor (imaging element) becomes large.

Also, since it is difficult to use a most advanced fine transistor in a circuit region provided in the chip of the image sensor (imaging element), the area of the circuit region becomes large, and the chip size of the image sensor (imaging element) becomes larger.

Therefore, by using the back-illuminated CMOS image sensor shown in FIG. 43, it is possible to produce outputs of respective facets at the same time (or reduce time differences). Also, it is possible to reduce the chip size of the image sensor (imaging element).

16. 16th Embodiment

A 16th embodiment of the present technology shows an example of disposing a distance sensor in a facet.

Figure 44:
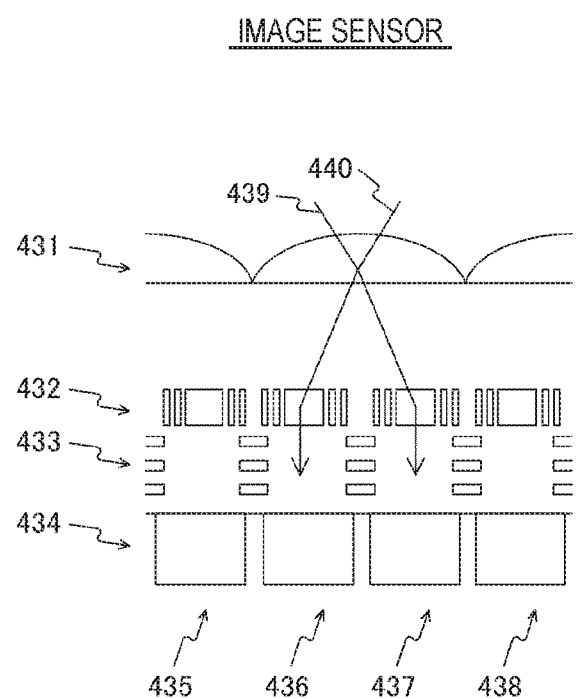
FIG. 44 is a cross-sectional view showing an example of an image sensor including a distance sensor in accordance with a 16th embodiment of the present technology.

FIG. 44 is a cross-sectional view showing an example of an image sensor including a distance sensor in accordance with the 16th embodiment of the present technology.

The image sensor shown in FIG. 44 is configured with lenticular lenses (beam splitters) 431, DMLs (focus enhancers) 432, metals 433, and photodiodes 434. Also, the photodiodes 434 are configured with right pupils 436 and 438 and left pupils 435 and 437. Also, a pair is configured with one right pupil and left pupil (for example, the right pupil 436 and the left pupil 437)

Then, the right pupil 436 and the left pupil 437 constituting a pair receive light 439 from a left pupil region and light 440 from a right pupil region and perform photoelectric conversion. The control unit 130 (shown in FIG. 9) calculates a distance to a subject based on the results.

Accordingly, for example, when a distance calculation is performed by using parallax, it is possible to acquire distance information with high precision.

17. 17th Embodiment

A 17th embodiment of the present technology shows an example of arranging facets having different polarization angles.

Figure 45:
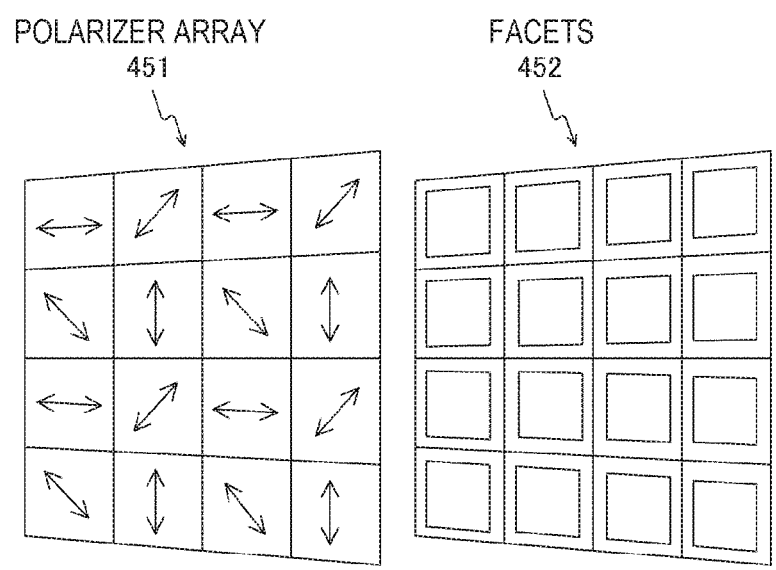
FIG. 45 is an exploded perspective view showing an example of an image sensor including a polarizer array 451 in accordance with a 17th embodiment of the present technology.

FIG. 45 is an exploded perspective view showing an example of an image sensor including a polarizer array 451 in accordance with the 17th embodiment of the present technology. An arrow in a polarizer corresponding to each facet indicates a direction of a polarization angle.

As shown in FIG. 45, the polarizer array 451 in which respective facets 452 have different polarization angles is included in the image sensor.

Accordingly, it is possible to simultaneously acquire both polarization information and image information of a subject.

18. 18th Embodiment

An 18th embodiment of the present technology shows an example of arranging facets having different spectral sensitivities.

FIG. 46 shows an example of a case in which a compound-eye imaging unit 110 in accordance with the 18th embodiment of the present technology includes facets having different spectral sensitivities. a of FIG. 46 shows a top view of the compound-eye imaging unit 110, and b of FIG. 46 shows wavelength characteristics.

For example, lines 461 to 477 of facets in a diagonal direction among facets shown in a of FIG. 46 can have the same spectral sensitivity. Also, for example, the line 461 of facets in the diagonal direction and the line 470 of facets in the diagonal direction can have the same spectral sensitivity. Likewise, each of the lines 462 to 468 of facets in the diagonal direction and each of the lines 471 to 477 of facets in the diagonal direction can have the same sensitivity. In a of FIG. 46, facets of the same spectral sensitivity are shown in the same display state.

Also, the wavelength characteristics shown in b of FIG. 46 can be allocated to the lines 461 to 477 of facets in the diagonal line in increasing order of wavelength.

Accordingly, many spectral characteristics of a subject can be acquired, and both spectral characteristics and image information can be acquired. In other words, it is possible to acquire both multispectral information and image information.

19. 19th Embodiment

A 19th embodiment of the present technology shows an example of arranging facets composed of sensors having sensitivities to light other than visible light.

FIG. 47 shows an example of a case in which a sensor has sensitivities to light other than visible light in a compound-eye imaging unit 110 in accordance with a 19th embodiment of the present technology.

In a of FIG. 47, types of light are indicated on a horizontal axis. b of FIG. 47 shows a top view of the compound-eye imaging unit 110 including sensors which have sensitivities to light other than visible light. In b of FIG. 47, facets having the same sensitivity are shown in the same display state.

FIG. 48 is a diagram showing examples of photoelectric conversion materials constituting the compound-eye imaging unit 110 in accordance with the 19th embodiment of the present technology. FIG. 48 shows examples of photoelectric conversion materials related to sensors having sensitivities to light other than visible light.

By using photoelectric conversion materials shown in FIG. 48, it is possible to realize the compound-eye imaging unit 110 including sensors having sensitivities to light other than visible light.

Accordingly, it is possible to acquire information on light other than visible light of a subject, and acquire both the information on light other than visible light and image information.

Also, by combining the 16th to 19th embodiments of the present technology, distance information, polarization information, multispectral information, and information on light other than visible light may be simultaneously acquired.

20. 20th Embodiment

Figure 49:
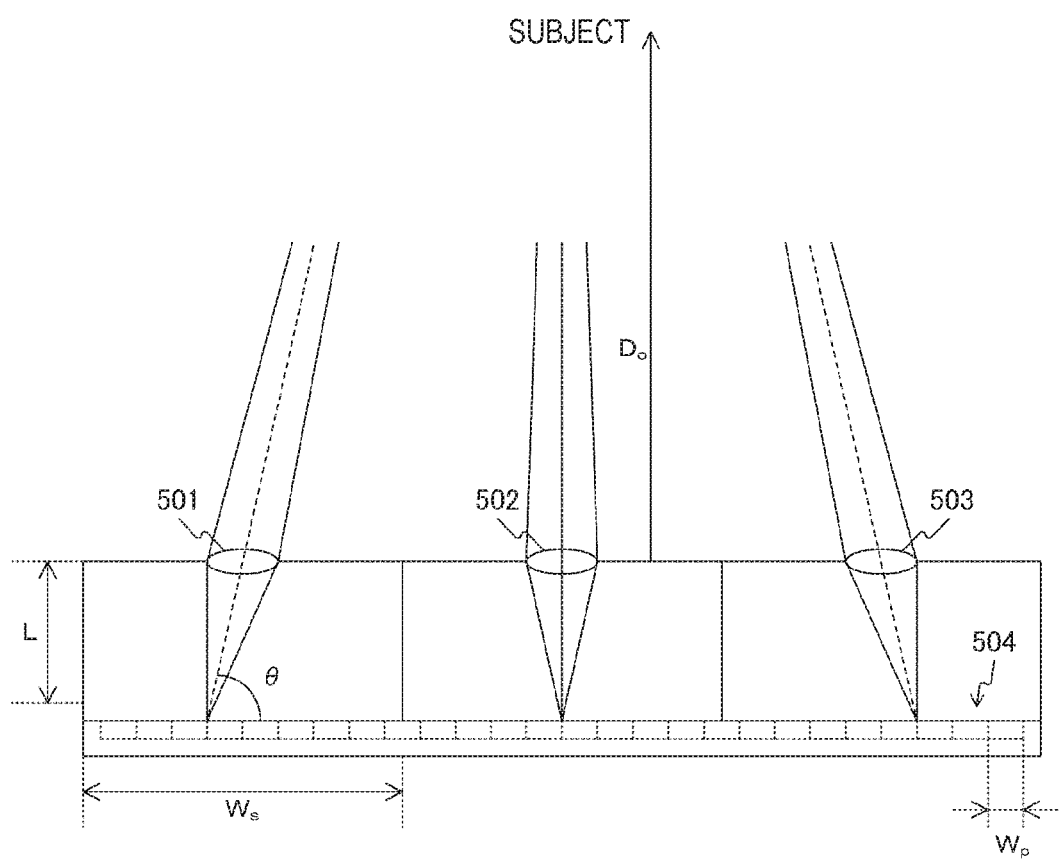
FIG. 49 is a diagram showing a cross section of a compound-eye imaging unit 110 in accordance with a 20th embodiment of the present technology.

A 20th embodiment of the present technology shows an example of calculating distance information by using parallax of WLCMs.
[Example of Calculating Distance Information]
FIG. 49 is a diagram showing a cross section of a compound-eye imaging unit 110 in accordance with the 20th embodiment of the present technology.

First, a difference value Dikl between output signals of pixels at the same address of the leftmost facet and the rightmost facet of the compound-eye imaging unit 110 is calculated by using Formula 3 below.

$$Dikl=Sikl-SiNkl \quad \text{Formula 3}$$

Here, Sijkl is a value representing an output signal of each facet.

Also, i is a value indicating a row number of a facet. Also, j is a value indicating a column number of the facet. Also, k is a value indicating a row number of a pixel in the facet. Also, l is a value indicating a column number of the pixel in the facet.

In Formula 3, Si1kl is, for example, a value representing image formation information (an output signal) of subject A at the leftmost facet of a compound-eye imaging device. Also, SiNkl is a value representing image formation information (an output signal) of subject A at the rightmost facet of the compound-eye imaging device.

When a subject is sufficiently far away compared to parallax, the difference value Dikl is 0. Also, when the position of a subject is so close that parallax of the compound-eye imaging unit 110 occurs, the difference value Dikl is a value other than 0.

Therefore, as given in Formula 4 below, a difference of information of pixels obtained by shifting pixel positions of a facet by a is taken, and a which minimizes the difference value is calculated.

$$Dikl=Silk(1-a)-SiNkl(1+a) \quad \text{Formula 4}$$

By using a calculated in this way, it is possible to calculate a distance Do from the compound-eye imaging unit 110 (image sensor) to a subject based on the principle of triangulation according to Formula 5 below.

$$Do=L\{(Ws/aWp)+1\} \quad \text{Formula 5}$$

Here, Wp is a value indicating a pixel pitch. Also, Ws is a value indicating a facet pitch. Also, L is a value indicating the distances between facet lenses 501 to 503 and an imaging surface 504 in the compound-eye imaging unit 110.

Conventionally, for example, an assembly process of an image sensor (imaging element), an MLA, and the like is performed in a separate course from a semiconductor process, and thus precision in calculating distance information by using parallax is degraded. Also, when it is intended to raise the precision, an overall compound-eye imaging device becomes large, and in particular, it is difficult to reduce the thickness. In contrast, in the 20th embodiment of the present technology, it is possible to raise precision in calculating distance information by using parallax, and to reduce the thickness of an overall compound-eye imaging device.

21. 21st Embodiment

Figure 50:
FIG. 50 is a top view showing an appearance of a compound-eye imaging unit 110 in accordance with a 21st embodiment of the present technology.

A 21st embodiment of the present technology shows an example in which at least one of a plurality of facets is made of a different material than other facets.
[Configuration Example of Compound-Eye Imaging Unit]
FIG. 50 is a top view showing an appearance of a compound-eye imaging unit 110 in accordance with the 21st embodiment of the present technology.

For example, a facet of (2, 2) (shown in grey in FIG. 50) in the compound-eye imaging unit 110 shown in FIG. 50 can be an image sensor (imaging element) manufactured with InGaAs. Also, other facets (8 facets) can be an image sensor (imaging element) using silicon.

Here, a conventional compound-eye imaging device is configured with image sensors (imaging elements) made of the same material. For this reason, there is a risk that it will be not possible to obtain information that cannot be acquired with characteristics of the image sensors (imaging elements). For example, it is not possible to acquire information of visible light and far infrared light with the compound-eye imaging device.

Therefore, in the 21st embodiment of the present technology, it is possible to reduce information that cannot be acquired by making at least one of a plurality of facets with a different material.

22. 22nd Embodiment

Figure 51:
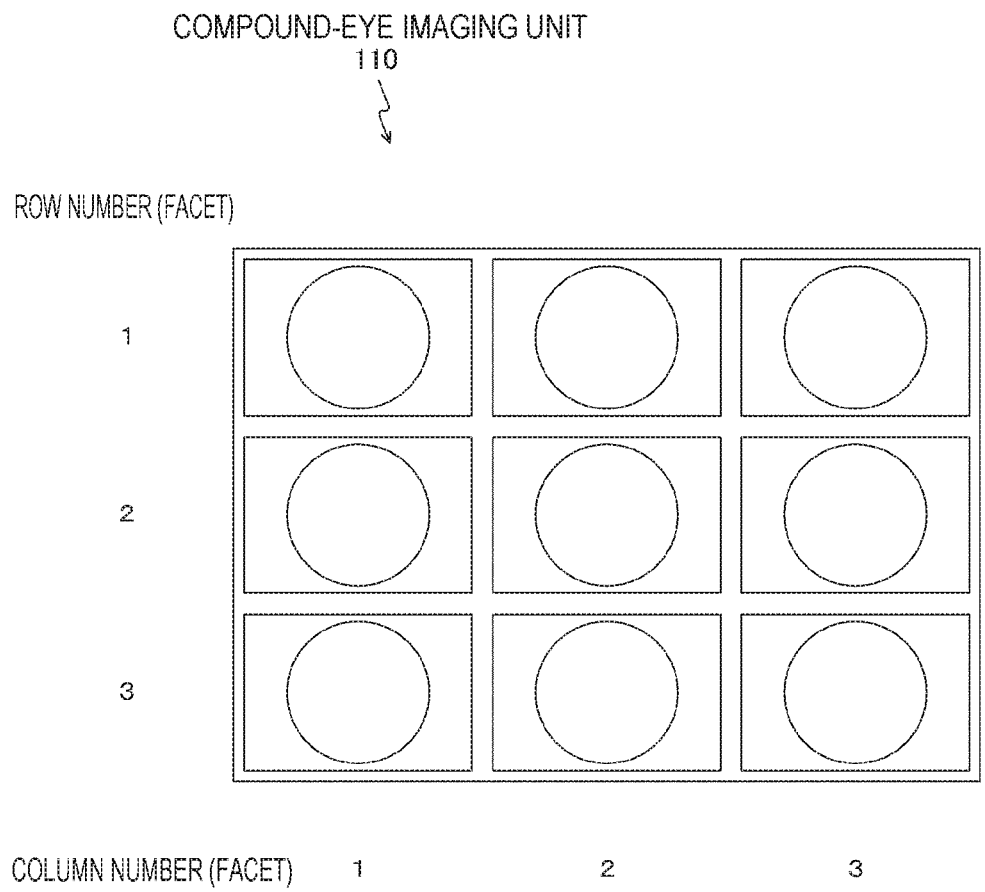
FIG. 51 is a top view showing an appearance of a compound-eye imaging unit 110 in accordance with a 22nd embodiment of the present technology.

A 22nd embodiment of the present technology shows an example of manufacturing a compound-eye imaging device by arranging singulated chips of image sensors (imaging elements) side by side as one pseudo-chip and adding a multi lens array (MLA) and the like.
[Configuration Example of Compound-Eye Imaging Unit]
FIG. 51 is a top view showing an appearance of a compound-eye imaging unit 110 in accordance with the 22nd embodiment of the present technology.

As shown in FIG. 51, it is possible to manufacture a compound-eye imaging unit 110 by arranging singulated chips of image sensors side by side as one pseudo-chip and adding a multi lens array (MLA) and the like.

23. 23rd Embodiment

A 23rd embodiment of the present technology shows an example of manufacturing a compound-eye imaging unit through tiling. An appearance configuration of a compound-eye imaging unit manufactured through tiling is the same as FIG. 51, and thus the illustration will be omitted here.

It is possible to manufacture a compound-eye imaging device by way of a tiling technology employing, for example, glass, a resin, silicon, or a plurality thereof.

Here, the tiling technology is a technology for making, for example, different types of chips or a plurality of chips of the same type into a pseudo-wafer.

24. 24th Embodiment

A 24th embodiment of the present technology shows an example of manufacturing a compound-eye imaging unit through tiling, thinning down, rewiring, and interlayer connection. An appearance configuration of a compound-eye imaging unit manufactured through tiling, thinning down, rewiring, and interlayer connection is the same as FIG. 51, and thus the illustration will be omitted here.

Here, as a conventional compound-eye imaging device, there is a compound-eye imaging device which employs a plurality of independent cameras or camera modules or a compound-eye imaging device which is configured by combining one image sensor (imaging element) and an MLA.

For the compound-eye imaging device which employs a plurality of independent cameras or camera modules, it is difficult to obtain a target characteristic of a compound-eye imaging device suited to the number of used cameras due to a characteristic difference between the cameras or the camera modules.

Also, the compound-eye imaging device which is configured by combining one image sensor (imaging element) and an MLA has a large area of an imaging element chip by ensuring a chip space between facets for controlling the flare of a covering sidewall or a covering shield sidewall between facets. For this reason, when improvement of an imaging characteristic is attempted, the cost increases.

Therefore, by manufacturing the compound-eye imaging unit 110 as shown in the 22nd to 24th embodiments of the present technology, it is possible to manufacture a suitable compound-eye imaging device. In this manner, it is possible to lower the cost of a compound-eye imaging device, and to make a thinner and smaller compound-eye imaging device.

25. 25th Embodiment

A 25th embodiment of the present technology shows an example of an imaging device in which a plurality of compound-eye imaging units are arranged side by side and an image is taken.
[Configuration Example of Imaging Device]

Figure 52:
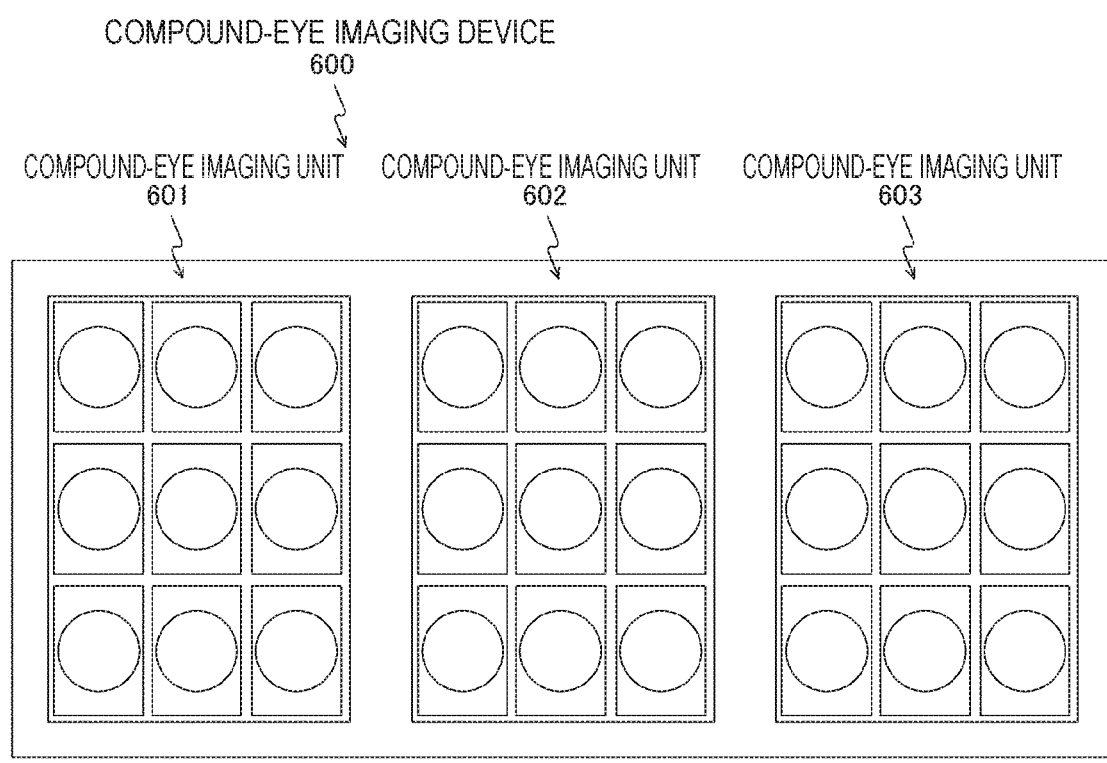
FIG. 52 is a top view showing an appearance of a compound-eye imaging device 600 in accordance with a 25th embodiment of the present technology.

FIG. 52 is a top view showing an appearance of a compound-eye imaging device 600 in accordance with the 25th embodiment of the present technology.

The compound-eye imaging device 600 is an imaging device manufactured by tiling a plurality of compound-eye imaging units 601 to 603. Also, the compound-eye imaging device 600 is an imaging device in which the plurality of compound-eye imaging units 601 to 603 are arranged side by side and an image is taken.

FIG. 52 shows an example in which the three compound-eye imaging units 601 to 603 are disposed to be arranged side by side, but two or four or more compound-eye imaging units may be disposed to be arranged side by side.

Here, it is assumed that, when there are a large number of facets in order to improve a sensitivity of a compound-eye imaging device, the area of the compound-eye imaging device becomes large and it is difficult to manufacture one compound-eye imaging device. Therefore, as shown in the 25th embodiment of the present technology, it is possible to manufacture a suitable compound-eye imaging device by manufacturing the plurality of compound-eye imaging units 601 to 603 through tiling.

26. 26th Embodiment

A 26th embodiment of the present technology shows an example of manufacturing a compound-eye imaging device by varying surfaces or angles at which facets or a plurality of compound-eye imaging units are arranged side by side.
[Configuration Example of Imaging Device]

Figure 53:
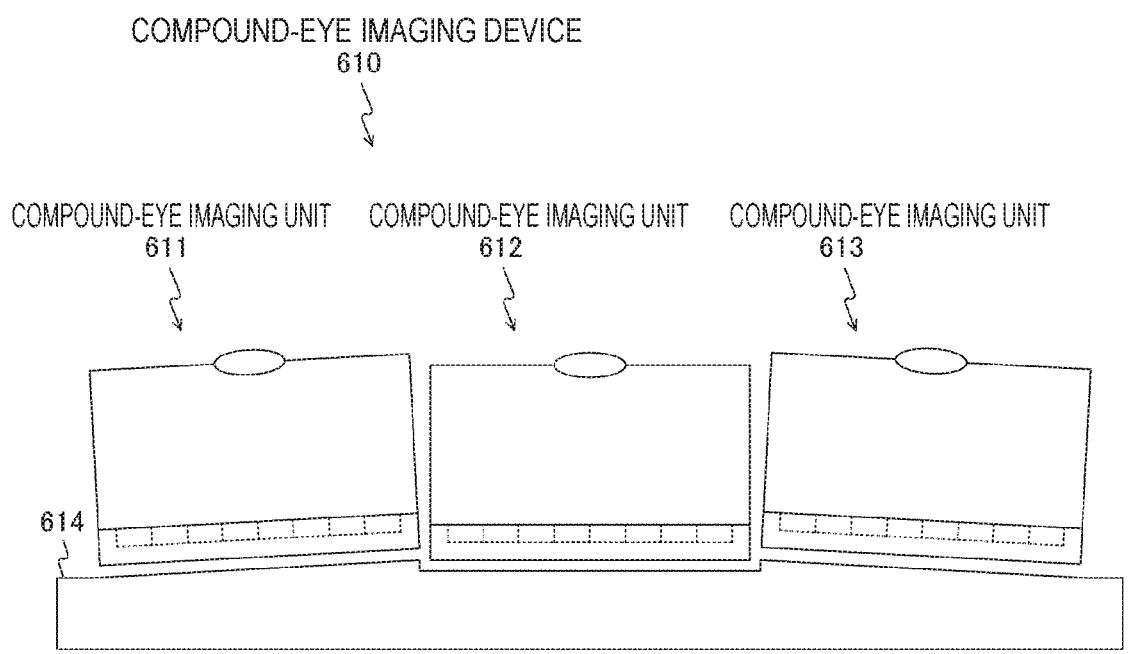
FIG. 53 is a cross-sectional view showing a cross section of a compound-eye imaging device 610 in accordance with a 26th embodiment of the present technology.

FIG. 53 is a cross-sectional view showing a cross section of a compound-eye imaging device 610 in accordance with the 26th embodiment of the present technology.

The compound-eye imaging device 610 is a compound-eye imaging device manufactured by varying surfaces or angles at which facets or a plurality of compound-eye imaging units 611 to 613 are arranged side by side. For example, as shown in FIG. 53, it is possible to dispose a plurality of compound-eye imaging units 611 to 613 by varying an angle on a reference surface 614.

In other words, it is possible to manufacture an imaging device not by making reference surfaces on which a plurality of compound-eye imaging units are arranged side by side on the same plane or at the same angle but by varying surfaces or angles at which the plurality of compound-eye imaging units are arranged side by side in accordance with the plurality of compound-eye imaging units.

FIG. 53 shows an example of disposing the three compound-eye imaging units 611 to 613 to be arranged side by side, but this can also be the same for a case in which a plurality of facets are disposed to be arranged side by side. Also, two or four or more compound-eye imaging units (or facets) may be disposed to be arranged side by side.

Here, an arrangement surface also includes the meaning of a curved surface. Also, this is the same for the case in which a compound-eye imaging device is manufactured through tiling.

In a conventional compound-eye imaging device, reference surfaces on which facets are arranged side by side are the same plane and at the same angle, and thus it is supposed that it will be difficult to widen the angle of view of the compound-eye imaging device by using images of regions in which optical axes of facets are centered. Therefore, in the 26th embodiment of the present technology, a compound-eye imaging device is manufactured by varying surfaces or angles at which facets or a plurality of compound-eye imaging units are arranged side by side. Accordingly, it is possible to widen the angle of view of the compound-eye imaging device. In other words, it is possible to achieve an increase in the angle of view and enlargement of an acquisition range of each piece of information.

27th Embodiment

A 27th embodiment of the present technology shows an example of bending a compound-eye imaging device by affixing the thinned-down compound-eye imaging device to a reference surface or of varying optical axes of facets by varying reference surfaces of the facets.
[Configuration Example of Imaging Device]

Figure 54:
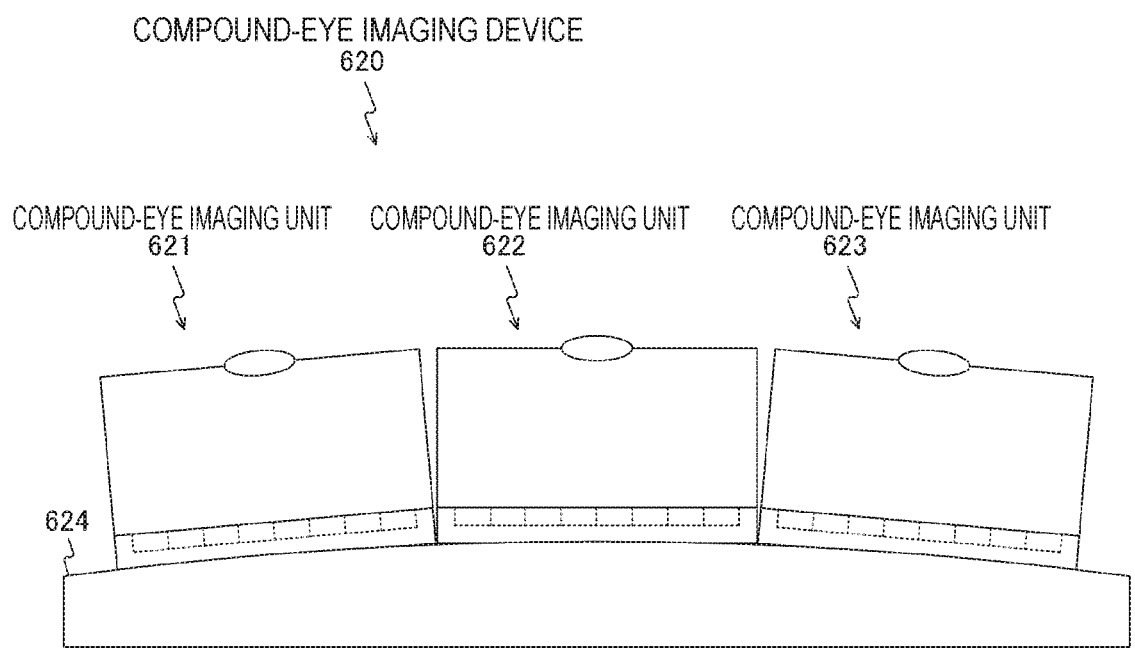
FIG. 54 is a cross-sectional view showing a compound-eye imaging device 620 in accordance with a 27th embodiment of the present technology.

FIG. 54 is a cross-sectional view showing a compound-eye imaging device 620 in accordance with the 27th embodiment of the present technology.

The compound-eye imaging device 620 is a compound-eye imaging device which is bent by affixing a plurality of thinned-down compound-eye imaging units 621 to 623 to a reference surface 624, or in which reference surfaces of facets vary and optical axes of the facets vary.

28. 28th Embodiment

A 28th embodiment of the present technology shows an example of detecting the sizes of deviation, slope, and distortion between relative positions of facets (or a plurality of compound-eye imaging units) when the facets (or the plurality of compound-eye imaging units) are connected. For example, facets (or a plurality of compound-eye imaging units) are connected by a flexible material, and sensors (for example, pressure sensors) are installed between the facets (or the plurality of compound-eye imaging units).

Then, based on output signals of the sensors, it is possible to determine the sizes of deviation, slope, and distortion between relative positions of the facets (or the plurality of compound-eye imaging units).

[Configuration Example of Imaging Device]

Figure 55:
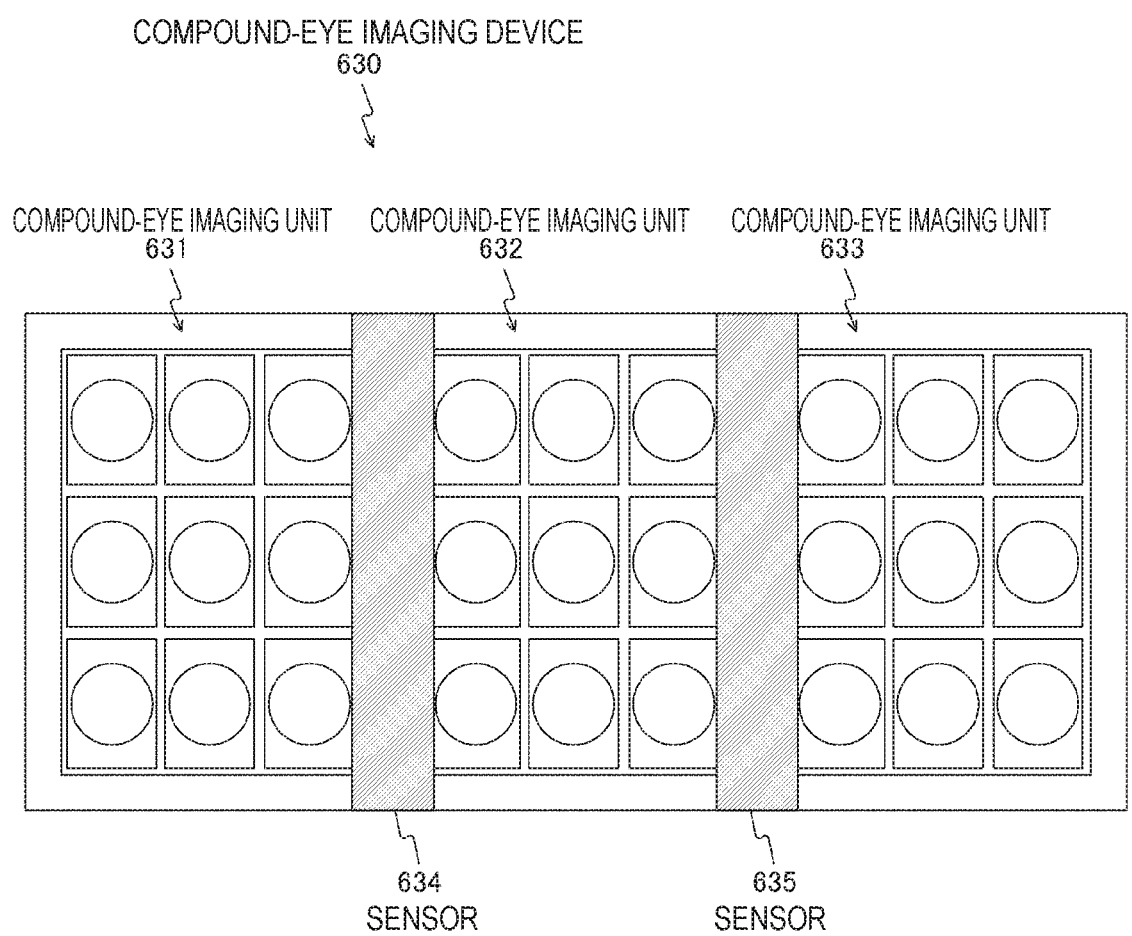
FIG. 55 is a top view showing a compound-eye imaging device 630 in accordance with a 28th embodiment of the present technology.

FIG. 55 is a top view showing a compound-eye imaging device 630 in accordance with the 28th embodiment of the present technology.

The compound-eye imaging device 630 includes a plurality of compound-eye imaging units 631 to 633 and sensors 634 and 635. The sensors 634 and 635 are examples of a detection unit stated in the claims.

The sensors 634 and 635 are sensors which detect the sizes of deviation, slope, and distortion between relative positions of facets (or a plurality of compound-eye imaging units). For example, it is possible to use pressure sensors (for example, a pressure sensor employing an organic material) as the sensors 634 and 635. The pressure sensor employing an organic material is, for example, a sensor in which a resistance of a sensor unit is changed by pressure and a current of an accessed field effect transistor (FET) is changed.

When this pressure sensor employing an organic material is used, it is possible to detect the sizes of deviation, slope, and distortion between relative positions of facets (or a plurality of compound-eye imaging units) by detecting a change in the current of the FET.

Also, when it is possible to detect the sizes of deviation, slope, and distortion between relative positions of facets (or a plurality of compound-eye imaging units), it is possible to obtain consecutive images of a wide angle of view by calculating correlations between output images of the respective facets and stitching the images together.

Here, in a conventional compound-eye imaging device, positions of facets (or a plurality of compound-eye imaging units) are fixed, and it is not possible to change the states of deviation, slope, and distortion between relative positions of the facets. In contrast, in the 28th embodiment of the present technology, sensors (for example, pressure sensors) are installed between facets (or a plurality of compound-eye imaging units). Accordingly, it is possible to detect the sizes of deviation, slope, and distortion between relative positions of the facets (or the plurality of compound-eye imaging units), and to use these values. Also, it is possible to improve the usability of the compound-eye imaging device.

29. 29th Embodiment

A 29th embodiment of the present technology shows an example in which a light-receiving surface of an imaging element has a recessed shape in each facet. In other words, an example in which imaging surfaces of facets are not flat surfaces but have a curved shape is shown.

[Configuration Example of Compound-Eye Imaging Unit]

Figure 56:
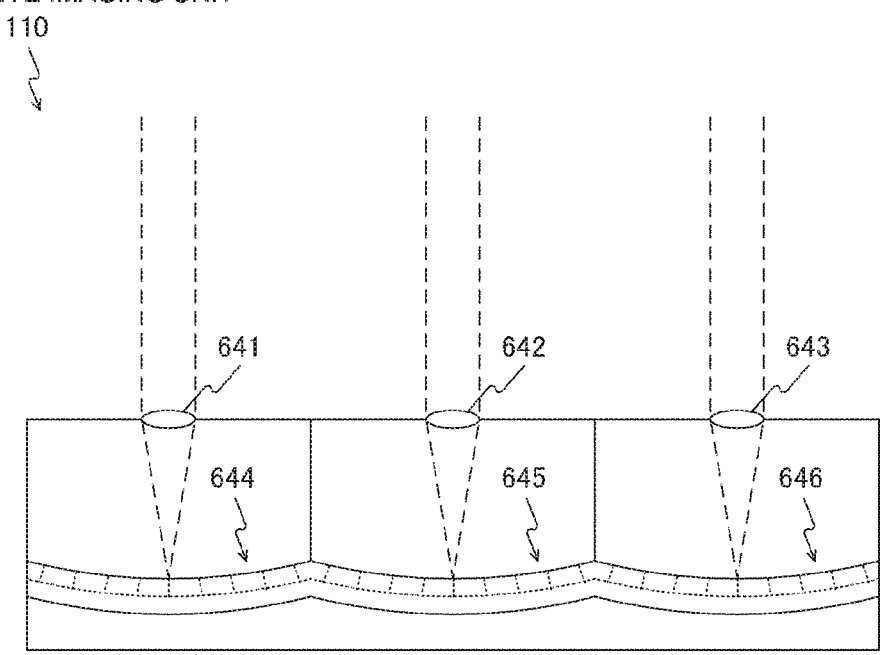
FIG. 56 is a cross-sectional view showing a cross section of a compound-eye imaging unit 110 in accordance with a 29th embodiment of the present technology.
Figure 57:
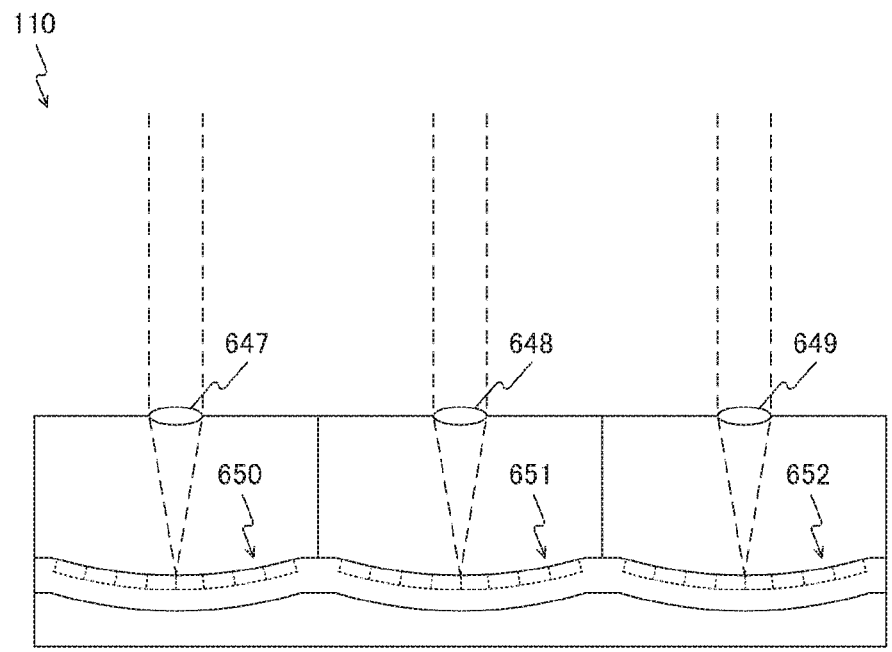
FIG. 57 is a cross-sectional view showing a cross section of a compound-eye imaging unit 110 in accordance with a 29th embodiment of the present technology.
Figure 58:
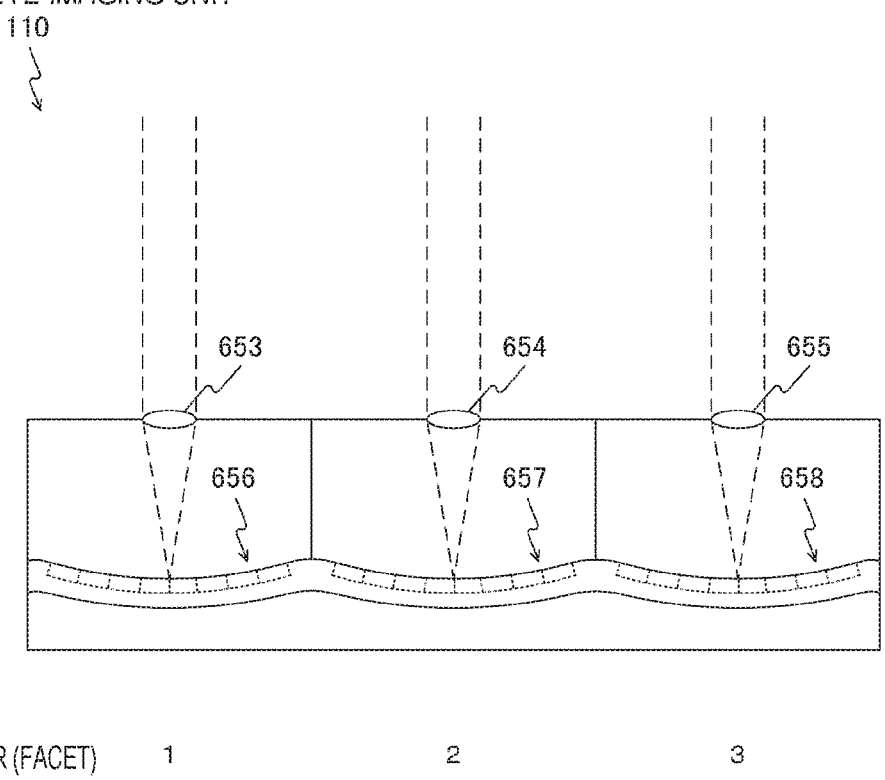
FIG. 58 is a cross-sectional view showing a cross section of a compound-eye imaging unit 110 in accordance with a 29th embodiment of the present technology.

FIG. 56 to FIG. 58 are cross-sectional views showing cross sections of a compound-eye imaging unit 110 in accordance with the 29th embodiment of the present technology. FIG. 56 simply shows an example of a case in which the areas of curved surfaces of facets are maximized. FIG. 57 simply shows an example of a case in which the vicinity of a boundary of each facet is in the shape of a flat surface. FIG. 58 simply shows an example of a case in which the vicinity of a boundary of each facet is a smooth curved surface.

FIG. 56 shows relationships between facet lenses 641 to 643 and imaging surfaces 644 to 646 of facets. As shown in FIG. 56, almost an entire imaging surface of a facet can have a curved shape. For example, almost an entire imaging surface to a boundary between imaging surfaces of adjacent facets (for example, the boundary between the imaging surfaces 644 and 645 of the facets) can have a curved shape. Rectangles of dotted lines in imaging surfaces 644 to 646 of the facets indicate pixels. However, FIG. 56 simply shows a small number of pixels for convenience of description. Also, this is the same for FIG. 57 and FIG. 58.

Here, the curved shape is, for example, a recessed shape of a side opposite to an incident side of light. As the simplest example, a portion of a sphere obtained by cutting the sphere with a plane intersecting the sphere (in other words, a spherical crown) can be a recessed shape (curved shape). Also, as an example of obtaining the best effect by way of a recessed shape, it is possible to make a light-receiving surface in a shape which fits an image curvature characteristic of a lens in each facet. For example, as a shape for rendering an imaging characteristic best, it is possible to determine the curved shape based on a focal surface of a lens resulting from an image curvature characteristic of the lens. Also, for example, for a case of improving an imaging characteristic of a subject which is relatively close to a lens and the like cases, the curved shape can be determined based on the distance from a facet lens to an image formation surface (in other words, image distance). Also, for example, a bowl shape using a paraboloid of revolution (for example, a parabola (parabola or parabolic) shape) can be the curved shape.

FIG. 57 shows relationships between facet lenses 647 to 649 and imaging surfaces 650 to 652 of facets. As shown in FIG. 57, the vicinity of a boundary between imaging surfaces of facets in the imaging surfaces of the facets can have a planar shape (a flat surface which is approximately at right angles to an optical axis direction), and other regions can have a curved shape. For example, the vicinity of a boundary between imaging surfaces of adjacent facets (for example, the vicinity of a boundary between the imaging surfaces 650 and 651 of facets) can have a planar shape.

FIG. 58 shows relationships between facet lenses 653 to 655 and imaging surfaces 656 to 658 of facets. As shown in FIG. 58, the vicinity of a boundary between imaging surfaces of facets in the imaging surfaces of the facets can have a smooth curved surface shape, and other regions can have a curved shape. For example, the vicinity of a boundary between imaging surfaces of adjacent facets (for example, the vicinity of a boundary between the imaging surfaces 656 and 657 of facets) can have a curved surface shape.

Here, imaging surfaces of facets constituting compound-eye imaging devices shown in the first to 28th embodiments of the present technology are flat surfaces. In this way, when imaging surfaces of facets are flat surfaces, lenses become thick or the number of lenses is increased in order to perform aberration correction, and thus the thickness of a compound-eye imaging device increases. In particular, in the case of a wide angle, the thickness or the number of lenses further increases, and the thickness of a compound-eye imaging device may further increase. For this reason, due to an increase in the thickness or the number of lenses, the cost of a compound-eye imaging device increases.

Therefore, in the 29th embodiment of the present technology, imaging surfaces of facets are not flat surfaces but are in a curved shape. Accordingly, it is possible to cut down the number of lenses. Also, it is possible to thin down the thickness of lenses. Also, it is possible to thin down the thickness of a compound-eye imaging device. Also, it is possible to reduce the cost of lenses. Also, it is difficult for light and darkness to occur, and thus a shading characteristic can be improved.

FIG. 56 to FIG. 58 show examples in which the vicinity of a boundary has three different types of shapes, but the vicinity of a boundary may have other shapes.

30. 30th Embodiment

A 30th embodiment of the present technology shows an example of an imaging element composed of a plurality of layers for acquiring color information varying at identical pixels in the incident direction of light. In other words, an example of a compound-eye imaging device employing vertical spectrum imaging elements is shown.

Here, when light passes through silicon, a characteristic of the silicon varies in accordance with wavelength. For example, light of a short wavelength (for example, blue (B)) to a long wavelength (for example, red (R)) is absorbed by the silicon in order of a light-receiving surface side of the silicon to the deepest side. Therefore, the 30th embodiment of the present technology shows an example in which, by using this characteristic, respective photodiodes split light in order of blue (B), green (G), and red (R) and acquire optical signals. A vertical spectrum can be described in other words as, for example, a spectrum in an optical axis direction, a spectrum in the depth direction of an imaging element, a spectrum in the thickness direction of an imaging element, a spectrum in the incident direction of light, and the like.

[Configuration Example of Compound-Eye Imaging Unit]

FIG. 59 to FIG. 62 are cross-sectional views showing cross sections of a compound-eye imaging unit 110 in accordance with the 30th embodiment of the present technology.

Figure 59:
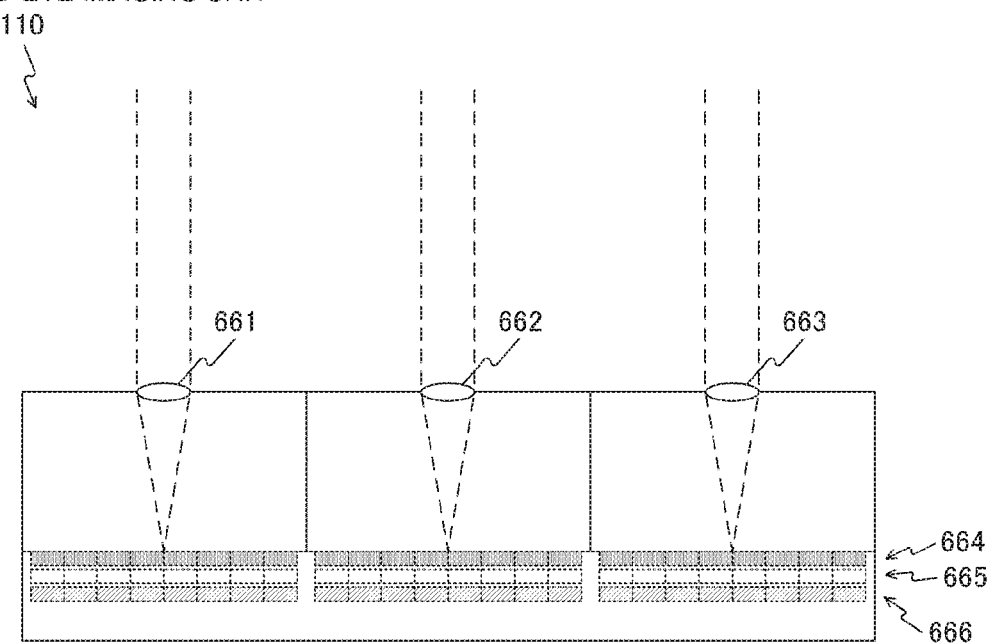
FIG. 59 is a cross-sectional view showing a cross section of a compound-eye imaging unit 110 in accordance with a 30th embodiment of the present technology.
Figure 60:
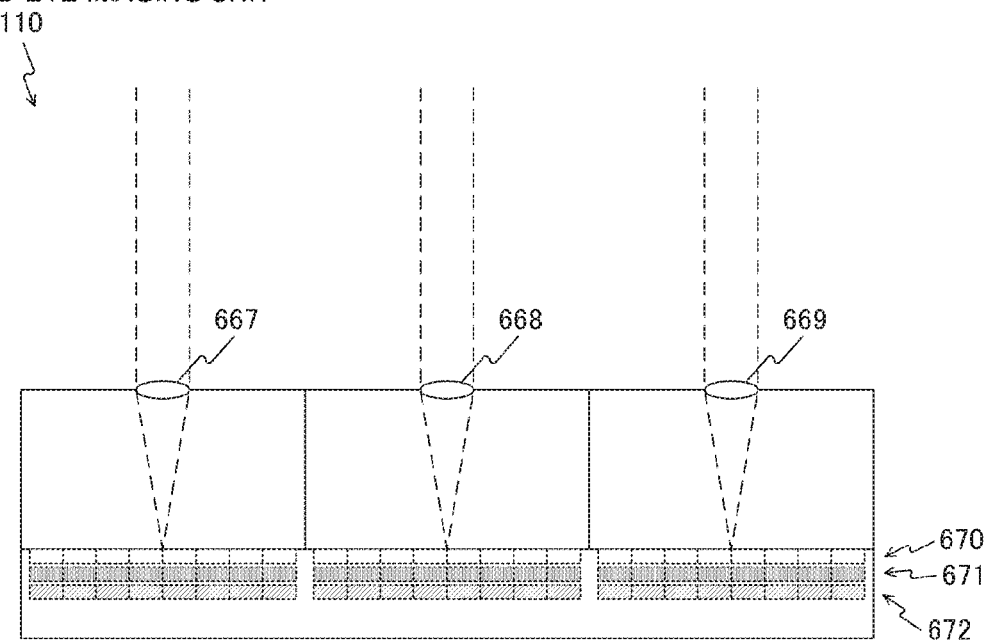
FIG. 60 is a cross-sectional view showing a cross section of a compound-eye imaging unit 110 in accordance with a 30th embodiment of the present technology.

FIG. 59 shows an example of a case of splitting light in order of B, G and R beginning with an incident side of the light. FIG. 60 shows an example of a case of splitting light in order of G, B, and R beginning with an incident side of the light.

Figure 61:
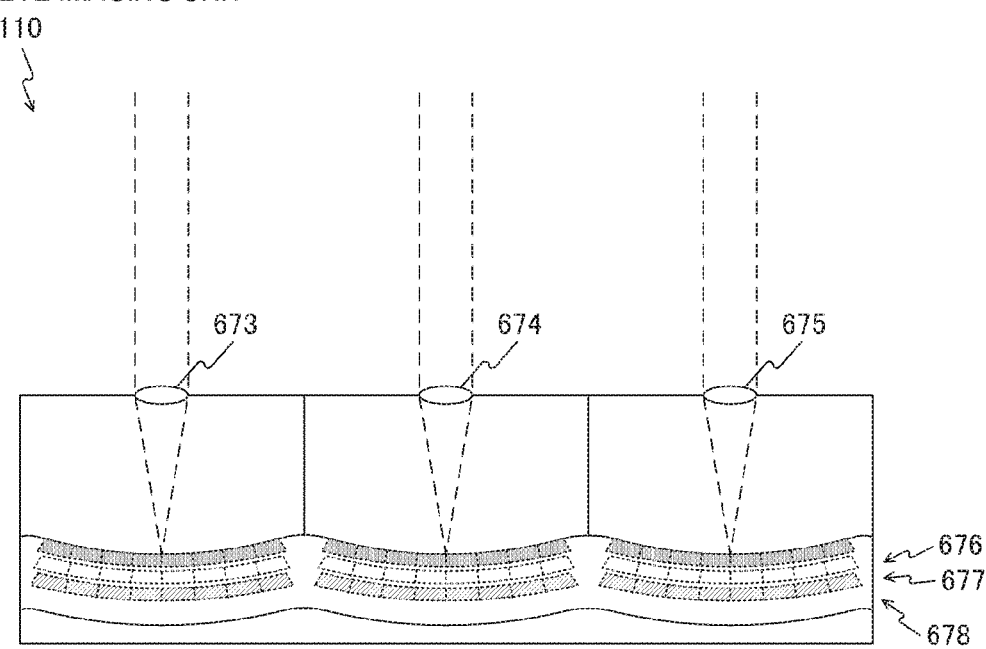
FIG. 61 is a cross-sectional view showing a cross section of a compound-eye imaging unit 110 in accordance with a 30th embodiment of the present technology.

FIG. 61 shows an example of a case in which light is split in order of B, G, and R beginning with an incident side of the light and imaging surfaces are curved. FIG. 61 shows an example of a case in which a boundary surface of each facet is a smooth curved surface (an example corresponding to FIG. 58).

Figure 62:
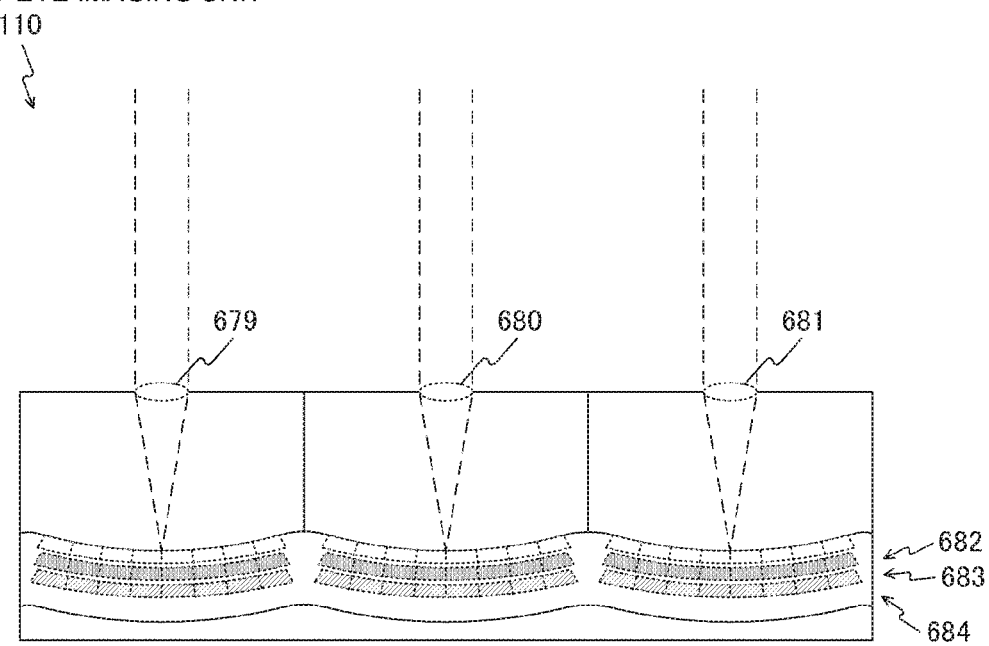
FIG. 62 is a cross-sectional view showing a cross section of a compound-eye imaging unit 110 in accordance with a 30th embodiment of the present technology.

FIG. 62 shows an example of a case in which light is split in order of G, B, and R beginning with an incident side of the light and imaging surfaces are curved. FIG. 62 shows an example of a case in which a boundary surface of each facet is a smooth curved surface (an example corresponding to FIG. 58).

FIG. 59 shows relationships between facet lenses 661 to 663 and a first layer (B layer) 664, a second layer (G layer) 665, and a third layer (R layer) 666.

As described above, when light passes through silicon, a characteristic of the silicon varies in accordance with wavelength. Therefore, by using this characteristic, the first layer (B layer) 664, the second layer (G layer) 665, and the third layer (R layer) 666 are disposed in a vertical direction, and different pieces of color information of identical positions (identical pixels) are separated. In other words, a sensor of three layers (the first layer (B layer) 664, the second layer (G layer) 665, and the third layer (R layer) 666) is used. Also, the first layer (B layer) 664, the second layer (G layer) 665, and the third layer (R layer) 666 are disposed in each facet.

Here, the first layer (B layer) 664 which is the uppermost layer is a layer reacting to intensities of all of RGB light, absorbs B which has a short wavelength, and causes RG to pass through the first layer (B layer) 664. For this reason, B light which has a short wavelength does not arrive at the second layer (G layer) 665 which is the intermediate layer. In FIG. 59, the first layer (B layer) 664 is represented by rectangles which have insides colored grey.

Also, the second layer (G layer) 665 which is the intermediate layer is a layer reacting to intensities of RG light excluding B having a short wavelength, absorbs G, and causes R to pass through the second layer (G layer) 665. For this reason. GB light does not arrive at the third layer (R layer) 666 which is the lowermost layer. In FIG. 59, the second layer (G layer) 665 is represented by rectangles which have insides colored white.

Also, the third layer (R layer) 666 which is the lowermost layer is a layer reacting to an intensity of R light excluding GB absorbed by the first layer (B layer) 664 and the second layer (G layer) 665. In FIG. 59, the third layer (R layer) 666 is represented by rectangles in which diagonal lines are added.

In this way, signal processing is performed by using each value of acquired RGB. For example, the signal processing unit 120 (FIG. 9) can calculate a value of G by subtracting the product of a value of R acquired by the third layer (R layer) 666 which is the lowermost layer and a coefficient based on the light absorption characteristic of silicon and a device structure characteristic from a value of RG acquired by the second layer (G layer) 665 which is the intermediate layer. Also, for example, the signal processing unit 120 (FIG. 9) can calculate a value of B by subtracting the product of the value of RG acquired by the second layer (G layer) 665 which is the intermediate layer and the coefficient based on the light absorption characteristic of silicon and the device structure characteristic from a value of RGB acquired by the first layer (B layer) 664 which is the uppermost layer. In this way, it is possible to use about 100% of the energy of light received by each pixel, and thus picture quality can be further improved.

Rectangles of dotted lines in the three layers (the first layer (B layer) 664, the second layer (G layer) 665, and the third layer (R layer) 666) indicate pixels. However, FIG. 59 simply shows a small number of pixels for convenience of description. Also, this is the same for FIG. 60 to FIG. 62.

FIG. 60 shows relationships between facet lenses 667 to 669 and a first layer (G layer) 670, a second layer (B layer) 671, and a third layer (R layer) 672. FIG. 60 is approximately the same as FIG. 59 except that the positions of G layer and B layer are exchanged in the example shown in FIG. 59. In this way, a change in the sequence of color separation is enabled by using, for example, a material other than silicon in a photoelectric conversion film, and the like.

FIG. 61 shows relationships between facet lenses 673 to 675 and a first layer (B layer) 676, a second layer (G layer) 677, and a third layer (R layer) 678. FIG. 61 shows an example in which imaging surfaces of the three layers (the first layer (B layer) 676, the second layer (G layer) 677, and the third layer (R layer) 678) are bent in each facet. In other words, an example of a case in which the disposition of the three layers corresponds to the example shown in FIG. 59 and curved shapes correspond to the example shown in FIG. 58 is shown.

FIG. 62 shows relationships between facet lenses 679 to 681 and a first layer (G layer) 682, a second layer (B layer) 683, and a third layer (R layer) 684. FIG. 62 shows an example in which imaging surfaces of the three layers (the first layer (G layer) 682, the second layer (B layer) 683, and the third layer (R layer) 684) are bent in each facet. In other words, an example of a case in which the disposition of the three layers corresponds to the example shown in FIG. 60 and curved shapes correspond to the example shown in FIG. 58 is shown.

FIG. 61 and FIG. 62 show examples in which a boundary surface of each facet is a smooth curved surface (examples corresponding to FIG. 58), but other examples (for example, the examples shown in FIG. 56 and FIG. 57) may be applied.

Figure 63:
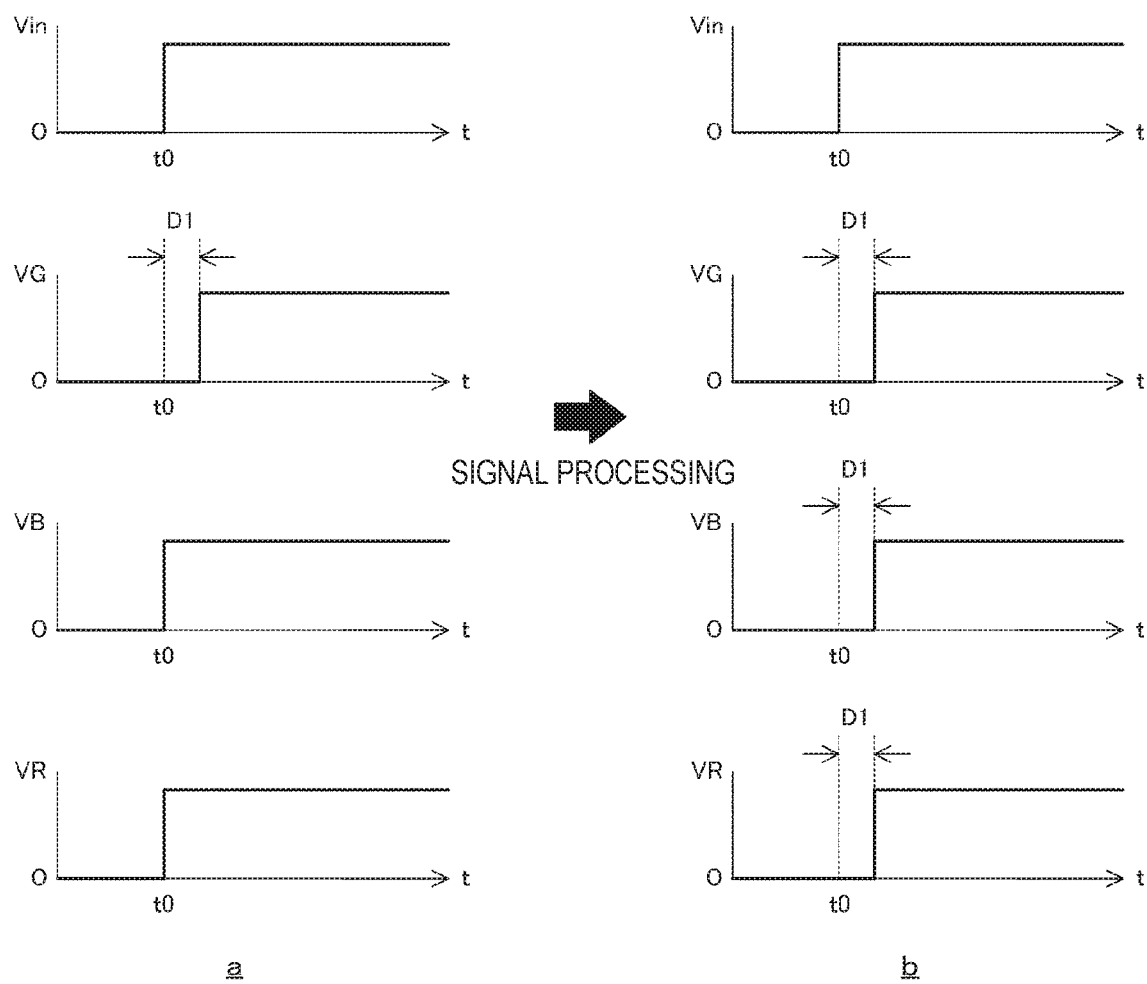
FIG. 63 is a diagram showing an output waveform of an image signal output from the compound-eye imaging unit 110 in accordance with the 30th embodiment of the present disclosure.
Figure 64:
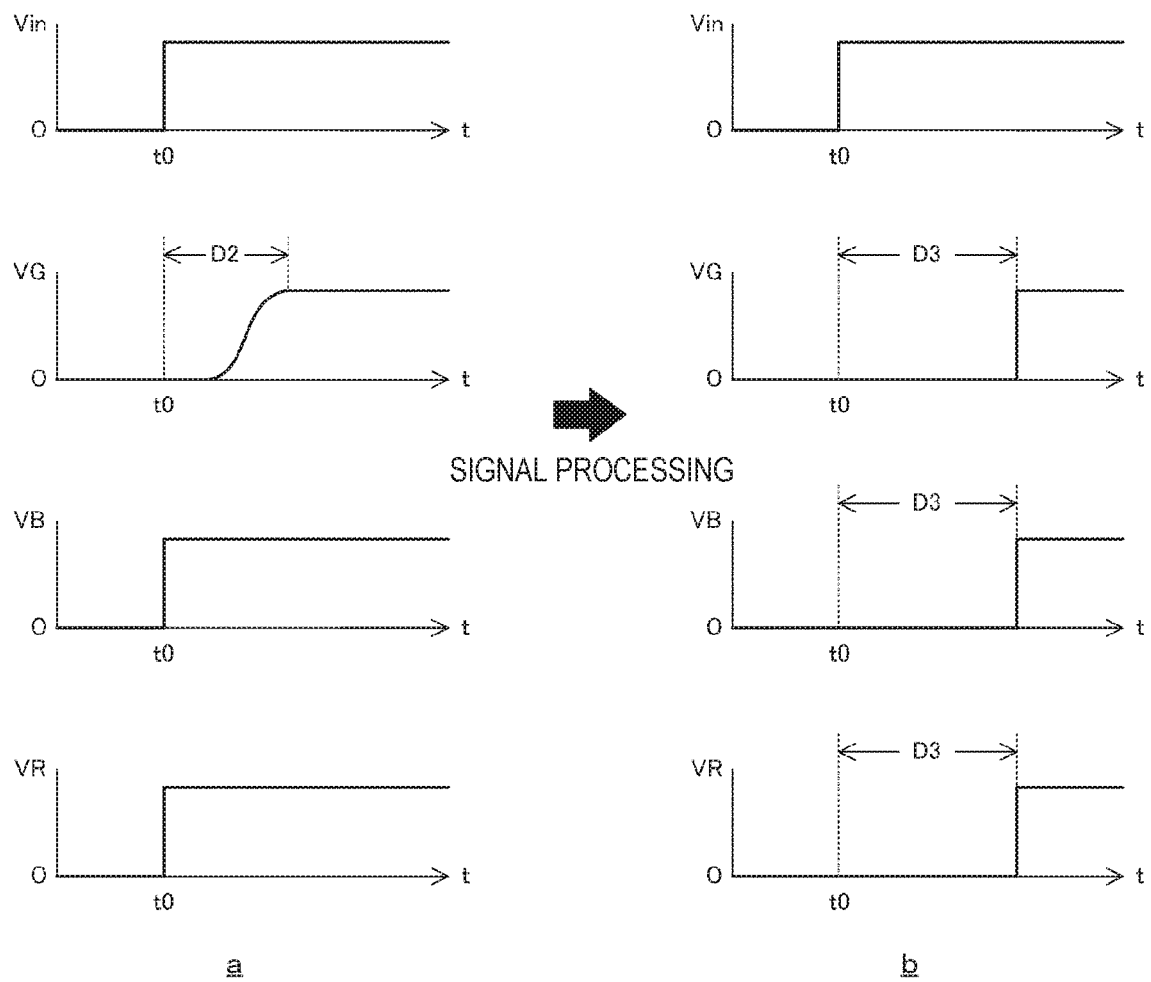
FIG. 64 is a diagram showing an output waveform of an image signal output from the compound-eye imaging unit 110 in accordance with the 30th embodiment of the present disclosure.

FIG. 63 and FIG. 64 are diagrams showing output waveforms of image signals output from the compound-eye imaging unit 110 in accordance with the 30th embodiment of the present technology. In graphs shown in FIG. 63 and FIG. 64, vertical axes represent an input value of an optical signal and an output value of an image signal, and horizontal axes are time axes.

FIG. 63 shows examples of input and output waveforms. In other words, relationships between input waveforms of optical signals and output waveforms of image signals are shown. Specifically, an example of a case in which a delay occurs in a part of outputs of an image signal with regard to an input of light is shown.

a of FIG. 63 shows relationships between an input waveform of an optical signal and output waveforms of image signals when correction through signal processing is not performed.

For example, as shown in FIG. 59 to FIG. 62, when three layers are disposed to be stacked in an optical axis direction, there is a difference between characteristics of photoelectric conversion layers. In this way, when there is a difference between characteristics of photoelectric conversion layers, it is supposed that a response of an image signal to an input of an optical signal will be delayed. For example, it is assumed that an input value of light is Vin and output values of respective image signals of G, B, and R with respect to this input value Vin of light are VG, VB, and VR, respectively. In this case, for example, as shown in a of FIG. 63, the output values VB and VR of an image signal simultaneously (or approximately simultaneously) respond to the input value Vin of light, but a response of the output value VG of the image signal may be delayed. In this case, a delay time of the output value VG of the image signal is D1.

In such a case, by performing suitable signal processing, it is possible to uniformize response times of the output values VB, VR, and VG of the image signal as shown in b of FIG. 63. For example, signal processing for changing timings of the output values VB and VR of the image signal (delaying by the delay time D1) is performed so that the output values VB and VR of the image signal are fitted to the delayed output value VG of the image signal.

FIG. 64 shows examples of input and output waveforms. In other words, relationships between input waveforms of optical signals and output waveforms of image signals are shown. Specifically, an example of a case in which a delay occurs in a part of outputs of an image signal with regard to an input of light and additionally a high frequency is attenuated is shown.

For example, as shown in a of FIG. 64, the output values VB and VR of an image signal simultaneously (or approximately simultaneously) respond to the input value Vin of light, but a response of the output value VG of the image signal may be delayed, and additionally, a high frequency may be attenuated. In this case, a delay time of the output value VG of the image signal is D2.

Even in such a case, by performing suitable signal processing, it is possible to uniformize waveforms of output values of an image signal as shown in b of FIG. 64. For example, a waveform of the delayed output value VG of the image signal is corrected, and the output values VB and VR of image processing are corrected based on the output value VG of delayed image processing. For example, timings of the output values VB and VR of the image signal are delayed by a delay time D3 so that the output values VB and VR of the image signal are fitted to the output value VG of delayed image processing. In other words, signal processing for changing waveforms and timings of the output values VG, VB, and VR of image processing is performed.

In this way, when there is a difference between characteristics of photoelectric conversion layers, the signal processing unit 120 performs correction through signal processing, and thus it is possible to output a suitable image. Accordingly, picture quality can be improved.

Here, when there is a difference between characteristics of photoelectric conversion layers, it is also supposed that information for correcting the difference between characteristics of the photoelectric conversion layers (correction information) will be acquired in advance and the correction information will be used. For example, the compound-eye imaging device 100 retains the correction information, and the signal processing unit 120 performs correction through signal processing based on the retained correction information, so that a signal in accordance with a purpose can be output. Therefore, FIG. 65 shows an example in which the correction information is retained and used.

Figure 65:
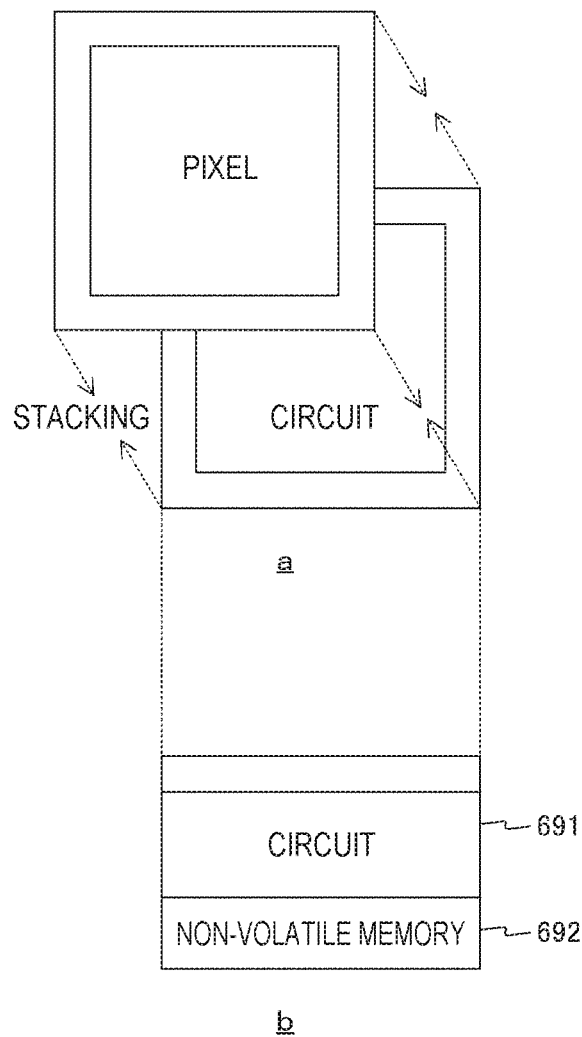
FIG. 65 is a diagram showing a configuration example of a stacked image sensor used in the compound-eye imaging unit 110 in accordance with the 30th embodiment of the present disclosure.

FIG. 65 is a diagram showing a configuration example of a stacked image sensor used in a compound-eye imaging unit 110 in accordance with the 30th embodiment of the present technology. Also, a of FIG. 65 shows a perspective view of the stacked image sensor (back-illuminated CMOS image sensor), and b of FIG. 65 shows a side view of the stacked image sensor (back-illuminated CMOS image sensor).

A stacked image sensor (back-illuminated CMOS image sensor) shown in FIG. 65 is obtained by providing a non-volatile memory 692 in a circuit 691 of the stacked image sensor (back-illuminated CMOS image sensor) shown in FIG. 43. Also, the stacked image sensor shown in FIG. 65 is the same as the example shown in FIG. 43 except that the non-volatile memory 692 is provided.

In this way, it is possible to newly provide and use the non-volatile memory 692 for retaining correction information. FIG. 65 shows an example of providing the non-volatile memory 692, but correction information may be retained in another retaining unit and used. Also, correction information may be retained in an external memory and used.

In this way, it is possible to retain correction information in a compound-eye imaging unit having a stacked or multichip configuration, perform suitable signal processing based on the correction information, and output a signal in accordance with a purpose.

Here, the first to 29th embodiments of the present technology show examples of the compound-eye imaging device 100 employing a horizontal spectrum imaging element. For example, when a horizontal spectrum imaging element is used, a color filter for splitting incident light in a horizontal direction is necessary. There is a risk that light will not pass through this color filter, the energy of this light not passing through the color filter will not contribute to photoelectric conversion, and the sensitivity of a compound-eye imaging device will be degraded. For this reason, it is important to improve the sensitivity.

Therefore, in the 30th embodiment of the present technology, a vertical spectrum imaging element is used. Accordingly, it is possible to use the energy of incident light in photoelectric conversion without wasting the energy. Also, a compound-eye imaging device can have a high sensitivity. Also, it is possible to improve a color shift of a subject on the move. Also, signal processing is performed in a compound-eye imaging device, and thus it is possible to extremely reduce a variation between entities. Also, a user can use a compound-eye imaging device without feeling discomfort due to a characteristic difference between photoelectric conversion materials.

31. 31st Embodiment

A 31st embodiment of the present technology shows an example of a compound-eye imaging device including an image distance adjusting unit for adjusting an image distance of each facet. Specifically, an example of a compound-eye imaging device having an actuator function is shown. An image distance is the distance from a lens to an image formation surface.
[Configuration Example of Compound-Eye Imaging Unit]
FIG. 66 to FIG. 70 are cross-sectional views showing cross sections of a compound-eye imaging unit 110 in accordance with the 31st embodiment of the present technology.

Figure 66:
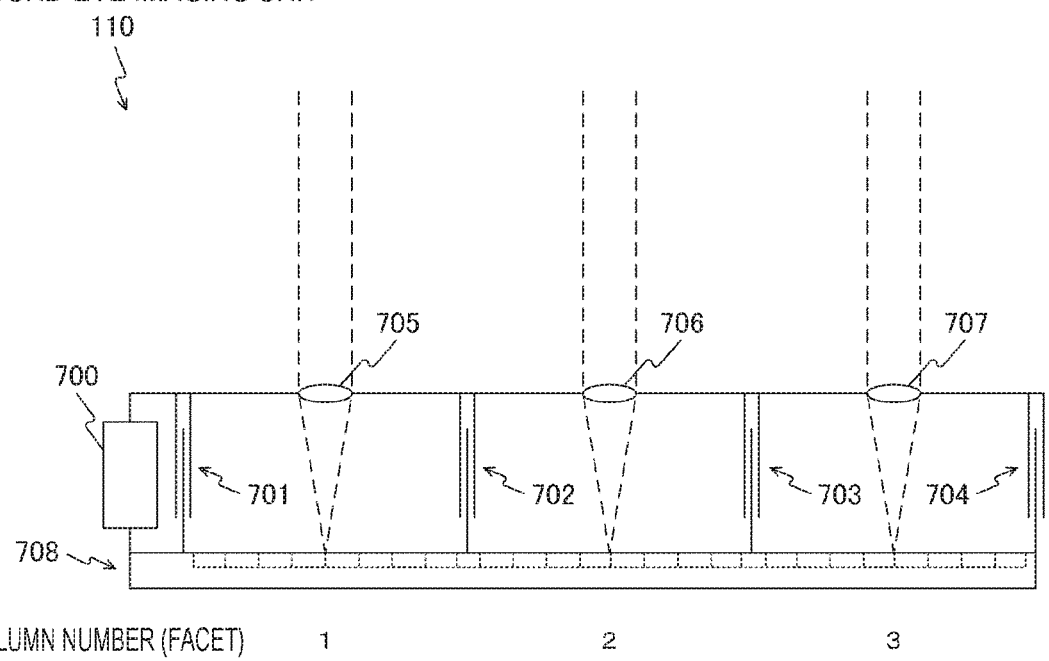
FIG. 66 is a cross-sectional view showing a cross section of a compound-eye imaging unit 110 in accordance with a 31st embodiment of the present technology.
Figure 67:
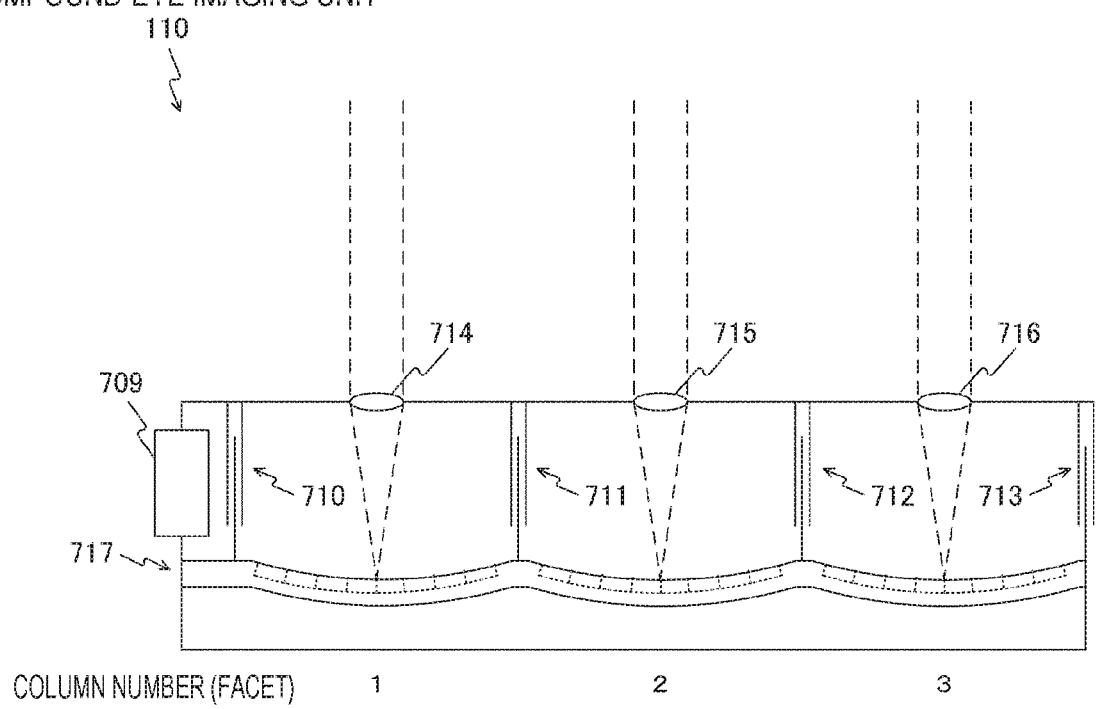
FIG. 67 is a cross-sectional view showing a cross section of a compound-eye imaging unit 110 in accordance with a 31st embodiment of the present technology.

FIG. 66 shows an example of a compound-eye imaging device including an actuator. FIG. 67 shows an example of a case in which an actuator is included and imaging surfaces are curved. Also, FIG. 67 shows an example of a case in which a boundary surface of each facet is a smooth curved surface (an example corresponding to FIG. 58).

Figure 68:
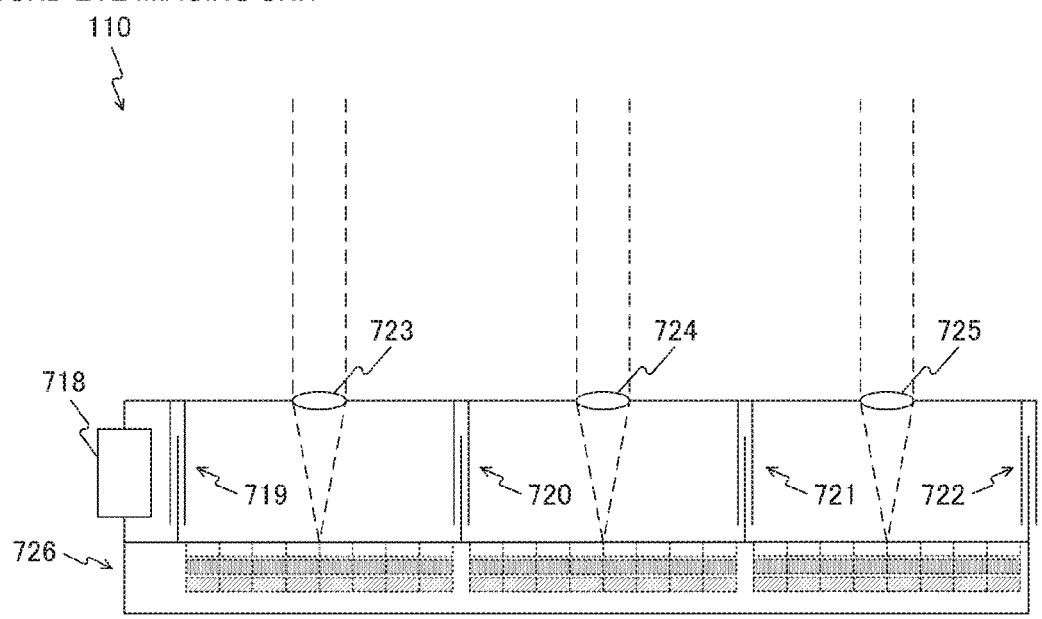
FIG. 68 is a cross-sectional view showing a cross section of a compound-eye imaging unit 110 in accordance with a 31st embodiment of the present technology.
Figure 69:
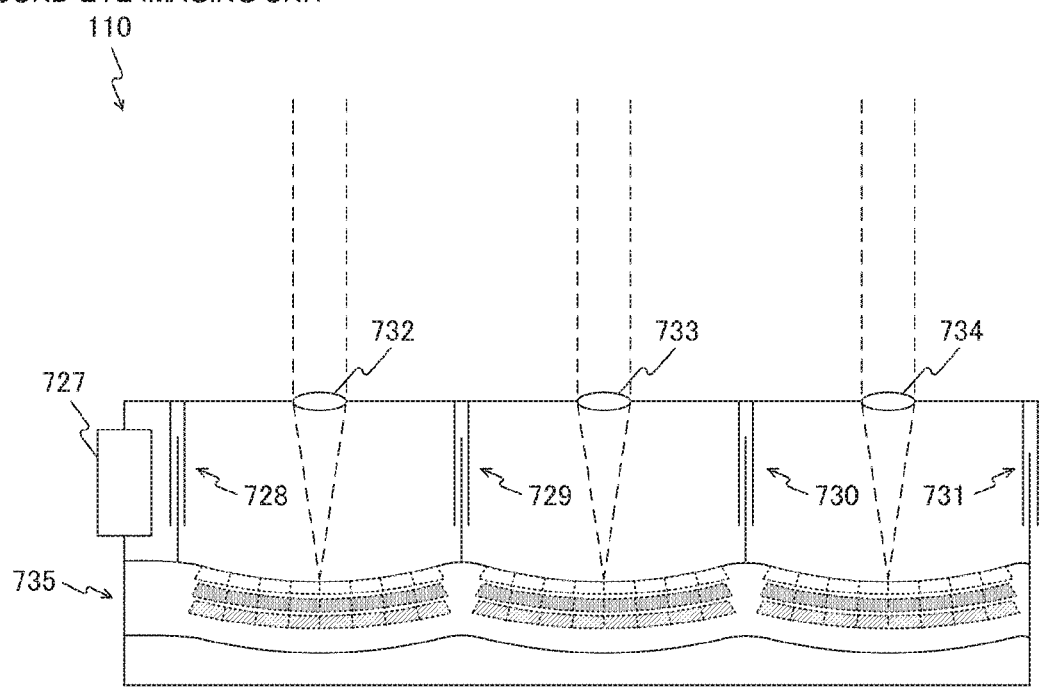
FIG. 69 is a cross-sectional view showing a cross section of a compound-eye imaging unit 110 in accordance with a 31st embodiment of the present technology.

FIG. 68 shows an example of a case in which light is split in order of G, B, and R beginning with an incident side of the light (an example corresponding to FIG. 60). FIG. 69 shows an example of a case in which light is split in order of G, B, and R beginning with an incident side of the light and imaging surfaces are curved. Also, FIG. 69 shows an example of a case in which a boundary surface of each facet is a smooth curved surface (an example corresponding to FIG. 62).

FIG. 66 shows relationships among an actuator 700, movable members 701 to 704, facet lenses 705 to 707, and an imaging element 708 of each facet.

The actuator 700 is an image distance adjusting element which is provided on a substrate including the imaging element 708 of each facet. Also, the actuator 700 is controlled by the control unit 130 (shown in FIG. 9). Also, the movable members 701 to 704 are members that can support the facet lens 701 to 703 and move the facet lens 701 to 703 in an optical axis direction in accordance with movement of the actuator 700.

In this way, the actuator 700 moves the facet lens 701 to 703 and adjusts the focusing position of each facet.

As the actuator 700, for example, it is possible to use a piezoelectric element that can move the facet lenses 705 to 707 by repeating expansion and contraction at high and low speeds. As this piezoelectric element, for example, it is possible to use an element in which displacement occurs when a voltage is applied (a piezo element).

Rectangles of dotted lines in the imaging element 708 of each facet indicate pixels. However, FIG. 66 simply shows a small number of pixels for convenience of description. Also, this is the same for FIG. 67 and FIG. 69.

FIG. 67 shows relationships among an actuator 709, movable members 710 to 713, facet lenses 714 to 716, and an imaging element 717 of each facet. The example shown in FIG. 67 is approximately the same as the example shown in FIG. 66 except that a boundary surface of each facet is a smooth curved surface.

FIG. 68 shows relationships among an actuator 718, movable members 719 to 722, facet lenses 723 to 725, and an imaging element 726 of each facet. The example shown in FIG. 68 is approximately the same as the example shown in FIG. 66 except that an imaging element which splits light in order of G, B, and R vertically beginning with an incident side of the light is used.

FIG. 69 shows relationships among an actuator 727, movable members 728 to 731, facet lenses 732 to 734, and an imaging element 735 of each facet. The example shown in FIG. 69 is approximately the same as the example shown in FIG. 66 except that an imaging element splitting light in order of G, B, and R vertically beginning with an incident side of the light is used and imaging surfaces are curved.

Here, it is also supposed that information for adjusting the focusing position of each facet by using an actuator (focusing position information) will be acquired in advance and the focusing position information will be used. For example, the compound-eye imaging device 100 retains the focusing position information, and the control unit 130 (shown in FIG. 9) can control the actuator based on the retained focusing position information.

For example, it is possible to retain focusing position information in the non-volatile memory 692 shown in FIG. 65 and use the focusing position information.

In this way, by retaining and using focusing position information, it is possible to realize an imaging element that can give redundancy to the precision of a position between entities. Accordingly, it is possible to improve the performance of a compound-eye imaging device. Also, it is possible to cut down the cost for this improvement in performance. Also, it is possible to reduce the time for focusing in accordance with a subject. Also, it is possible to prevent the loss of unique information (focusing position information) of the compound-eye imaging device.

In this example, focusing position information is retained in the non-volatile memory 692 shown in FIG. 65, but focusing position information may be retained in another retaining unit and used. Also, focusing position information may be retained in an external memory and used.

Figure 70:
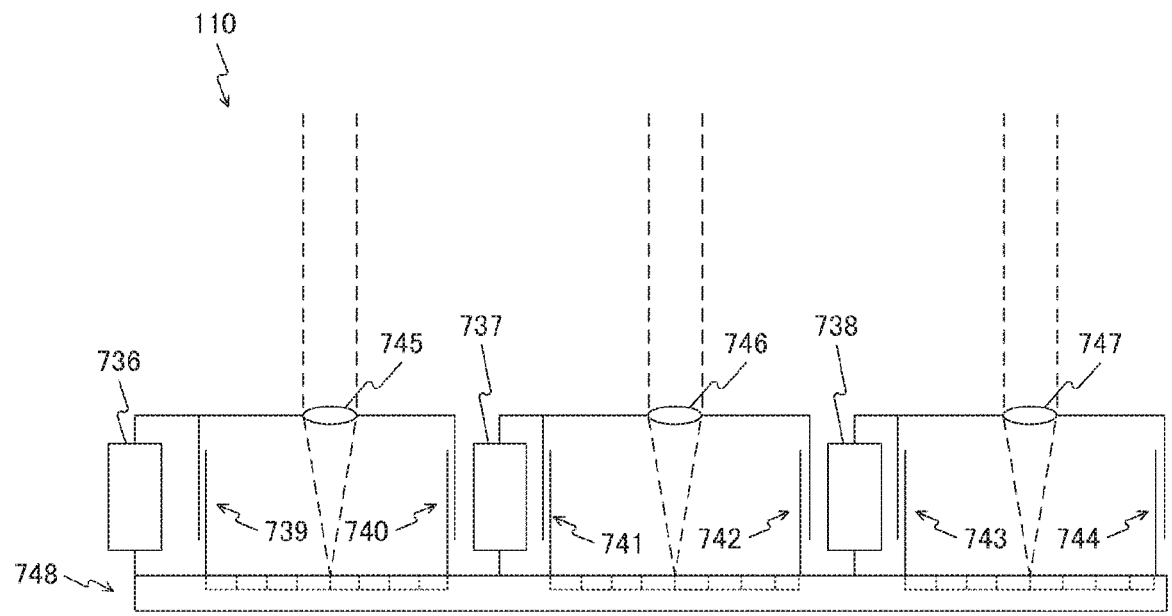
FIG. 70 is a cross-sectional view showing a cross section of a compound-eye imaging unit 110 in accordance with a 31st embodiment of the present technology.

FIG. 70 shows an example of a compound-eye imaging device including a plurality of actuators. In other words, an example of providing an actuator in each facet is shown. Specifically, FIG. 70 shows relationships among actuators 736 to 738, movable members 739 to 744, facet lenses 745 to 747, and an imaging element 748 of each facet.

In this way, by providing the actuators 736 to 738 to respective facets, it is possible to give redundancy to even a variation in the precision of a position when each facet is manufactured. Also, for each facet, it is possible to vary a target to which a focus position is fitted. In other words, it is possible to adjust a focusing position for each facet.

Here, a compound-eye imaging device having a fixed focus has a narrow focusing range including a short distance to an infinite distance. In particular, when a lens having a long focal length and a small f-number is used, a focusing range including a short distance to an infinite distance is narrower.

Therefore, the 31th embodiment of the present technology has an actuator function for adjusting an image distance.

Accordingly, it is possible to widen a focusing range including a short distance to an infinite distance. In particular, even when a lens having a long focal length and a small f-number is used, it is possible to widen a focusing range including a short distance to an infinite distance.

The actuators 700, 709, 718, 727, and 736 to 738 are examples of an image distance adjusting unit stated in the claims.

32. 32nd Embodiment

A 32nd embodiment of the present technology shows an example of a compound-eye imaging device changing focusing states of respective facets.
[Configuration Example of Compound-Eye Imaging Unit]

Figure 71:
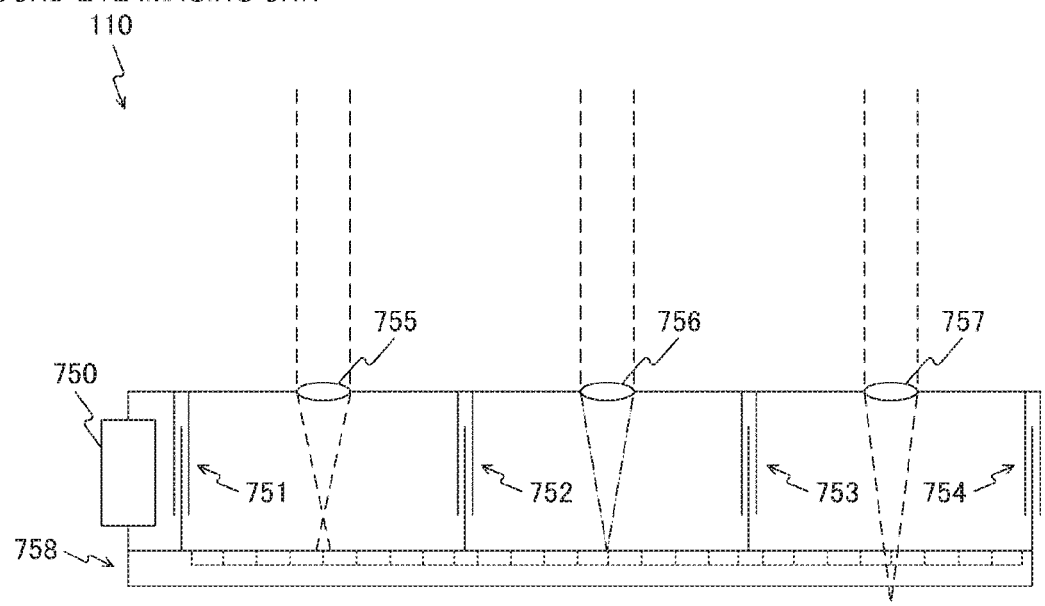
FIG. 71 is a cross-sectional view showing a cross section of a compound-eye imaging unit 110 in accordance with a 32nd embodiment of the present technology.
Figure 72:
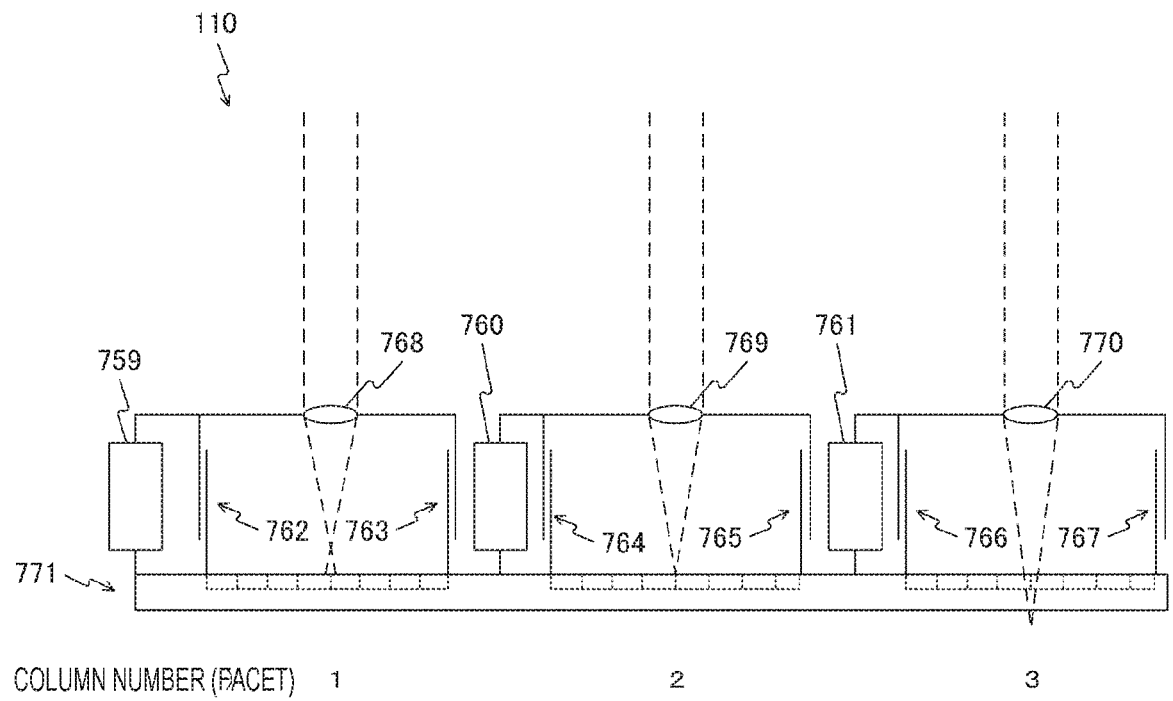
FIG. 72 is a cross-sectional view showing a cross section of a compound-eye imaging unit 110 in accordance with a 32nd embodiment of the present technology.

FIG. 71 and FIG. 72 are cross-sectional views showing cross sections of a compound-eye imaging unit 110 in accordance with the 32nd embodiment of the present technology.

FIG. 71 shows an example of a compound-eye imaging device in which focusing states of respective facets vary. Specifically, FIG. 71 shows relationships among an actuator 750, movable members 751 to 754, facet lenses 755 to 757, and an imaging element 758 of each facet. The example shown in FIG. 71 is approximately the same as the example shown in FIG. 66 except that focusing states of respective facets vary.

In other words, in FIG. 71, the facet lenses 755 to 757 whose respective facets have different focusing states are used. Accordingly, focusing positions of light (indicated by broken lines in FIG. 71) which is incident on the imaging element 758 of each facet through the facet lenses 755 to 757 are different.

FIG. 72 shows an example of a compound-eye imaging device which includes an actuator in each facet and varies a focusing state of each facet. In other words, an example of including a plurality of actuators is shown. Specifically, FIG. 72 shows relationships among actuators 759 to 761, movable members 762 to 767, facet lenses 768 to 770, and an imaging element 771 of each facet. The example shown in FIG. 72 is approximately the same as the example shown in FIG. 70 except that focusing states of respective facets vary.

Here, when photography is performed by using a compound-eye imaging device in which focusing states of facets are uniform, a subject present at a distance at which a focus is not set is captured as a totally blurred image in a range from a short distance to an infinite distance.

In contrast, in the 32th embodiment of the present technology, focusing states of respective facets vary, and thus a probability of there being an image in the best focus in accordance with a facet in a range from a short distance to an infinite distance is high. Accordingly, it is possible to avoid a state in which no focus is set.

Also, by providing a plurality of actuators to respective facets, it is possible to set an optimal focus for each facet in accordance with a situation. Accordingly, it is possible to increase the degree of freedom regarding focusing.

33. 33rd Embodiment

A 33rd embodiment of the present technology shows an example of a compound-eye imaging device which sets different focal lengths for respective facets.
[Configuration Example of Compound-Eye Imaging Unit]

Figure 73:
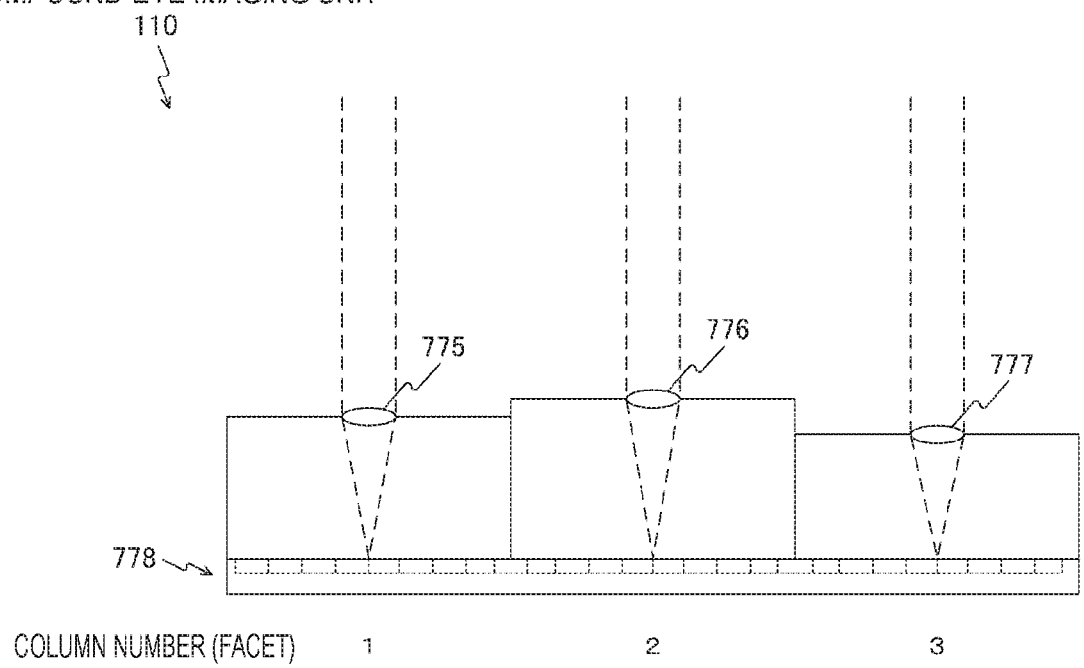
FIG. 73 is a cross-sectional view showing a cross section of a compound-eye imaging unit 110 in accordance with a 33rd embodiment of the present technology.
Figure 74:
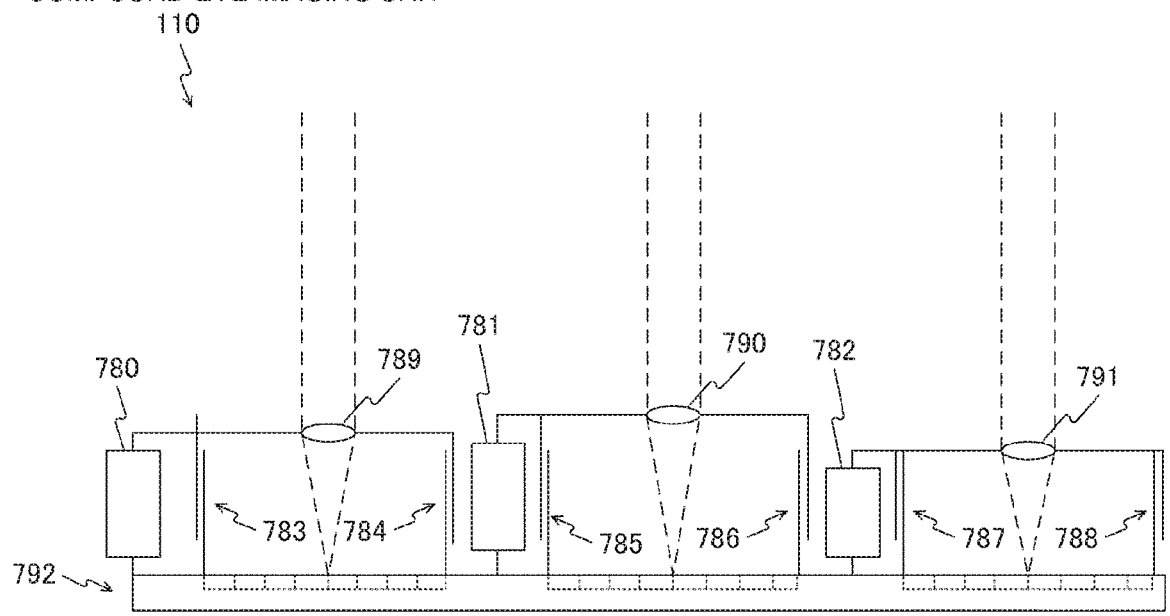
FIG. 74 is a cross-sectional view showing a cross section of a compound-eye imaging unit 110 in accordance with a 33rd embodiment of the present technology.

FIG. 73 and FIG. 74 are cross-sectional views showing cross sections of a compound-eye imaging unit 110 in accordance with the 33rd embodiment of the present technology.

FIG. 73 shows an example of a compound-eye imaging device in which focusing distances of respective facets vary. Specifically. FIG. 73 shows relationships between facet lenses 775 to 777 and an imaging element 778 of each facet.

In other words, in FIG. 73, the facet lenses 775 to 777 whose respective facets have different focusing distances are installed at heights (lengths in an optical axis direction) in accordance with respective focusing positions.

FIG. 74 shows an example of a compound-eye imaging device in which an actuator is provided in each facet and focusing distances of respective facets vary. In other words, an example of including a plurality of actuators is shown. Specifically, FIG. 74 shows relationships among actuators 780 to 782, movable members 783 to 788, facet lenses 789 to 791, and an imaging element 792 of each facet. The example shown in FIG. 74 is approximately the same as the example shown in FIG. 70 except that focusing distances of respective facets vary.

Here, when photography is performed by using a compound-eye imaging device in which focusing distances of facets are uniform, it is supposed that it will be difficult to obtain an image having a wide angle of view including a wide angle to telescopy.

In contrast, in the 33rd embodiment of the present technology, focusing distances vary at respective facets, and thus it is possible to obtain an image having a wide angle of view including a wide angle to telescopy.

Also, by providing a plurality of actuators to respective facets, it is possible to set an optimal focus for each facet in accordance with a situation. Accordingly, it is possible to increase the degree of freedom regarding focusing.

Accordingly, it is possible to generate an image which has a high resolution in a central portion, a low resolution in a peripheral portion, a wide angle of view, and the like.

34. 34th Embodiment

A 34th embodiment of the present technology shows an example of a compound-eye imaging device which retains and uses information about optical characteristics of facet optical systems (optical characteristic information) in signal processing.

Relationships between an output signal Sijkl of each facet and subject information Bijqr are shown in Formula 6 to Formula 11. In other words, Formula 6 to Formula 11 show examples of optical characteristics which are used in signal processing by the compound-eye imaging device 100) and a calculation example of a case of using the optical characteristics.

[Math. 1]

$$S_{ijkl} = f(a_{ijqr})B_{ijqr} \qquad \text{Formula 6}$$

$$B_{ijqr} = f(a_{ijqr})^{-1} S_{ijkl} \qquad \text{Formula 7}$$

$$g(b_{ijqr}) = f(a_{ijqr})^{-1} \qquad \text{Formula 8}$$

$$B_{ijqr} = g(b_{ijqr})S_{ijkl} \qquad \text{Formula 9}$$

$$S_{ijkl} = \sum_{q=1}^{M}\sum_{r=1}^{N} a_{ijklqr}B_{ijqr} \qquad \text{Formula 10}$$

$$B_{ijqr} = \sum_{k=1}^{M}\sum_{l=1}^{N} b_{ijklqr}S_{ijkl} \qquad \text{Formula 11}$$

Here, a function f is a function representing an optical characteristic. The function f is information which is already known or can be acquired. Also, an inverse function of the function f is g.

Also, i indicates a row number of a facet, and j indicates a column number of the facet. Also, k indicates a row number of a pixel in the facet, and l indicates a column number of the pixel in the facet.

Also, q indicates a vertical direction number of a subject, and r indicates a horizontal direction number of the subject.

Also, a ijklqr is a coefficient representing an optical characteristic. Also, M indicates the number of vertical pixels, and N indicates the number of horizontal pixels.

As described above, since the function f (a function representing an optical characteristic) is already known (or information that can be acquired), it is possible to calculate subject information with precision by calculating the inverse function g of the function f and processing raw data of an image sensor.

Specifically, for example, an inverse matrix of a matrix having the coefficient a which represents an optical characteristic is calculated. Then, as shown in Formula 11, it is possible to calculate subject information with precision through a calculation between an element b of the inverse matrix and the raw data of the image sensor.

Information about these optical characteristics (or inverse characteristics of optical characteristics) is retained in a compound-eye imaging device having a stacked or multichip configuration. Then, the signal processing unit 120 performs signal processing on the raw data output from the image sensor based on the retained optical characteristic information and can output a signal in accordance with a purpose. Accordingly, it is possible to improve picture quality.

For example, the optical characteristic information can be retained in the non-volatile memory 692 shown in FIG. 65, and used. Also, the optical characteristic information may be retained in another retaining unit and used, or may be retained in an external memory and used. The non-volatile memory 692 is an example of a retaining unit stated in the claims.

In this way, by applying unevenness in a manufacturing process, it is possible to reduce variations in picture quality between entities. In other words, since variations in picture quality between entities can be reduced, it is possible to make a management value in the manufacturing process robust, and to lower the manufacturing cost. Also, it is possible to stabilize an image generated by the compound-eye imaging device at high picture quality.

Also, since signal processing is performed in the compound-eye imaging device, a user can use the compound-eye imaging device without feeling discomfort due to a characteristic difference.

35. 35th Embodiment

A 35th embodiment of the present technology shows an example of a compound-eye imaging device which uses both signals before and after temporal response correction.

Figure 75:
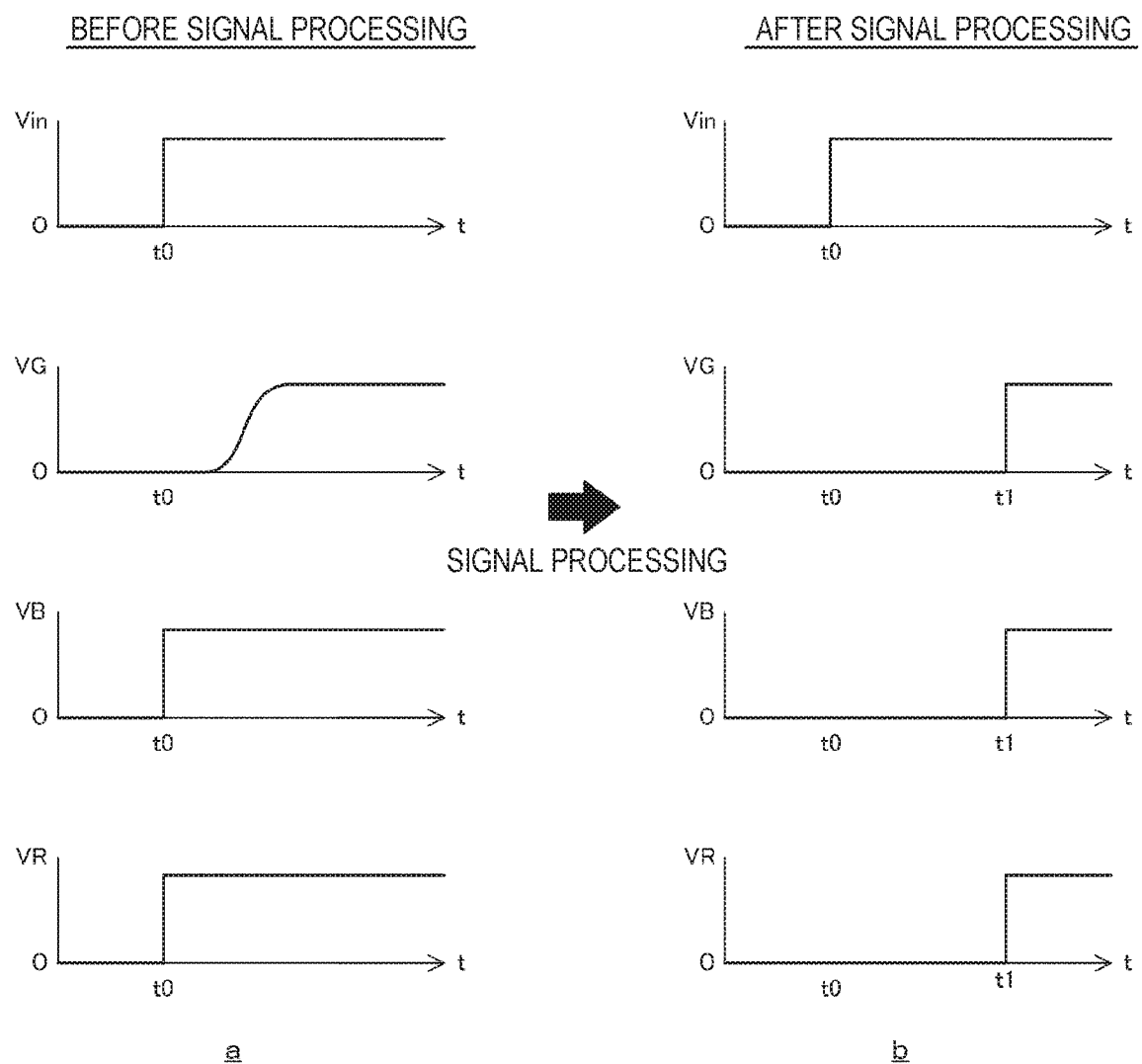
FIG. 75 is a diagram showing an output waveform of an image signal output from a compound-eye imaging unit 110 in accordance with a 35th embodiment of the present disclosure.

FIG. 75 is a diagram showing output waveforms of image signals output from the compound-eye imaging unit 110 in accordance with the 35th embodiment of the present technology. In graphs shown in FIG. 75, vertical axes represent an input value of an optical signal and an output value of an image signal, and horizontal axes are time axes.

a of FIG. 75 shows examples of input and output waveforms before temporal response correction is performed by the signal processing unit 120. b of FIG. 75 shows examples of input and output waveforms after the temporal response correction is performed by the signal processing unit 120.

For example, VG, VB, and VR before temporal response correction shown in a of FIG. 75 are used as outputs to the display unit 140 (shown in FIG. 9) to minimize latency (delay). On the other hand, VG, VB, and VR after the temporal response correction shown in b of FIG. 75 are used for recording to the storage unit 150 (shown in FIG. 9), so that a signal of high picture quality is recorded.

In this way, the signal processing unit 120 (shown in FIG. 9) generates images by using both image signals before temporal response correction processing is performed and image signals after the temporal response correction is performed among image signals generated by the imaging element. Specifically, the signal processing unit 120 generates a display target image based on the image signals before the temporal response correction processing is performed, and generates a recording target image based on the image signals after the temporal response correction is performed.

For example, when different photoelectric conversion materials are used in accordance with wavelength bands of light, there is a probability that the photoelectric conversion materials have a difference in response speed to an input of light. When signal processing (temporal response correction processing) for reducing this difference is performed, latency occurs in an output signal of a compound-eye imaging device. For this reason, when an image in which the latency has occurred is displayed on a monitor, there is a risk that camera tracking will be late for movement of a subject and it will be difficult to image the subject on the move.

Therefore, in the 35th embodiment of the present technology, two signals (a signal before temporal response correction and a signal after the temporal response correction) are used. Accordingly, even when latency occurs in an output signal of the compound-eye imaging device, it is possible to display a suitable image on a monitor. Accordingly, camera tracking will be suitably performed for movement of a subject. Also, it is possible to facilitate imaging of the subject on the move. Also, it is possible to display a suitable image on the monitor and record high picture quality image information as data.

36. 36th Embodiment

A 36th embodiment of the present technology shows an example of a compound-eye imaging device which corrects a difference in temporal response characteristics of photoelectric conversion.

Figure 76:
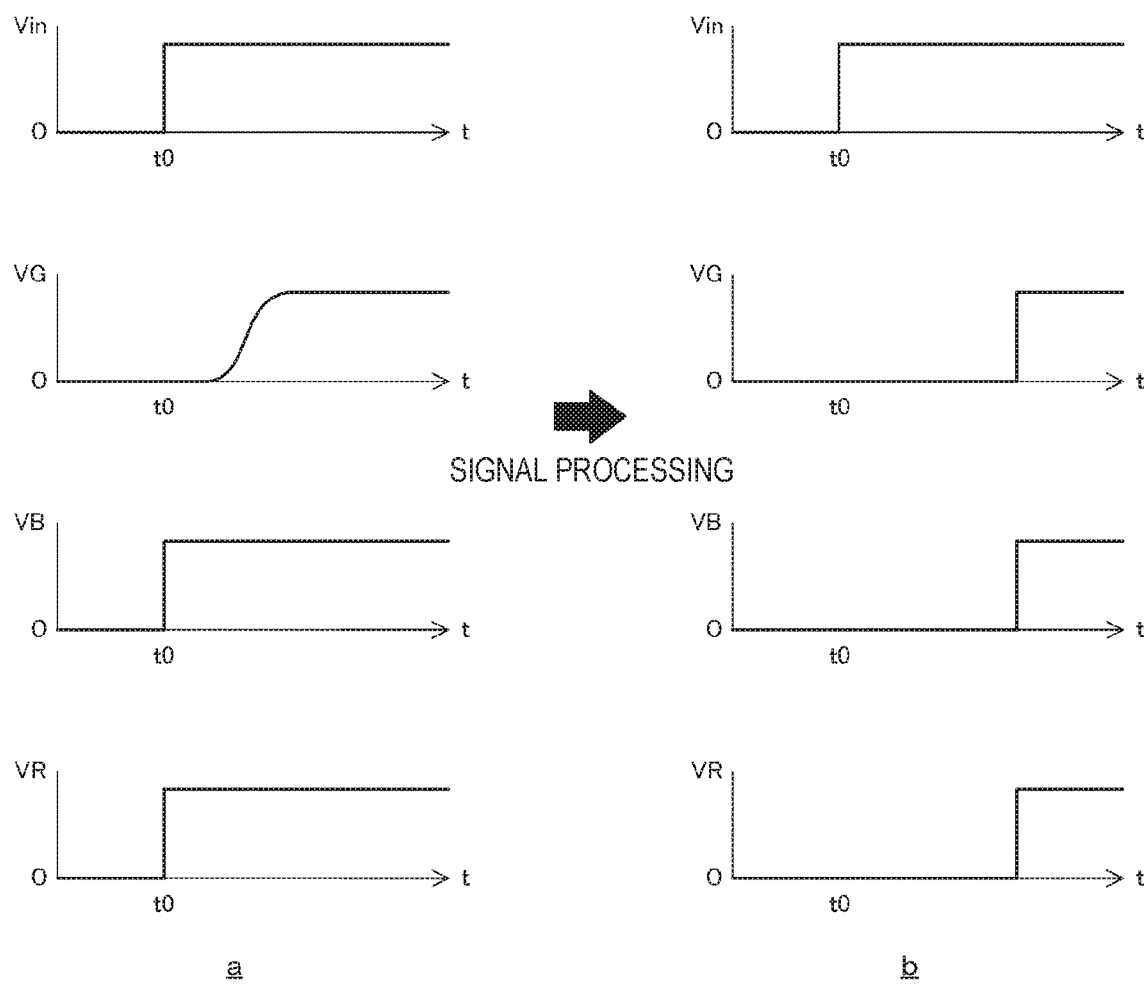
FIG. 76 is a diagram showing an output waveform of an image signal output from a compound-eye imaging unit 110 in accordance with a 36th embodiment of the present disclosure.

FIG. 76 is a diagram showing output waveforms of image signals output from the compound-eye imaging unit 110 in accordance with the 36th embodiment of the present technology. In graphs shown in FIG. 76, vertical axes represent an input value of an optical signal and an output value of an image signal, and horizontal axes are time axes.

a of FIG. 76 shows examples of input and output waveforms before signal processing by the signal processing unit 120. b of FIG. 76 shows examples of input and output waveforms after the signal processing by the signal processing unit 120.

For example, as shown in a of FIG. 76, it is assumed that output values VB and VR of an image signal approximately simultaneously respond to an input value Vin of an optical signal, but a response of an output value VG of the image signal is delayed, and further, a high frequency is attenuated.

In such a case, as shown in b of FIG. 76, it is possible to perform suitable signal processing, uniformize waveforms, and improve picture quality.

In this way, the signal processing unit 120 (shown in FIG. 9) corrects a difference resulting from temporal response characteristics of photoelectric conversion by the imaging element.

For example, when different photoelectric conversion materials are used in accordance with wavelength bands of light, there is a probability of the photoelectric conversion materials having a difference in response speed to an input of light. Due to this difference in response speed, there is a risk of picture quality of an image signal output from a compound-eye imaging device being degraded.

Therefore, in the 36th embodiment of the present technology, a difference in temporal response characteristics of photoelectric conversion is corrected. For example, in the case of using different photoelectric conversion materials in accordance with wavelength bands of light, and the like, it is supposed that the photoelectric conversion materials have a difference in response speed to an input of light. Even in such a case, by performing correction through signal processing, it is possible to improve picture quality of an image signal output from the compound-eye imaging device.

In this way, according to embodiments of the present technology, it is possible to improve a resolution of a compound-eye imaging device. Also, it is possible to thin down optical systems of the compound-eye imaging device. Also, it is possible to reduce the cost of the optical systems of the compound-eye imaging device. Also, it is possible to thin down the compound-eye imaging device.

The embodiments described above show examples for implementing the present technology, and details in the embodiments separately correspond to particular inventive details in the claims. Likewise, particular inventive details in the claims separately correspond to details which have the same name as the particular inventive details in the embodiments of the present technology. However, the present technology is not limited to the embodiments and can be implemented by making various modifications to the embodiments within a scope not departing from the gist of the present technology.

Effects stated in the present specification are only examples and are not limitative, and there may be other effects.

Additionally, the present technology may also be configured as below.

(1)

A compound-eye imaging device including:

a plurality of facet optical systems configured to be disposed to face a subject in a two dimensional shape;

an imaging element configured to include, in units of facets, a plurality of pixels receiving light concentrated by the facet optical systems and generating image signals; and a signal processing unit configured to generate an image corresponding to the subject based on image signals generated by the imaging element.

(2)

The compound-eye imaging device according to (1), wherein spatial pixel shift is performed by shifting positions of optical axes of the facet optical systems.

(3)

The compound-eye imaging device according to (1) or (2), wherein the signal processing unit corrects a shift of an image occurring in accordance with a color in a peripheral portion on a focal surface resulting from chromatic aberration of magnification of the facet optical systems.

(4)

The compound-eye imaging device according to any of (1) to (3), wherein at least one of the plurality of facet optical systems has a different optical characteristic from other facet optical systems.

(5)

The compound-eye imaging device according to any of (1) to (4), wherein an f-number of a facet optical system in a peripheral portion of the imaging element is smaller than f-numbers of other facet optical systems.

(6)

The compound-eye imaging device according to any of (1) to (5), wherein the compound-eye imaging device is configured with a wafer level camera module (WLCM) and a stacked compound-eye imaging device, and the number of the facets is increased than a threshold value.

(7)

The compound-eye imaging device according to any of (1) to (&), further including a control unit configured to perform at least one of stopping operation of a facet not in use among the plurality of facets and turning off an analog to digital converter (ADC) installed in the facet.

(8)

The compound-eye imaging device according to any of (1) to (7), wherein a distance sensor is provided in at least one of the plurality of facets.

(9)

The compound-eye imaging device according to any of (1) to (8), wherein at least one of the plurality of facets has a different polarization angle from other facets.

(10)

The compound-eye imaging device according to any of (1) to (9), wherein at least one of the plurality of facets has a different spectral sensitivity from other facets.

(11)

The compound-eye imaging device according to any of (1) to (10), wherein at least one of the plurality of facets is made of different material from other facets.

(12)

The compound-eye imaging device according to any of (1) to (11), wherein the imaging element is manufactured by arranging singulated chips side by side as one pseudo-chip and adding a multi lens array (MLA).

(13)

The compound-eye imaging device according to any of (1) to (11), wherein the imaging element is manufactured through tiling.

(14)

The compound-eye imaging device according to any of (1) to (13), wherein the imaging element includes a plurality of layers for acquiring color information varying at identical pixels in an incident direction of light.

(15)

The compound-eye imaging device according to any of (1) to (14), further including:

an image distance adjusting unit configured to adjust an image distance of each of the facets.

(16)

The compound-eye imaging device according to any of (1) to (15), wherein a focusing state of each of the facets is changed.

(17)

The compound-eye imaging device according to any of (1) to (16), wherein different focal lengths are set for the respective facets.

(18)

The compound-eye imaging device according to any of (1) to (17), further including:

a retaining unit configured to retain optical characteristic information about optical characteristics of the facet optical systems, wherein the signal processing unit generates the image corresponding to the subject by performing signal processing with the retained optical characteristic information.

(19)

The compound-eye imaging device according to any of (1) to (18), wherein the signal processing unit generates the image by using both an image signal before temporal response correction processing is performed and an image signal after the temporal response correction is performed among the image signals generated by the imaging element.

(20)

The compound-eye imaging device according to any of (1) to (19), wherein the signal processing unit corrects, with regard to the image signals generated by the imaging element, a difference resulting from temporal response characteristics of photoelectric conversion by the imaging element.

(21)

A compound-eye imaging device including:

a plurality of facet optical systems configured to be disposed to face a subject in a two dimensional shape;

an imaging element configured to include, in units of facets, a plurality of pixels receiving light concentrated by the facet optical systems and generating image signals;

color filters configured to be installed in the respective facets; and a signal processing unit configured to generate an image corresponding to the subject based on image signals generated by the imaging element, wherein an effective aperture of pixels is changed in each color filter.

(22)

A compound-eye imaging device in which a plurality of compound-eye imaging units including a plurality of facet optical systems disposed to face a subject in a two dimensional shape, an imaging element configured to include, in units of facets, a plurality of pixels receiving light concentrated by the facet optical systems and generating image signals, and a signal processing unit generating an image corresponding to the subject based on image signals generated by the imaging element are disposed to be arranged side by side.

(23)

The compound-eye imaging device according to (22), wherein the plurality of compound-eye imaging units are manufactured through tiling.

(24)

The compound-eye imaging device according to (22) or (23), wherein angles of installation surfaces on which the plurality of compound-eye imaging units are installed are changed at the respective compound-eye imaging units.

(25)

The compound-eye imaging device according to any of (22) to (24), wherein the plurality of compound-eye imaging units are installed to be curved and arranged side by side.

(26)

The compound-eye imaging device according to any of (22) to (25), wherein the plurality of compound-eye imaging units are installed to be arranged side by side, and wherein the compound-eye imaging device further includes a detection unit configured to detect at least one of deviation, slope, and distortion between relative positions of adjacent compound-eye imaging units among the plurality of compound-eye imaging units.

(27)

The compound-eye imaging device according to any of (1) to (26), wherein pupil correction is performed for each of the facets.

(28)

The compound-eye imaging device according to any of (1) to (27), wherein the facets are optically designed in accordance with a difference in focal length caused by chromatic aberration of the facet optical systems.

(29)

The compound-eye imaging device according to any of (1) to (28), wherein the facets are configured with a plurality of sub-facets.

(30)

The compound-eye imaging device according to any of (1) to (29), wherein at least one of the plurality of facet optical systems has a different structure than other facet optical systems (31)

The compound-eye imaging device according to any of (1) to (30), wherein the facet optical systems include:

a first facet optical system configured to set an incident angle of a main light beam to about 0 degrees; and a second facet optical system configured to set an incident angle of a main light beam to an angle that is other than 0 degrees and different from the incident angle of the first facet optical system.

(32)

The compound-eye imaging device according to (31), wherein the second facet optical system is a facet optical system disposed in a region of a peripheral portion of the imaging element (33)

The compound-eye imaging device according to any of (1) to (32), wherein the compound-eye imaging device is configured with a WLCM, and wherein the plurality of facets having different sensitivities are disposed in the WLCM.

(34)

The compound-eye imaging device according to any of (1) to (33), further including:

a control unit configured to perform control for changing a readout method from the imaging element in accordance with an imaging mode.

(35)

The compound-eye imaging device according to any of (1) to (34), wherein the imaging element is a global shutter complementary metal oxide semiconductor (CMOS) image sensor.

(36)

The compound-eye imaging device according to any of (1) to (34), wherein the imaging element is a back-illuminated CMOS image sensor.

(37)

The compound-eye imaging device according to any of (1) to (34), wherein the imaging element is a stacked image sensor.

(38)

The compound-eye imaging device according to (37), wherein the stacked image sensor produces parallel outputs of the plurality of facets.

(39)

The compound-eye imaging device according to any of (1) to (38), wherein at least one of the plurality of facets includes a sensor having a sensitivity to light other than visible light.

(40)

The compound-eye imaging device according to any of (1) to (39), wherein the compound-eye imaging device is configured with a WLCM, and wherein distance information is calculated by using parallax of the WLCM.

(41)

The compound-eye imaging device according to any of (1) to (40), wherein the imaging element is manufactured through tiling, thinning down, rewiring, and interlayer connection.

(42)

The compound-eye imaging device according to any of (1) to (41), wherein a light-receiving surface of the imaging element has a recessed shape in each of the facets.

(43)

The compound-eye imaging device according to (19), wherein the signal processing unit generates a display target image based on the image signals before the temporal response correction processing is performed, and generates a recording target image based on the image signals after the temporal response correction is performed.

REFERENCE SIGNS LIST 100 compound-eye imaging device
110 compound-eye imaging unit
120 signal processing unit
130 control unit
140 display unit
150 storage unit
160 operation receiving unit
170 wireless communication unit

What is claimed is:

1. A compound-eye imaging device comprising:
a plurality of facet optical systems configured to be disposed to face a subject in a two dimensional shape;
an imaging element configured to include, in units of a plurality of facets, a plurality of pixels receiving light concentrated by the plurality of facet optical systems and generating image signals, wherein a spatial pixel shift is performed by shifting positions of optical axes of the plurality of facet optical systems, and wherein optical axes of facets with green filters are shifted in opposite directions, and optical axes of facets with a red filter and a blue filter are shifted in a same direction; and
a signal processing unit configured to generate an image corresponding to the subject based on the image signals generated by the imaging element.

2. The compound-eye imaging device according to claim 1, wherein the signal processing unit corrects a shift of the image occurring in accordance with a color in a peripheral portion on a focal surface resulting from chromatic aberration of magnification of the plurality of facet optical systems.

3. The compound-eye imaging device according to claim 1, wherein at least one of the plurality of facet optical systems has a different optical characteristic from other facet optical systems.

4. The compound-eye imaging device according to claim 1, wherein the compound-eye imaging device is configured with a wafer level camera module (WLCM) and a stacked compound-eye imaging device, and
a number of the plurality of facets is greater than a threshold value.

5. The compound-eye imaging device according to claim 1, further comprising:
a control unit configured to perform at least one of stopping operation of a facet not in use among the plurality of facets and turning off an analog to digital converter (ADC) installed in the facet.

6. The compound-eye imaging device according to claim 1, wherein a distance sensor is provided in at least one of the plurality of facets.

7. The compound-eye imaging device according to claim 1, wherein at least one of the plurality of facets has a different polarization angle from other facets.

8. The compound-eye imaging device according to claim 1, wherein at least one of the plurality of facets has a different spectral sensitivity from other facets.

9. The compound-eye imaging device according to claim 1, wherein the imaging element is manufactured by arranging singulated chips side by side as one pseudo-chip and adding a multi lens array (MLA).

10. The compound-eye imaging device according to claim 1, wherein the imaging element is manufactured through tiling.

11. The compound-eye imaging device according to claim 1, wherein the imaging element includes a plurality of layers for acquiring color information varying at identical pixels in an incident direction of light.

12. The compound-eye imaging device according to claim 1, further comprising:
an image distance adjusting unit configured to adjust an image distance of each of the plurality of facets.

13. The compound-eye imaging device according to claim 1, wherein a focusing state of each facet is changed.

14. The compound-eye imaging device according to claim 1, wherein different focal lengths are set for respective facets.

15. The compound-eye imaging device according to claim 1, further comprising:
- a retaining unit configured to retain optical characteristic information about optical characteristics of the plurality of facet optical systems,
- wherein the signal processing unit generates the image corresponding to the subject by performing signal processing with the retained optical characteristic information.

16. The compound-eye imaging device according to claim 1, wherein the signal processing unit generates the image by using both an image signal before temporal response correction processing is performed and an image signal after the temporal response correction processing is performed among the image signals generated by the imaging element.

17. The compound-eye imaging device according to claim 1, wherein the signal processing unit corrects, with regard to the image signals generated by the imaging element, a difference resulting from temporal response characteristics of photoelectric conversion by the imaging element.

18. The compound-eye imaging device according to claim 1, wherein at least one of the plurality of facets is made of different material from other facets.

* * * * *